(12) United States Patent
Chu et al.

(10) Patent No.: US 12,543,367 B2
(45) Date of Patent: Feb. 3, 2026

(54) BACKSIDE PROCESSING OF FINS IN FIN BASED TRANSISTOR DEVICES

(71) Applicant: Intel Corporation, Santa Clara, CA (US)

(72) Inventors: Tao Chu, Portland, OR (US); Minwoo Jang, Portland, OR (US); Aurelia Chi Wang, Hillsboro, OR (US); Conor Puls, Portland, OR (US); Brian Greene, Portland, OR (US); Tofizur Rahman, Portland, OR (US); Lin Hu, Portland, OR (US); Jaladhi Mehta, Beaverton, OR (US); Chung-Hsun Lin, Portland, OR (US); Walid Hafez, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 804 days.

(21) Appl. No.: 17/656,490

(22) Filed: Mar. 25, 2022

(65) Prior Publication Data

US 2023/0307449 A1    Sep. 28, 2023

(51) Int. Cl.
    H10D 84/83    (2025.01)
    H10D 30/67    (2025.01)
    H10D 62/10    (2025.01)

(52) U.S. Cl.
    CPC ......... *H10D 84/83* (2025.01); *H10D 30/6735* (2025.01); *H10D 62/118* (2025.01)

(58) Field of Classification Search
    CPC .. H10D 30/6735; H10D 84/83; H10D 62/118; H10D 62/121; H10D 30/43; H10D 30/6757; H10D 84/0167
    See application file for complete search history.

(56) References Cited

U.S. PATENT DOCUMENTS

2020/0066839 A1\*  2/2020  Zhang ............... H10D 30/014
2022/0254776 A1\*  8/2022  Cheng ............... H10D 30/014

\* cited by examiner

*Primary Examiner* — Changhyun Yi
(74) *Attorney, Agent, or Firm* — Arcane Law PLLC

(57) ABSTRACT

An integrated circuit includes a first source region, a first drain region, a first fin having (i) a first upper region laterally between the first source region and the first drain region and (ii) a first lower region below the first upper region, and a first gate structure on at least top and side surfaces of the first upper region. The integrated circuit further includes a second source region, a second drain region, a second fin having (i) a second upper region laterally between the second source region and the second drain region and (ii) a second lower region below the second upper region, and a second gate structure on at least top and side surfaces of the second upper region. In an example, a first vertical height of the first lower region is different from a second vertical height of the second lower region by at least 2 nanometers (nm).

25 Claims, 27 Drawing Sheets

BACKSIDE PROCESSING OF FINS IN FIN BASED TRANSISTOR DEVICES

FIELD OF THE DISCLOSURE

The present disclosure relates to integrated circuits, and more particularly, to fin based transistor devices.

BACKGROUND

A finFET is a transistor built around a thin strip of semiconductor material (generally referred to as the fin). The transistor includes the standard field-effect transistor (FET) nodes, including a gate structure, a source region, and a drain region. The conductive channel of the device resides on the outer portions of the fin adjacent to the gate structure. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. Other types of finFET configurations are also available, such as so-called double-gate finFETs, in which the conductive channel principally resides only along the two sidewalls of the fin (and not along the top of the fin). Another type of fin based transistor is referred to as a gate-all-around transistor that includes nanoribbons or nanowires extending between source and drain regions. In such gate-all-around devices, the gate structure wraps around the nanoribbons or nanowires. The nanoribbons or nanowires are "released" during gate processing, by removing sacrificial layers of a multilayer fin. In any such fin based transistors, a portion of the fin or fin structure may remain below the gate structure and the source and drain regions. This portion of the fin is generally referred to as a sub-fin. There exists a number of non-trivial issues associated with fin based transistors.

Figure 1A:
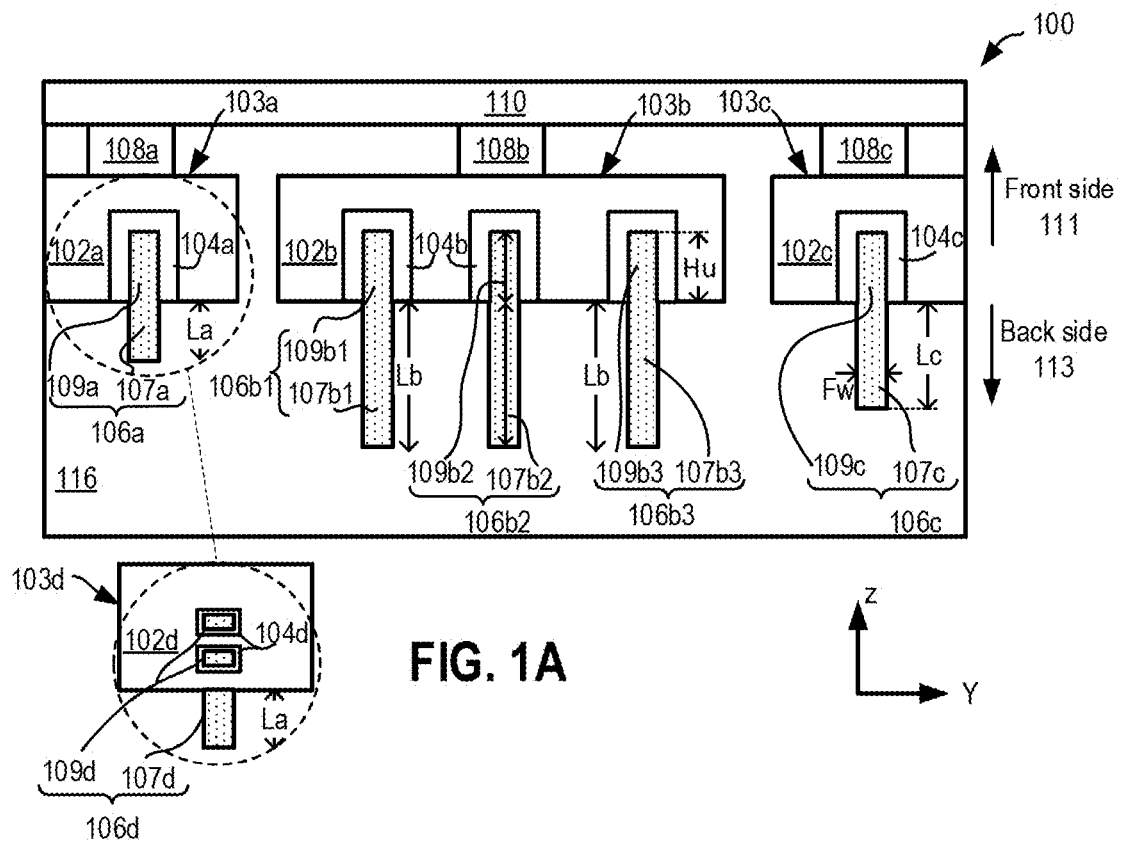
FIGS. 1A and 1B illustrate various views of an integrated circuit (IC) comprising a plurality of fins, with each fin comprising (i) an upper region, with corresponding gate structure on at least top and side surfaces of the upper region, and (ii) a lower region below the upper region, wherein a first vertical height La of a first lower region of a first fin is different from a second vertical height Lc of a second lower region of a second fin by at least 2 nm, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are provided herein for processing fins of non-planar transistors such as FinFETs and gate-all-around transistors, through a backside of the transistors, e.g., to tune one or more characteristics of the transistors. In one embodiment, an integrated circuit includes a first source region, a first drain region, a first fin comprising semiconductor material and having (i) a first upper region laterally between the first source region and the first drain region and (ii) a first lower region below the first upper region, and a first gate structure on at least top and side surfaces of the first upper region. The integrated circuit further includes a second source region, a second drain region, a second fin comprising semiconductor material and having (i) a second upper region laterally between the second source region and the second drain region and (ii) a second lower region below the second upper region, and a second gate structure on at least top and side surfaces of the second upper region. In an example, a first vertical height of the first lower region is different from a second vertical height of the second lower region by at least 2 nanometers (nm). In gate-all-around transistors, the first and second gate structures each wraps around one or more nanoribbons or nanowires released by removing sacrificial material from a fin having a multilayer structure, according to some embodiments.

In another embodiment, an integrated circuit includes a first fin, and a first gate structure on at least top and side surfaces of a first upper region of the first fin. The integrated circuit further includes a second fin adjacent to the first fin, and a second gate structure on at least top and side surfaces of a second upper region of the second fin. In an example, top surfaces of the first and second fins are substantially coplanar. In an example, a vertical height of the first fin is different from a vertical height of the second fin by at least 2 nanometers (nm). In gate-all-around transistors, the first and second gate structures each wraps around one or more nanoribbons or nanowires released by removing sacrificial material from a fin having a multilayer structure, according to some embodiments.

In yet another embodiment, an integrated circuit includes a first fin field-effect transistor (FinFET) having a first fin, and a first gate stack on a top surface and at least a portion of side surfaces of the first fin. The integrated circuit further includes a second FinFET having a second fin, and a second gate stack on a top surface and at least a portion of side surfaces of the second fin. In an example, top surfaces of the first and second fins are coplanar. In an example, at least a section of a bottom surface of the first fin is within a first horizontal plane, at least a section of a bottom surface of the second fin is within a second horizontal plane, and a vertical distance between the first and second horizontal planes is at least 2 nm.

In another embodiment, an integrated circuit includes a source region, a drain region, a fin comprising semiconductor material and having (i) an upper region laterally between the source region and the drain region and (ii) a lower region below the upper region, and a gate structure on at least top and side surfaces of the upper region. In an example, the integrated circuit further includes impurities within the fin. In an example, an average concentration of the impurities within the lower region of the fin is at least 10% higher than an average concentration of the impurities within the upper region of the fin. In a gate-all-around transistor, the gate structure can wrap around one or more nanoribbons or nanowires released in the upper region, by removing sacrificial material from a fin having a multilayer structure, according to some embodiments. In such cases, an average concentration of the impurities within the lower region of the fin is at least 10% higher than an average concentration of the impurities within the upper region of the fin.

In a further embodiment, a method of forming an integrated circuit includes forming a fin comprising (i) an upper region and (ii) a lower region below the upper region, a source region and a drain region on two sides of the upper region of the fin, and a gate stack on at least top and side surfaces of the upper region of the fin. In an example, the lower region of the fin extends through a layer comprising dielectric material. The method further includes removing a bottommost section of the lower region of the fin through a bottom surface of the integrated circuit, without removing a topmost section of the lower region of the fin, and implanting impurities within the fin, through the bottom surface of the integrated circuit. In a gate-all-around transistor, the gate stack can wrap around one or more nanoribbons or nanowires released in the upper region, by removing sacrificial material from a fin having a multilayer structure, according to some embodiments.

In another embodiment, an integrated circuit includes a first source region, a first drain region, a first fin, wherein at least a part of the first fin is laterally between the first source region and the first drain region. The integrated circuit further includes a second source region, a second drain region, a second fin, wherein at least a part of the second fin is laterally between the second source region and the second drain region, the second fin adjacent to the first fin. In an example, a first dielectric material is below and on a bottom surface of the first fin. In an example, a second dielectric material below and on a bottom surface of the second fin. In an example, the second dielectric material is one or both of compositionally and structurally different from the first material.

In another embodiment, an integrated circuit includes a first source region, a first drain region, a first nanoribbon, wherein the first nanoribbon is laterally between the first source region and the first drain region. The integrated circuit further includes a second source region, a second drain region, a second nanoribbon, wherein the second nanoribbon is laterally between the second source region and the second drain region, the second nanoribbon laterally adjacent to the first nanoribbon. In an example, a first dielectric material is below and on a bottom surface of a sub-fin below the first nanoribbon. In an example, a second dielectric material below and on a bottom surface of a sub-fin below the second nanoribbon. In an example, the second dielectric material is one or both of compositionally and structurally different from the first material.

In yet another embodiment, an integrated circuit includes a first ribbon fin field-effect transistor (ribbonFET) transistor having a first nanoribbon, and a first gate stack wrapped around the first nanoribbon. The integrated circuit further includes a second ribbonFET having a second nanoribbon, and a second gate stack wrapped around the second nanoribbon. In an example, top surfaces of the first and second nanoribbons are coplanar. In an example, at least a section of a bottom surface of a sub-fin below the first nanoribbon is within a first horizontal plane, at least a section of a bottom surface of a sub-fin below the second nanoribbon is within a second horizontal plane, and a vertical distance between the first and second horizontal planes is at least 2 nm. Numerous variations, embodiments, and applications will be apparent in light of the present disclosure.

General Overview

As previously noted, a number of non-trivial issues remain with respect to fin based transistors. For example, as device dimensions continue to scale, diminishing dimensions of gate trench and fin-to-fin distance pose serious challenges on tuning device threshold voltage (Vt) and/or other characteristics of the transistors (e.g., leakage, breakdown voltage). For example, impurity implantation in sub-fin regions through frontside of the transistors may be used to tune one or more characteristics of the transistors, but such impurities are also introduced in the gate stack and active regions of the devices, thereby possibly degrading mobility and/or adversely affecting transistor performance. In another example, a number of fins in a transistor device may be controlled to tune the characteristics of the transistor, but the fins within a transistor device is generally quantized to 1 fin, 2 fins, 3 fins, or a higher integer number of fins. A such, fine control of the characteristics of the transistor is difficult to achieve.

Accordingly, techniques are provided herein to tune characteristics of fin based transistors, e.g., FinFETs or gate-all-around transistors, by processing the transistors from a backside of the integrated circuit. For example, a device layer of an integrated circuit comprises a plurality of FinFETs, with a gate stack on at least top and side surfaces of corresponding one or more fins. A side of the integrated circuit above the transistors is also referred to as a "frontside" of the integrated circuit, and a side of the integrated circuit below the transistors is referred to as a "backside" of the integrated circuit. In an example, when forming the integrated circuit, the backside of the integrated circuit is accessible, e.g., to form interconnect features for power delivery and/or signal routing within the backside of the integrated circuit. In one embodiment, the transistors within the device layer are also accessed and processed from the backside, to tune one or more characteristics of the transistors by, for example, backside sub-fin trimming and/or doping.

In a FinFET, a fin has an active region (also referred to herein as an "upper region" of the fin) that is laterally between a corresponding source region and a drain region, with a gate stack on top and sides of the active region. A sub-fin region (also referred to herein as a "lower region" of the fin) is below the upper region, where the sub-fin region extends within dielectric material of shallow trench isolation (STI) layers. The gate stack is generally not on side surfaces of the lower region of a fin. Similarly, in a gate-all-around transistor (e.g., ribbonFET), a one or more nanoribbons (or nanowires, or nanosheets, as the case may be) released in the upper portion of a multilayer fin provide an active region (also referred to herein as an "upper region" of the fin) that is laterally between a corresponding source region and a drain region, with a gate stack wrapping around the active region. A sub-fin region (also referred to herein as a "lower region" of the multilayer fin) is below the upper region, where the sub-fin region extends within dielectric material of STI layers. The gate stack is generally not on side surfaces of the lower region of a fin. Note that the sub-fin region may contain a multilayer configuration like the upper portion, or single layer upon which a multi-layer upper portion sits. In some cases, for instance, the sub-fin region is the same material as the nanoribbon material, while in other cases the sub-fin region is the sacrificial material, while in still other the sub-fin region includes alternating layers of the nanoribbon material and the sacrificial material. In some such embodiments, the nanoribbon material is silicon and the sacrificial material is silicon germanium (SiGe), or vice-versa.

In one embodiment, a lower portion of the lower region of a fin is removed, without impacting an upper portion of the lower region of the fin and also without impacting the upper region of the fin. The removal of the lower portion of the lower region of a fin is achieved through the backside of the integrated circuit, by backside etching. Masking and/or selective etching can be used to trim the lower fin regions, as will be explained in turn. Thus, two adjacent fins may have two different heights of the lower regions of the fins, with top surfaces of the two fins (or the nanoribbons, nanosheets, or nanowires, as the case may be) being substantially coplanar, although the top surfaces need not be coplanar (e.g., one fin top surface may be lower than another top fin surface). In an example, vertical heights of the lower regions of the fins can be tuned, for instance, to control the switching speed, leakage current, and/or threshold voltage Vt of the corresponding transistors. For example, a NMOS transistor having a relatively large vertical height of the lower region of the corresponding fin can be relatively fast, whereas a PMOS transistor having a relatively large vertical height of the lower region of the corresponding fin can be relatively slow. In another example, a NMOS transistor having a relatively small vertical height of the lower region of the corresponding fin can be relatively slow, whereas a PMOS transistor having a relatively small vertical height of the lower region of the corresponding fin can be relatively fast. Thus, in an example, the threshold voltage Vt and/or the switching speed of the transistor can be controlled, by controlling the vertical height of the lower region of the fin.

In another embodiment, the lower region of a fin, as well as a lower portion of the upper or active region of the fin, is removed through the backside of the integrated circuit. Assume, for example, a trigate transistor device includes a gate structure over each of a first fin that has a portion of the upper region removed, and a second fin in which no portion of the upper region of the fin is removed. In an example, a top surface of the upper region of the first fin is substantially coplanar a top surface of the upper region of the second fin, and a vertical height of the upper region of the first fin is shorter than a vertical height of the upper region of the second fin. As a vertical height of the active region of the first fin is now less than the vertical height of the active region of the second fin, the first fin can be considered as a partial fin, such as a 0.5 fin, or a 0.7 fin, or other fractional fin (less than 1 fin). In this manner, the number of fins in a transistor can be tuned on a finer and continuous basis, instead of having only an integer number of fins. Hence, now a transistor can have 1 fin, or 1.2 fins or 1.5 fins, or 1.7 fins, or 2 fins, or 2.5 fins, merely as examples, based on a target performance criterion of the transistor.

For example, it may be advantageous to have a relatively low drive current PMOS device within a Static random-access memory (SRAM), and so, one or more of the PMOS devices within the SRAM can have 1 fin, or less than 1 fin (such as 0.7 fin), while a relatively higher drive current NMOS device may have 1.5 fins or 2.5 fins in a device. Thus, a strength (e.g., drive current) of a transistor device can be precisely controlled, by tuning the height of active (or upper) regions of individual fins of multi-fin transistors or even a single fin transistor.

In one embodiment, impurities are implanted in lower regions (e.g., sub-fin regions) of one or more fins, e.g., through a backside of the integrated circuit. For example, if impurities are implanted through a frontside of the integrated circuit, then the impurities are introduced through, and may be introduced within, the gate stack and/or the upper regions of the fins, which may degrade mobility and/or adversely affect transistor performance. In contrast, in some embodiments, one or more impurities are introduced in the lower regions of one or more fins through the backside of the integrated circuit. Accordingly, the impurities are introduced primarily in the lower regions, and not within the upper regions of the fins (or nanoribbons or nanowires, as the case may be) or the gate stack, thus avoiding or reducing the adverse effects of introducing of the one or more impurities within the gate stack and/or the upper regions of the fins. By introducing the one or more impurities within the lower regions of one or more fins, the threshold voltage Vt of the corresponding transistor may be tuned. In another example, the one or more impurities provide a barrier or electrical isolation within the lower regions of the fins, resulting in lower leakage current through the lower regions. The one or more impurities may also be introduced to tune one or more other characteristics of the fins or the associated transistor devices.

In FinFETs and gate-all-around transistors, a dielectric material may be below the lower region (e.g., the sub-fin region) of a fin, e.g., on a bottom surface of the lower region of the fin. An interface between a semiconductor material (e.g., silicon or another appropriate semiconductor material) of the bottom surface of the fin and the dielectric material underneath can affect performance of the fin, and hence, performance of the transistor. In one embodiment, the dielectric material below a fin is controlled, to tune one or more characteristics (e.g., threshold voltage Vt, speed, leakage current) of the corresponding transistor.

For example, a first dielectric material is below a first fin, and a second dielectric material is below a second fin, where the first dielectric material and the second dielectric material are compositionally and/or structurally different. For instance, the first and second dielectric materials each may comprise an oxide, a nitride, a carbide, an oxycarbide, an oxynitride, an oxycarbonitride, or another appropriate dielectric material. Merely as an example, the first dielectric material may comprise aluminum oxide and the second dielectric material may comprise silicon dioxide, although other combinations of compositionally different dielectric materials may be used. In one embodiment, instead of or in addition to being compositionally different, the two dielectric materials are structurally different. For example, the first dielectric material is deposited using a first type of deposition process, and the second dielectric material is deposited using a second type of deposition process. Merely as an example, one of the first and second dielectric material is formed using one of chemical vapor deposition (CVD), atomic layer deposition (ALD), physical vapor deposition (PVD), and the other of first and second dielectric materials are formed using another of CVD, ALD, PVD. Due to the different deposition process used, a structural quality (e.g., crystalline structure, crystalline orientation, amorphous versus crystalline) of the first dielectric material may be different from that of the second dielectric material.

Due to the compositional and/or structural difference between the first and second dielectric materials, an interface between the first fin and the first dielectric material would have different properties compared to another interface between the second fin and the second dielectric material. In an example, this difference in the fin-dielectric material interface can be used to tune one or more characteristics of the fin and a transistor device comprising the fin. For example, the fin-dielectric material interface is controlled, e.g., to tune a threshold voltage, a leakage current, and/or a speed of the transistor device. As an example, the threshold voltage Vt of a PMOS or NMOS transistor can be tuned up to 100 mV, by modulating the dielectric material below the corresponding fin. For instance, a PMOS transistor with an aluminum oxide layer between a bottom surface of a corresponding fin and a silicon dioxide layer is relatively faster than a PMOS transistor with no aluminum oxide layer between the bottom surface of the corresponding fin and the silicon dioxide layer (the silicon dioxide layer directly abuts the bottom surface of the fin). Similarly, an NMOS transistor with an aluminum oxide layer between a bottom surface of a corresponding fin and a silicon dioxide layer is relatively slower than an NMOS transistor with no aluminum oxide layer between the bottom surface of the corresponding fin and the silicon dioxide layer (the silicon dioxide layer directly abuts the bottom surface of the fin). A PMOS transistor or an NMOS transistor with silicon dioxide below and on a bottom surface of the corresponding fin(s) has a relatively medium speed.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

It should be readily understood that the meaning of "above" and "over" in the present disclosure should be interpreted in the broadest manner such that "above" and "over" not only mean "directly on" something but also include the meaning of over something with an intermediate feature or a layer therebetween. As used herein, the term "backside" generally refers to the area beneath one or more semiconductor devices (below the device layer) either within the device substrate or in the region of the device substrate (in the case where the bulk of the device substrate has been removed). Note that the backside may become a frontside, and vice-versa, if a given structure is flipped. To this end, and as will be appreciated, the use of terms like "above" "below" "beneath" "upper" "lower" "top" and "bottom" are used to facilitate discussion and are not intended to implicate a rigid structure or fixed orientation; rather such terms merely indicate spatial relationships when the structure is in a given orientation.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect two adjacent fins having different vertical heights of lower regions (e.g., different sub-fin heights). In some embodiments, such tools may also be used to detect two adjacent fins having substantially coplanar top surfaces and different vertical heights of upper regions (e.g., different active region heights, as a result of backside fin trimming process as variously described herein). In some embodiments, such tools may also be used to detect impurities within lower regions of the fins having a concentration that is substantially higher than a concentration of impurities within upper regions of the fins and/or with the gate stack. In some embodiments, such tools may further be used to detect a first dielectric material below and on a bottom surface of a first fin, and a second dielectric material below and on a bottom surface of a second fin, wherein the first and second dielectric materials are compositionally and/or structurally different. For instance, different oxide combinations may be detectable at the sub-fin interface. Numerous configurations and variations will be apparent in light of this disclosure.

Architecture and Methodology

Figure 1B:
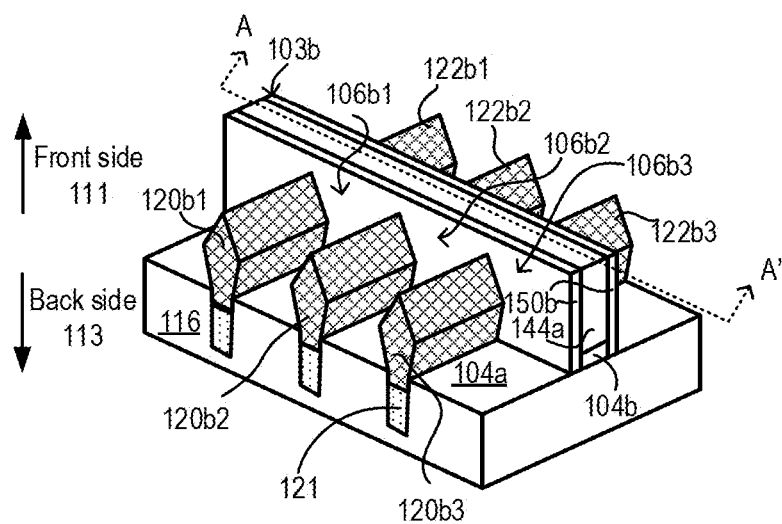

FIG. 1A illustrates a cross-sectional view of an integrated circuit (IC) 100 comprising a plurality of fins 106, with each fin 106 comprising (i) an upper region 109, with corresponding gate structure 103 on at least top and side surfaces of the upper region 109, and (ii) a lower region 107 below the upper region 109, wherein a first vertical height La of a first lower region 107a of a first fin 106a is different from a second vertical height Lc of a second lower region 107c of a second fin 106c by at least 2 nm, in accordance with an embodiment of the present disclosure. As can be seen in the alternative embodiment within the dashed circle, the upper region 109 of a fin 106 may comprise nanoribbons (or nanowires, or nanosheets, as the case may be), with corresponding gate structure 103 wrapping around the nanoribbons of the upper region 109. In such cases, the lower region 107 of fin 106 may include a single semiconductor material or a multilayer configuration (e.g., alternating layers of silicon and SiGe). Such nanoribbons, wires or sheets can be, for example, released from a multilayer fin during gate processing. FIG. 1B illustrates a perspective view of a section of the IC 100 of FIG. 1A, in accordance with an embodiment of the present disclosure. FIGS. 1A and 1B further generally illustrate a frontside 111 and a backside 113 of the IC 100.

Referring to FIG. 1A, fins 106a, 106b1, 106b2, 106b3, and 106c are illustrated, although the IC 100 can include any other appropriate number of fins. Each fin 106 generally has an upper region 109, and a lower region 107 below the upper region 109. An upper region 109 of a fin 106 has a corresponding gate structure 103 on at least top and side surfaces thereon. Thus, put differently, a section of a fin 106, having a corresponding gate structure 103 on at least top and side surfaces thereon, is referred to as the upper region of the fin. For example, in FIG. 1A, a top line with arrows within the fin 106b2 indicates an approximate boundary of the upper region 109b2 of the fin 106b2, and a bottom line with arrows within the fin 106b2 indicates an approximate boundary of the lower region 107b2 of the fin 106b2. As illustrated, the upper region 109 of a fin 106 is laterally between two sections of a corresponding gate structure 103. In the alternative embodiment within the dashed circle, the upper region 109 includes two nanoribbons around which the gate structure 103 is wrapped. Other embodiments may include fewer (one) or more nanoribbons (e.g., three or four).

The upper region 109 of a fin is also referred to herein as an "active region" or "channel region" of the fin, as this region 109 contributes to conduction of current between a corresponding source region and a corresponding drain region. That is, current is selectively transmitted between a source and drain region through the upper region 109 of the fin. Recall from above that the upper region 109 of the fin may include one more nanoribbons (or nanowires or nanosheets) through which current is conducted.

As can be further seen in FIG. 1B, source and drain regions 120, 122 are on either side of and adjacent to the upper region 109. As illustrated, the gate structure 103 resides along three walls of the finned channel regions comprising the upper regions 109, to form the finned (e.g., FinFET) configuration in some embodiments, while in other embodiments the gate structure 103 wraps around all sides of a ribbonized channel regions of the upper regions 109, to form a gate-all-around (e.g., ribbonFET) configuration. Note that nanoribbons are used in some example embodiments, but nanowires or other similar semiconductor bodies having any number of height-to-width aspect ratios can be used in a gate-all-around configurations.

Each fin 106 has a lower region 107 below the corresponding upper region 109. The lower region 107 of a fin 106 is also referred to herein as a "sub-fin" region of the fin. As illustrated, the lower region 107 of a fin extends within an interlayer dielectric (ILD) 116. In gate-all-around configurations, the lower region 107 may be a single semiconductor material or a multilayer configuration, such as alternating layers of first and second semiconductor materials that can be selectively etched with respect to each other, which facilitates release of nanoribbons during gate processing. In some cases, only the upper region 109 of a given fin 106 has a multilayer configuration (e.g., alternating layers of silicon and SiGe) and the lower region 107 is a single layer configuration (e.g., silicon), while in other cases the multilayer configuration extends through both the upper region 109 and the lower region 107. In such cases, the backside fin trim etch can be modulated to remove both layers, as will be explained in turn.

In an example, the lower region 107 of a fin may impact characteristics and properties of the corresponding fin 106. For example, a height of the lower region 107 of a fin 106 may be controlled or adjusted, to tune a corresponding threshold voltage (Vt) of a transistor device comprising the fin 106, or a switching speed of the transistor device, or a leakage current of the transistor device, or a drive current of the transistor device, and/or another characteristic of the transistor device.

Note that some fins 106 can be grouped into one transistor device. For example, a first transistor includes the fin 106a, where a gate structure 103a is on at least top and side surfaces of an upper region 109a of the fin 106a. A second transistor device includes the fins 106b1, 106b2, and 106b3, where a gate structure 103b is on at least top and side surfaces of upper regions 109b1, 109b2, 109b3 of the fins 106b1, 106b2, and 106b3, respectively. Similarly, a third transistor device includes the fin 106c, where a gate structure 103c is on at least top and side surfaces of upper region 109c of the fin 106c of the third group of fins. Again, note that in some example embodiments, the upper regions 109 of fins 106 are configured for gate-all-around configuration.

In an example, fins of a specific group have lower regions with substantially the same vertical height of the lower regions, and the lower regions of other groups or devices may have lower regions with different vertical heights. For example, the lower regions 107b1, 107b2, and 107b3 of the fins 106b1, 106b2, 106b3, respectively, each have substantially the same vertical height Lb, such that they are, for example, within 2 nm, or 1.5 nm, or 1 nm, or 5 angstroms of each other. However, in another example, the vertical heights of the lower regions 107b1, 107b2, and 107b3 may be different from each other, e.g., by more than 2 nm, or more than 4 nm. As illustrated, a vertical height of the lower region 107a of the fin 106a is La, and a vertical height of the lower region 107c of the fin 106a is Lc.

In an example and as illustrated in FIG. 1A, the vertical height Lb is greater than the vertical height Lc by, for example, more than 2 nm, or by at least 4 nm, or by at least 6 nm, or by at least 8 nm, or by at least 10 nm. In an example, a difference between the vertical heights Lb and Lc is in the range of 2 to 30 nm (or in the subrange of 2-4, 2-8, 2-15, 2-25, 4-8, 4-15, 4-30, 10-20, 10-30, or 20-30 nm) for example, or any other value or range as will be apparent in light of this disclosure. Thus, for example, assume that a bottom surface of the lower region 107b1 of the fin 106b1 is within a first horizontal plane, a bottom surface of the lower region 107a of the fin 106a is within a second horizontal plane, and a vertical distance between the first and second horizontal planes is in the range of 2 to 30 nm, or any subrange within that range.

In an example and as illustrated in FIG. 1A, the vertical height Lc is greater than the vertical height La by more than 2 nm, or by at least 4 nm, or by at least 6 nm, or by at least 8 nm, or by at least 10 nm. In an example, a difference between the vertical heights Lc and La is in the range of 2 to 30 nm (or in the subrange of 2-4, 2-8, 2-15, 2-25, 4-8, 4-15, 4-30, 10-20, 10-30, or 20-30 nm) for example, or any other value or range as will be apparent in light of this disclosure. Thus, for example, assume that a bottom surface of the lower region 107c of the fin 106c is within a first horizontal plane, a bottom surface of the lower region 107a of the fin 106a is within a second horizontal plane, and a vertical distance between the first and second horizontal planes is in the range of 2 to 30 nm, or any subrange within that range.

In an example, the upper regions 109 of the various fins 106 have substantially same height. For example, the heights of the upper regions 109a, 109b1, 109b2, 109b3, and 109c are substantially equal, e.g., within 5 angstroms, or 1 nm, or 2 nm of each other.

In one embodiment, a top surface of the fins 106 (i.e., a top surface of the upper regions 109a, 109b1, 109b2, 109b3, and 109c of the fins 106) are substantially coplanar. For example, assume that a first top surface of a first fin is at a first horizontal plane, and a second top surface of a second fin is at a second horizontal plane. In an example, the first and second horizontal planes overlap, or is separated by a vertical distance of at most 5 angstroms, or 1 nm, or 2 nm.

In one embodiment, a junction between an upper region and a lower region of different fins are substantially coplanar, i.e., within 2 nm, or 1 nm, or 5 angstroms of each other. For example, assume that a first junction between an upper region and a lower region of a first fin is at a first horizontal plane, and a second a junction between an upper region and a lower region of a second fin is at a second horizontal plane. In an example, the first and second horizontal planes overlap, or is separated by a vertical distance of at most 5 angstroms, or 1 nm, or 2 nm.

In one embodiment, a threshold voltage Vt of a transistor comprising a fin may be tuned by adjusting the vertical height of the lower region 107 of the fin, by way of a backside fin trim process as explained herein. For example, the threshold voltage Vt of a N-type Metal Oxide Semiconductor (NMOS) or P-type Metal Oxide Semiconductor (PMOS) transistor can be tuned up to 100 milli volts (mV), by scaling the vertical height of the lower region 107 of the fin in the range of 5 nm to 25 nm.

In an example, different transistors having different speed requirements, different leakage current requirements, and/or different threshold voltage Vt requirements have different vertical heights of the lower regions of the corresponding fins. Thus, vertical heights of the lower regions of the fins can be tuned, to control the switching speed, leakage current, and/or threshold voltage Vt of the corresponding transistors. For example, a NMOS transistor having a relatively large vertical height Lb can be relatively fast, whereas a PMOS transistor having a relatively large vertical height Lb can be relatively slow. In another example, a NMOS transistor having a relatively small vertical height La can be relatively slow, whereas a PMOS transistor having a relatively small vertical height La can be relatively fast. Thus, in an example, the threshold voltage Vt and/or the switching speed of the transistor can be controlled, by controlling the vertical height of the lower region of the fin.

In some embodiments, the fin widths Fw (lateral dimension in the horizontal or Y-axis direction, see example fin width of the fin 106c in FIG. 1A) may be in the range of 2-400 nm (or in any subrange thereof, such as between 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example. In an example, average widths of the fins are substantially equal (e.g., within 2 nm, or 1 nm, or 5 angstroms of each other).

In some embodiments, a vertical height Hu of the upper regions 109 of individual fins (dimension in the vertical or Z-axis direction, see the fin 106b3) may be in the range of 2-600 nm (or in any subrange thereof, such as 2-10, 2-20, 2-50, 2-100, 2-200, 2-400, 4-20, 4-50, 4-100, 4-200, 4-400, 4-600, 10-100, 10-200, 10-400, 10-600, 50-300, 50-600, or 200-600 nm), for example. In some embodiments, the height-to-width ratio of the fins may be greater than 1, such as greater than 1.5, 2, 2.5, 3, 3.5, 4, 4.5, 5, 6, 7, 8, 9, 10, or greater, such as fins having a height-to-width ratio in the range of 5:1 to 25:1. In some cases, the upper region may have a height (e.g., Hu) that is taller than the height (e.g., Lb) of the corresponding lower region. In other cases, the upper region may have a height (e.g., Hu) that is shorter than the height (e.g., Lb) of the corresponding lower region. In still other cases, the upper region may have a height (e.g., Hu) that is substantially the same (e.g., within 2 nm) as the height (e.g., Lb) of the corresponding lower region. In some specific example cases, the overall height of a given fin (e.g., Hu+Lb) is in the range of 20 nm to 250 nm, with the height of the upper region (e.g., Hu) being in the range of 10 nm to 125 nm and the height of the bottom region (e.g., Lb) being in the range of 10 nm to 125 nm. In a more general sense, the various fin portion heights can vary from one embodiment to the next, depending on the given application.

In an example, the fins 106 are formed on a substrate and from the substrate, and the fins and the substrate have similar composition. In other embodiments, fins 106 may be formed, grown, or produced by other suitable processes. For example, in some cases, fins 106 may be grown (e.g., epitaxially) from trenches formed in the substrate. In some cases, the fins are of a single semiconductor material. In some other cases, the fins are formed of alternating semiconductor material layers that can be selectively etched with respect to one another, so as to facilitate release of nanoribbons, as previously explained above. In a more general sense, the fins can be formed using any suitable techniques. Note that any remaining portion of the substrate below the fins can be removed (e.g., by way of chemical mechanical planarization, or CMP), to facilitate backside processing of the IC 100 as will be discussed in turn.

Further note that individual fins 106 may be used for an NMOS, a PMOS, or a CMOS device (e.g., fins of one device may be an n-type MOS and fins of an adjacent device may be a p-type MOS). The fins 106 may comprise any appropriate semiconductor materials used for fins (or nanoribbons, or nanowires or nanosheets, as the case may be), such as silicon, silicon germanium, III-V material, and/or other appropriate material used for fins. In an example, sections of the fins may be doped. Any appropriate p-type dopant or an n-type dopant may be used for doping a specific fin, e.g., based on a target application of the fin.

As illustrated in FIG. 1A, the lower regions 107 of the various fins extend within the ILD 116. In an example, the ILD 116 acts as shallow trench isolation (STI), to electrically isolate the lower regions of the various adjacent fins. In some embodiments, ILD 116 (which may also be referred to as an STI layer) may include any suitable electrically insulating material, such as an oxide (e.g., silicon dioxide) or nitride (e.g., silicon nitride) or carbide (e.g., silicon carbide).

FIG. 1B illustrates a perspective view of a section of the IC 100 of FIG. 1A, where the section comprises some of the fins, such as fins 106b1, 106b2, 106b3, of the illustrated fins of the IC 100 of FIG. 1A. The cross-sectional view of FIG. 1A is along line A-A' of FIG. 1B.

Referring to FIGS. 1A and 1B, in an example, the gate structure 103b comprises sidewall spacers 150b, also referred to as gate spacers 150b, or simply as spacers 150b. In an example, the spacers 150b are on either side of the gate stack, and such spacers can be used to help determine the channel length and/or to help with replacement gate processes, for example. Spacers 150b may include any suitable dielectric, such as an oxide or a nitride (e.g., silicon oxide, silicon nitride, or silicon oxynitride). Similar spacers can also be formed for the gate structures 103a and 103c adjacent to the fins 106a and 106c, respectively.

The gate structures 103 comprises a gate stack including gate dielectric 104 and gate electrode 102. For example, the gate structure 103b (illustrated in both FIGS. 1A and 1B) comprises gate dielectric 104b and gate electrode 102b. As illustrated, the gate dielectric 104b separates the gate electrode 102b from the upper regions 109b1, 109b2, and 109b3 of the fins 106b1, 106b2, 106b3, respectively. The gate dielectric 104b may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric 104b may include one or more silicates (e.g., titanium silicate, tungsten silicate, niobium silicate, and silicates of other transition metals). In some embodiments, an annealing process may be carried out on gate dielectric 104b to improve its quality when high-k dielectric material is used. The gate electrode 102b may include a wide range of materials, such as various suitable metals or metal alloys, such as aluminum, tungsten, titanium, tantalum, ruthenium, or copper, for example. In some embodiments, gate dielectric 104b and/or gate electrode 102b may include a multilayer structure of two or more material layers, for example. For instance, in one embodiment, the gate dielectric 104b includes a first layer of silicon dioxide on the channel region, and a second layer of hafnium oxide on the first layer. The gate electrode 102b may include, for instance, a metal plug along with one or more workfunction layers, resistance-reducing layers, and/or barrier layers. In some embodiments, gate dielectric 104b and/or gate electrode 102b may include grading (e.g., increasing and/or decreasing) the content/concentration of one or more materials in at least a portion of the feature(s). Note that although the gate dielectric 104b is only shown between the gate electrode 102b and the fins 106b in the example embodiment of FIGS. 1A and 1B, in other embodiments, the gate dielectric 104b may also be between gate electrode and one or both of spacers 150b, for example. A gate contact 108b conductively couples the gate electrode 102b to a metallization level 110 on the frontside 111 of the IC 100. Numerous different gate structure configurations will be apparent in light of this disclosure. Furthermore, the discussion about the gate structure 103b herein also applies to other similar gate structures, as such the gate structures 103a and 103c. In the alternative embodiment shown in the dashed circle of FIG. 1A, a gate-all-around configuration is shown, in which gate dielectric 104d wraps around nanoribbons of the upper region 109d of fin 106d, and gate electrode 104d wraps around the nanoribbons as well and otherwise fills the gate trench. As can be further seen, lower region 107d extends below upper region 109d, for a distance La. The discussion with respect to gate structures 103a-c applies to gate structure 103d as well.

In one embodiment, the gate structures 103a, 103b, 103c (or 103d, for gate-all-around configurations) are formed at a same horizontal level. For example, bottommost surfaces of the gate structures 103a, 103b, and/or 103c are substantially co-planar to each other (e.g., separated by a vertical distance of at most 2 nm, or 1 nm, or 5 angstroms). Similarly, topmost surfaces of the gate structures 103a, 103b, and/or 103c are substantially co-planar to each other (e.g., separated by a vertical distance of at most 2 nm, or 1 nm, or 5 angstroms). Note that, in some such embodiments, the gate structures 103a, 103b, and 103c are gate-all-around structures such as shown with gate structure 103d.

Referring now to FIG. 1B, illustrated are source region 120b1 and drain region 122b1 on two sides of the fin 106b1, such that the upper region 109b1 of the fin 106b1 is laterally between the source region 120b1 and drain region 122b1. Note that the fins 106b1, 106b2, 106b3 below the gate structure 103b are not visible in the perspective view of FIG. 1B—however, an approximate location of the upper regions of these fins are labelled in FIG. 1B. Similarly, source region 120b2 and drain region 122b2 are on two sides of the fin 106b2, and source region 120b3 and drain region 122b3 are on two sides of the fin 106b3. Similar source and drain regions may be on two sides of each of the fins 106a and 106c as well.

According to some embodiments, the source and drain regions are epitaxial regions that are provided using an etch-and-replace process. In other embodiments one or more of the source and drain regions could be, for example, implantation-doped native portions of the fins 106 or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. Any semiconductor materials suitable for source and drain regions can be used (e.g., group IV and group III-V semiconductor materials). Also illustrated in FIG. 1B are regions 121 under the source and drain regions, where the regions 121 may be part of the lower regions 107 of the original fins, over which the source and drain regions are formed. Source and drain contacts can be respectively coupled to corresponding source and drain regions, to couple the source and drain regions to outside circuits. The conductive source and drain contacts may be any suitably conductive material, such as a metal or an alloy thereof. Merely as an example, the conductive source and drain contacts includes one or more of tungsten (W), molybdenum (Mo), ruthenium (Ru), copper (Cu), aluminum (Al), titanium (Ti), tantalum (Ta), titanium nitride (TiN), or tantalum nitride (TaN), for example. In some embodiments, the conductive source and drain contacts include one or more of the same metal materials as gate electrode, or a different conductive material.

Figure 2:
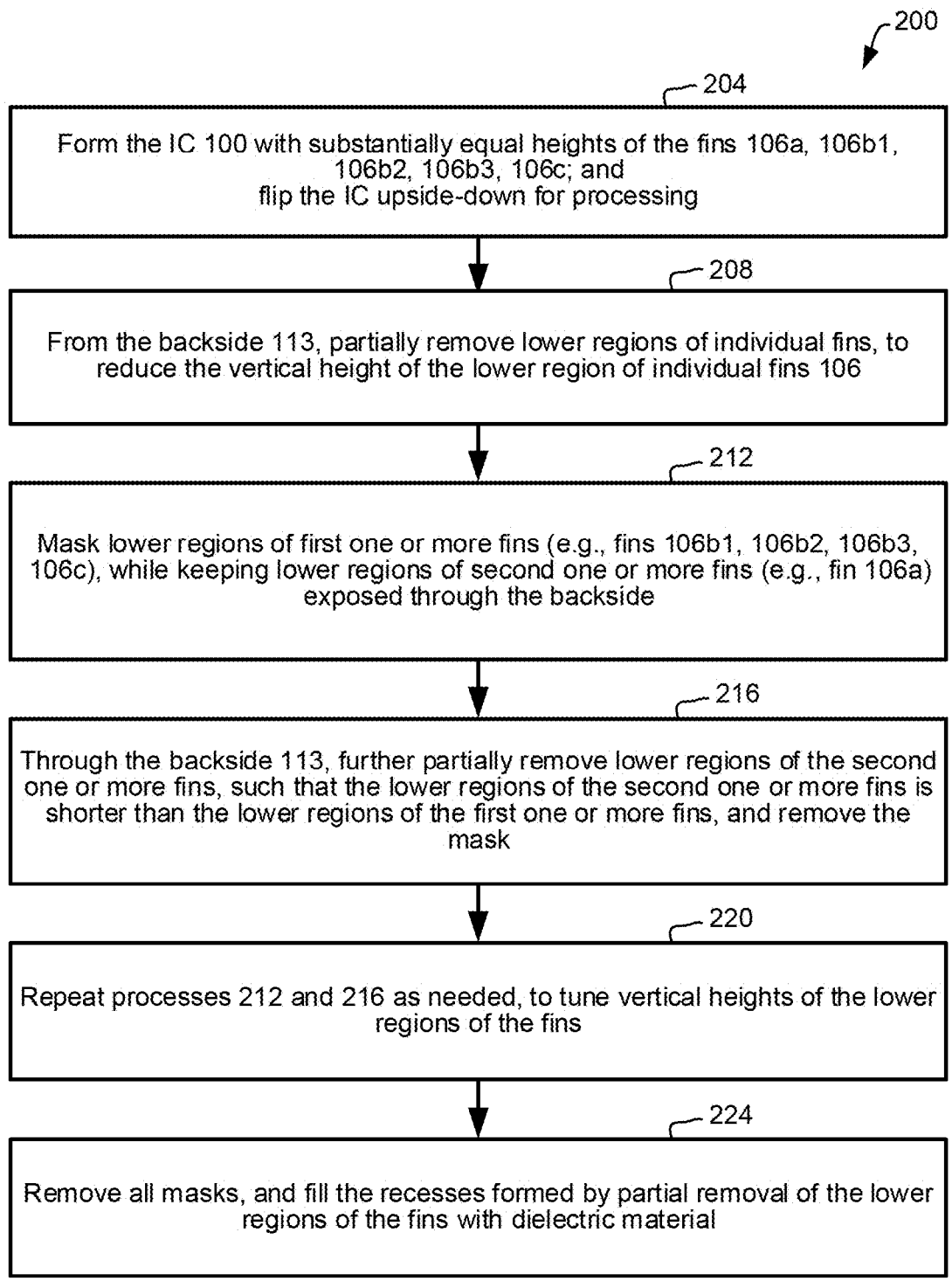
FIG. 2 illustrates a flowchart depicting a method of forming an IC (such as the IC of FIGS. 1A-1B) comprising a plurality of fins, with each fin comprising (i) an upper region, with corresponding gate structure on at least top and side surfaces of the upper region, and (ii) a lower region below the upper region, wherein a first vertical height La of a first lower region of a first fin is different from a second vertical height Lc of a second lower region of a second fin by at least 2 nm, in accordance with an embodiment of the present disclosure.

FIG. 2 illustrates a flowchart depicting a method 200 of forming an IC (such as the IC 100 of FIGS. 1A-1B) comprising a plurality of fins 106, with each fin 106 comprising (i) an upper region 109, with corresponding gate structure 103 on at least top and side surfaces of the upper region 109, and (ii) a lower region 107 below the upper region 109, wherein a first vertical height La of a first lower region 107a of a first fin 106a is different from a second vertical height Lc of a second lower region 107c of a second fin 106c by at least 2 nm, in accordance with an embodiment of the present disclosure. FIGS. 3A, 3B, 3C, 3D, 3E, 3F, and 3G illustrate various cross-sectional views of an IC (such as the IC 100 of FIGS. 1A-1B) in various stages of processing, in accordance with an embodiment of the present disclosure. FIGS. 2 and 3A-3G will be discussed in unison. The cross-sectional views of FIGS. 3A-3G are similar to that of FIG. 1A, e.g., along line A-A' of FIG. 1B.

Figure 3A:
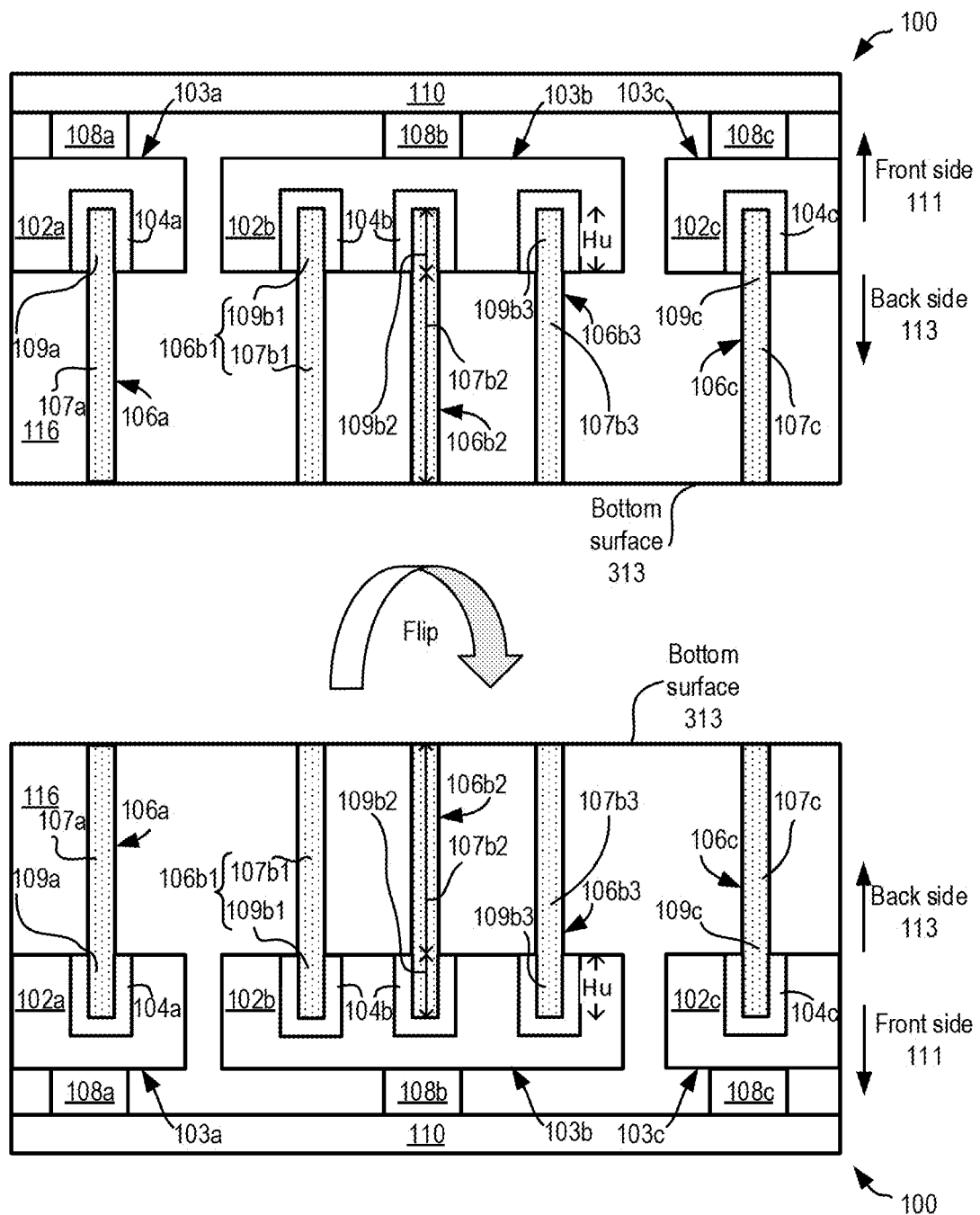
FIGS. 3A, 3B, 3C, 3D, 3E, 3F, and 3G illustrate various cross-sectional views of an IC (such as the IC of FIGS. 1A-1B) in various stages of processing, in accordance with an embodiment of the present disclosure.

Referring to FIG. 2, the method 200 includes, at 204, forming the IC 100 with substantially equal heights of the fins 106a, 106b1, 106b2, 106b3, 106c, as illustrated in top section of FIG. 3A. As illustrated, a bottom surface of the lower regions 107 of individual fins 106 are exposed through a bottom surface 313 of the backside 113. The formation of the IC at process 204 can be performed using any appropriate process to form FinFETs or gate-all-around transistors having substantially equal fin height, according to an embodiment; other embodiments need not have such uniform fin height, as a backside fin trim process can be used with any number of fin configurations, as will be appreciated in light of this disclosure.

Subsequently, also at 204, the IC 100 is flipped for further processing. For example, the layer 110, or one or more layers above 110, can act as a carrier wafer, when the IC 100 is flipped to facilitate processing from the backside 113. Alternatively, IC 100 can be bonded to a carrier wafer to facilitate such processing. In any case, an excess backside material can be removed, for example, by CMP, so as to expose the bottoms of the fins 106, if not already exposed.

As can be further seen in FIG. 3A, the region 107 is still labelled as the lower region and the region 109 is still labelled as the upper region, although the region 107 is now above the region 109, as will be appreciated in view of this disclosure. Similarly, top section of FIG. 3A labels a bottom surface 313 of the backside 113, which remains unchanged and is still referred to as bottom surface 313 in the flipped IC 100 illustrated in the bottom section of FIG. 3A.

Figure 3B:
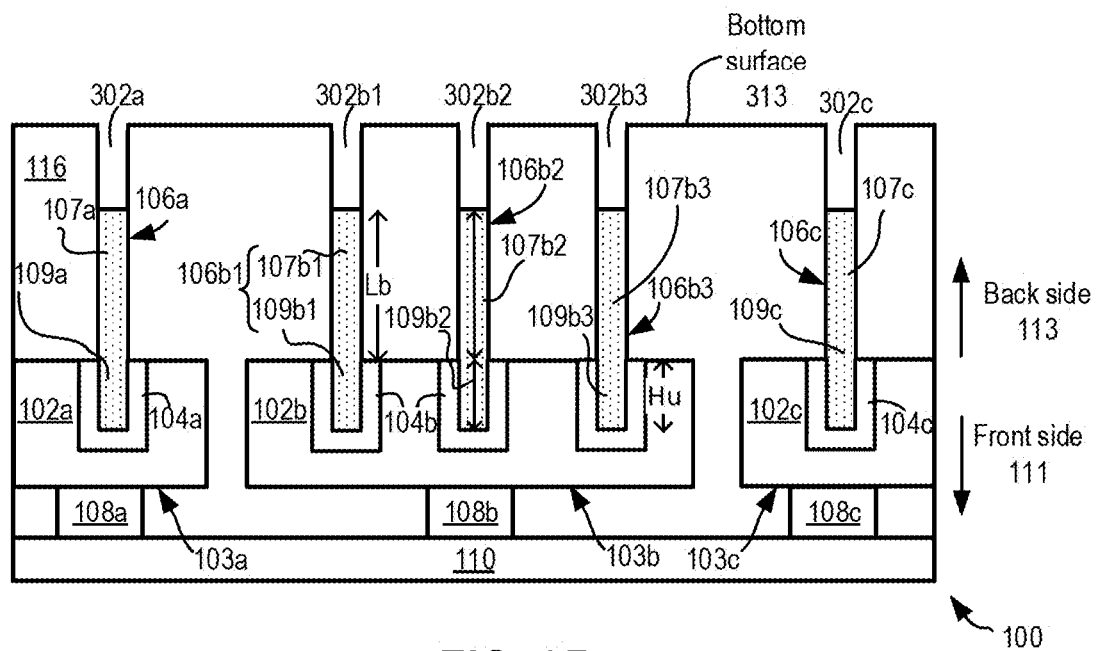

Referring again to FIG. 2, the method 200 then proceeds from 204 to 208, where from the backside 113 (e.g., through the bottom surface 313 of the backside 113), lower regions of individual fins are partially removed, to reduce the vertical height of the lower regions of individual fins 106, as illustrated in FIG. 3B. As illustrated in FIG. 3B, removal of the lower regions of the fins 106a, 106b1, 106b2, 106b3, 106c respectively results in formation of recesses 302a, 302b1, 302b2, 302b3, 302c. In an example, the vertical heights of the lower regions 107 of each of the fins 106a, 106b1, 106b2, 106b3, and 106c is now substantially equal to Lb, which is the final vertical height of the lower regions of the fins 106b1, 106b2, and 106b3. In an embodiment, a selective etch process is employed, such as an isotropic etch process, that is selective ILD 116 and mostly only removes the bottom portions of the lower regions of the fins 106.

Figure 3C:
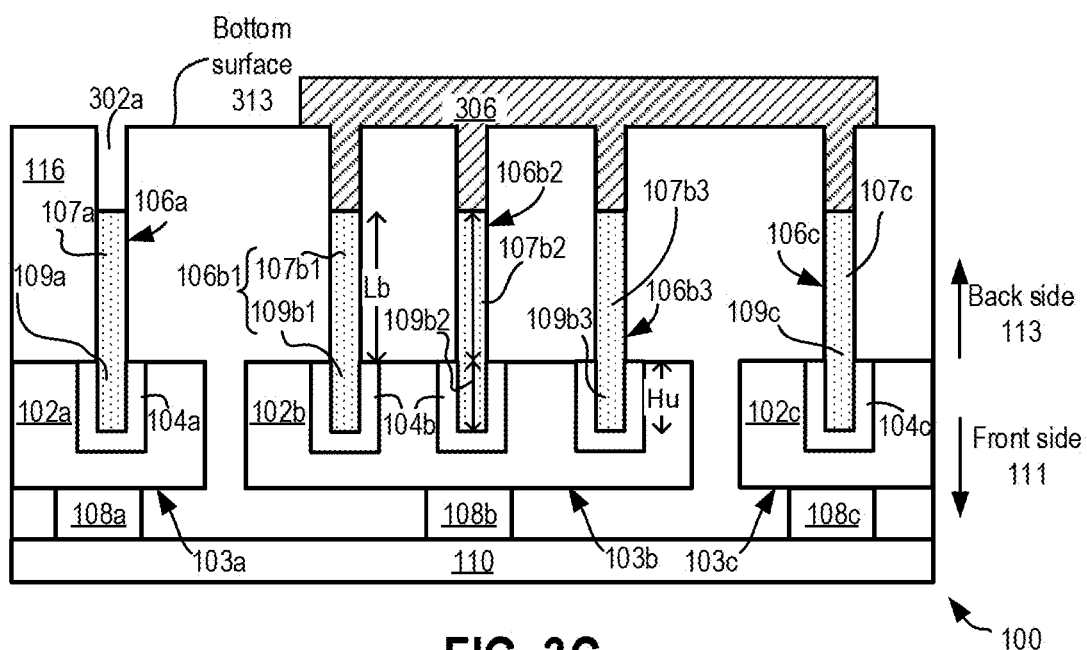

Referring again to FIG. 2, the method 200 then proceeds from 208 to 212, where lower regions of first one or more fins (e.g., fins 106b1, 106b2, 106b3, 106c) are masked (e.g., using mask 306) through the bottom surface 313 of the backside 113, while keeping lower regions of second one or more fins (e.g., fin 106a) exposed through the bottom surface of the backside 113, as illustrated in FIG. 3C. The mask 306 may be deposited or otherwise formed on the bottom surface 313 of the backside 113 of the IC 100 using any suitable techniques as will be apparent in light of this disclosure. For example, the mask 306 may be blanket deposited using chemical vapor deposition (CVD), atomic layer deposition (ALD), physical vapor deposition (PVD), spin-on processing, and/or any other suitable process to form masks. After being blanket formed on the bottom surface 313, the mask 306 may then be patterned using any suitable techniques, such as one or more lithography and etch processes, for example. Mask 306 may include any suitable material, such as oxide material, nitride material, and/or any other suitable masking material to which further fin etching will be selective, for example. Specific oxide and nitride materials may include silicon oxide, titanium oxide, hafnium oxide, aluminum oxide, silicon nitride, and titanium nitride, just to name a few examples. In some cases, the material of mask 306 may be selected based on the material of ILD 116 and/or material of the fins 106, for example. In an example, the mask 306 is a carbon hard mask (CHM).

Figure 3D:
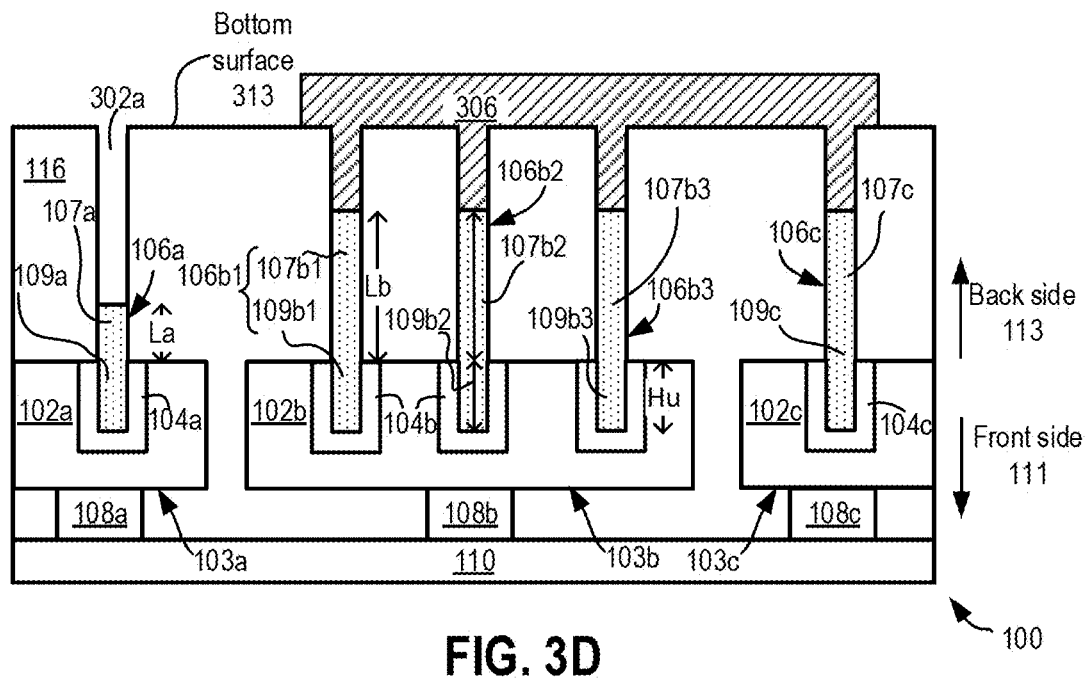

Referring again to FIG. 2, the method 200 then proceeds from 212 to 216, where through the backside 113, lower regions of the second one or more fins (e.g., fin 106a) are further partially removed (e.g., through the recess 302a), such that the lower regions of the second one or more fins is now shorter than the lower regions of the first one or more fins (e.g., fins 106b1, 106b2, 106b3, 106c), as illustrated in FIG. 3D. For example, FIG. 3D illustrates the lower region 107a of the fin 106a being shorter than the lower regions of the fins 106b1, 106b2, 106b3, 106c. Subsequently, also at 216, the mask is then removed (e.g., via ashing or other suitable mask removal process).

Figure 3E:
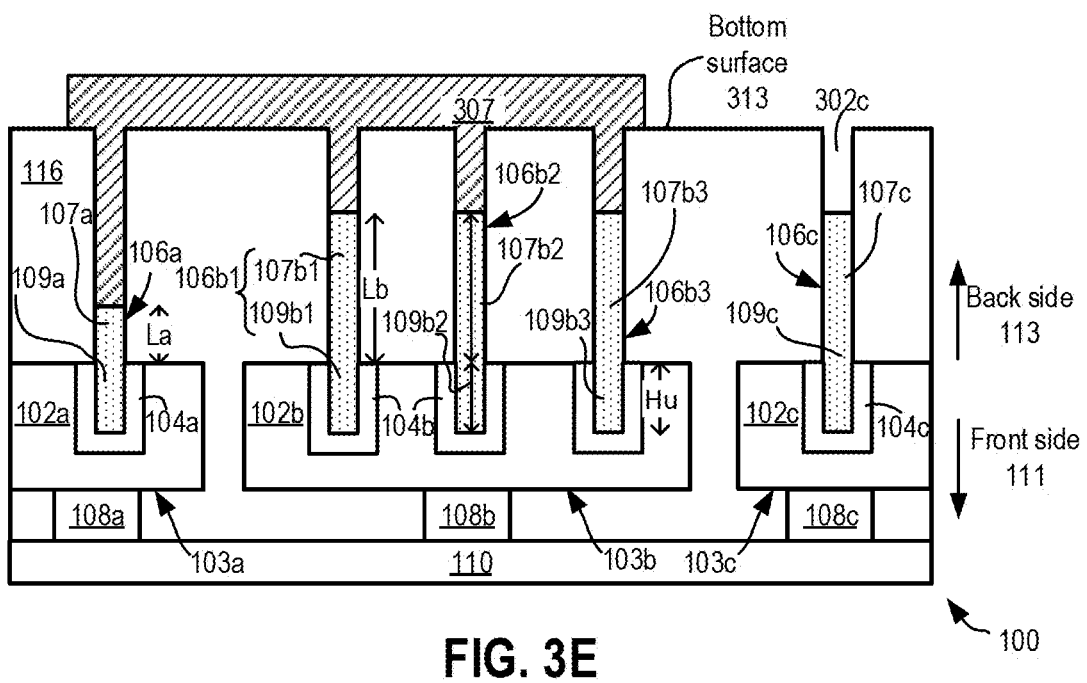
Figure 3F:
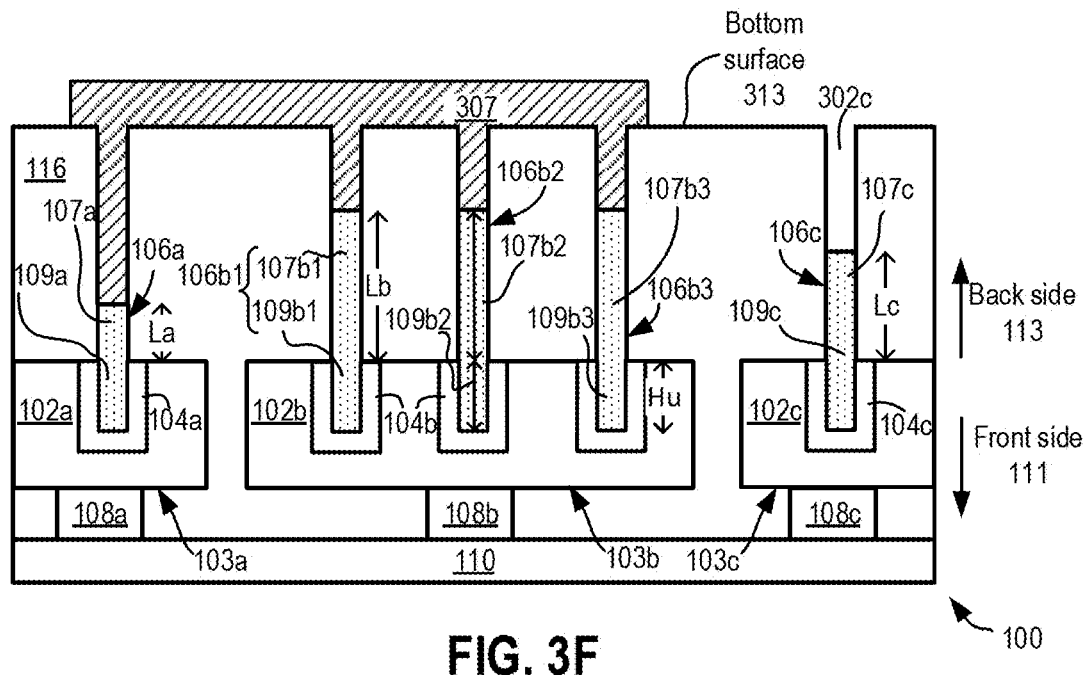

Referring again to FIG. 2, the method 200 then proceeds from 216 to 220, where the processes 212 and 216 are repeated as needed, to tune vertical heights of the lower regions of various fins. For example, as illustrated in FIG. 3E, fins 106a, 106b1, 106b2, and 106b3 are subsequently masked using a mask 307 deposited on the bottom surface 313, while leaving the lower region 107c exposed through the bottom surface 313 and the recess 302c. Subsequently, the exposed lower region 107c of the fin 106c is etched through the bottom surface 313 and the recess 302c, to reduce the height of the lower region 107c of the fin 106c to Lc, as illustrated in FIG. 3F.

Figure 3G:
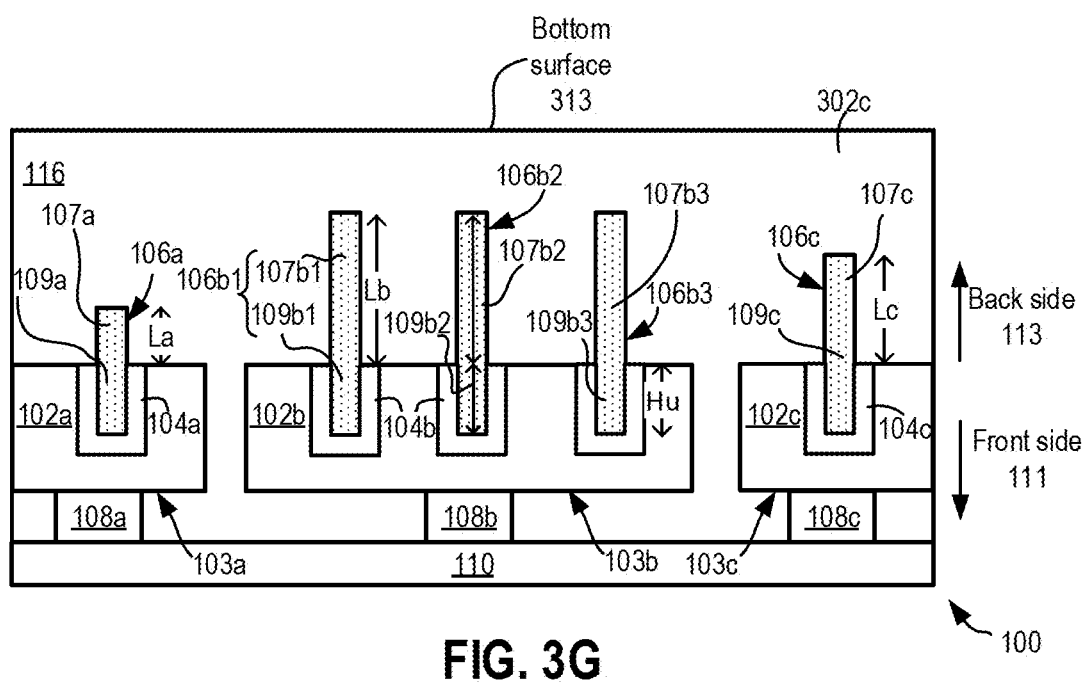

Referring again to FIG. 2, the method 200 then proceeds from 220 to 224, where all masks are removed, and the recesses 302 formed by partial removal of the lower regions of the fins are filed with dielectric material, as illustrated in FIG. 3G. In an example, the dielectric material used to fill the recesses may be same as the ILD 116, as illustrated in FIG. 3G. In another example, the recesses are filed with another dielectric material that is different from the ILD 116. The IC 100 of FIG. 3G is the same as (although flipped or upside down) the IC 100 of FIG. 1A.

Numerous variations on method 200 and the techniques described herein will be apparent in light of this disclosure.

Figure 4A:
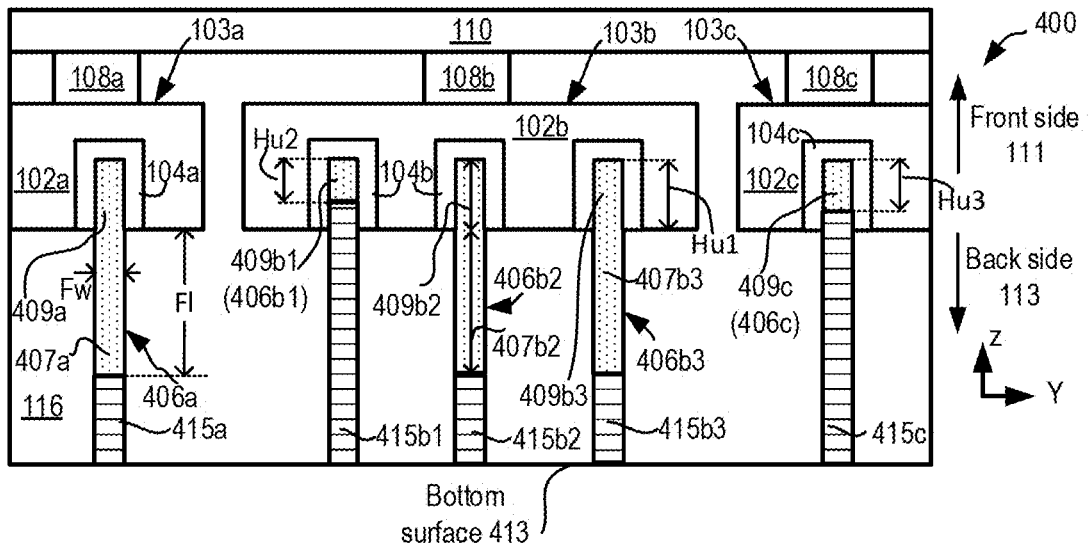
FIG. 4A illustrates a cross-sectional view of an IC comprising a plurality of fins, with each fin comprising a corresponding upper region, with corresponding gate structure on at least top and side surfaces of the upper region, and with each of one or more of the fins comprising a corresponding lower region below the upper region, wherein a first vertical height $Hu2$ of a first upper region of a first fin is different from a second vertical height $Hu1$ of a second upper region of a second fin by at least 2 nm, in accordance with an embodiment of the present disclosure.

FIG. 4A illustrates a cross-sectional view of an integrated circuit (IC) 400 comprising a plurality of fins 406, with each fin 406 comprising a corresponding upper region 409, with corresponding gate structure 103 on at least top and side surfaces of the upper region 409, and with each of one or more of the fins 406 comprising a corresponding lower region 407 below the upper region 409, wherein a first vertical height Hu2 of a first upper region 409b1 of a first fin 406b1 is different from a second vertical height Hu1 of a second upper region 409b3 of a second fin 406b3 by at least 2 nm, in accordance with an embodiment of the present disclosure.

Similar components in the ICs 100 and 400 of FIGS. 1A and 4A, respectively, are labelled using the same label. For example, similar to the IC 100 of FIG. 1A, the IC 400 of FIG. 4A comprises gate structures 103a, 103b, 103c, (or 103d, as the case may be) each gate structure 103 comprising gate electrode 102 and gate dielectric 104, and a corresponding gate contact 108. Furthermore, an upper region 409 of a fin 406 (which may include one or more nanoribbons, wires or sheets, as previously explained) is laterally between a corresponding source region and a corresponding drain region, e.g., as discussed with respect to FIG. 1B. Discussion about various components of the IC 100 of FIGS. 1A and 1B, unless otherwise mentioned or is contradictory in nature, is also applicable to the IC 400 of FIG. 4A.

As illustrated in FIG. 4A, each fin 406 has a corresponding upper region 409 and may (or may not) have a corresponding lower region 407. For example, the fin 406a has an upper region 409a and a lower region 407a; the fin 406b2 has an upper region 409b2 and a lower region 407b2; and the fin 406b3 has an upper region 409b3 and a lower region 407b3. On the other hand, the fin 406b1 has an upper region 409b1, and does not include a corresponding lower region; and the fin 406c has an upper region 409c, and does not include a corresponding lower region. Although five fins are illustrated, the IC 400 can include any other appropriate number of fins; further note that a non-integer number of fins may be present, such as in cases where the gated portion of the fin is trimmed to effectively provide a fractional fin as previously explained above (in this example, for instance, fins 406b1 and 406c are effectively partial fins, relative to other fins shown).

Similar to the IC 100, in the IC 400 of FIG. 4A, an upper region 409 of a fin 406 has a corresponding gate structure 103 at least on top and side surfaces thereon (and wrapped therearound for gate-all-around configurations, see the dotted circle in FIG. 1A). Thus, put differently, a section of a fin 406, having a corresponding gate structure 403 on top and side surfaces thereon, is referred to as the upper region of the fin. As illustrated, the upper region 409 of a fin 406 is laterally between two sections of a corresponding gate structure 103.

The upper region 409 of a fin is also referred to herein as an "active region" or "channel region" of the fin, as this region 409 contributes to conduction of current between a corresponding source region and a corresponding drain region. That is, current is selectively transmitted between a source and drain region through the upper region 409 of the fin. The lower region 407 of a fin 406, if present, is also referred to herein as a "sub-fin" region of the fin. As illustrated, the lower region 407 of a fin, if present, extends within the ILD 116.

In the example of the IC 100 of FIG. 1A, characteristics of the transistor (e.g., device threshold voltage Vt, switching speed, leakage current) were controlled by controlling a height of the lower region of the fin. In contrast, in the example of the IC 400 of FIG. 4A, one or more characteristics of the transistor (e.g., strength or drive current of a transistor) is controlled by controlling a height of the active region (i.e., the upper region 409) of individual fins.

In one embodiment, in the IC 400 of FIG. 4A, a vertical height Hu of an upper region of a fin may be different from that of another fin. For example, an upper region of a fin (e.g., fins 406b1 and 406c) may be trimmed from bottom (e.g., through the bottom surface 413 of the backside 113), so as to fully remove the lower region of the fin and partially remove the upper region of the fin, resulting in a shorter height of the upper region of such a fin (e.g., compared to those fins, such as fins 406a, 406b2, 406b3, for which no such trimming of the upper region is performed).

For example, as illustrated in FIG. 4A, each of the upper regions 409a, 409b2, and 409b3 of the fins 406a, 406b2, and 406b3, respectively, has a full vertical height of Hu1. Thus, no section of the upper regions 409a, 409b2, and 409b3 are trimmed or removed.

In contrast, the entire lower region of the fin 406b1 and at least a bottom section of the upper region 409b1 of the fin 406b1 are removed, resulting in a shorter vertical height Hu2 of the upper region 409b1 of the fin 406b1. Similarly, the entire lower region of the fin 406c and at least a bottom section of the upper region 409c of the fin 406c are removed, resulting in a shorter vertical height Hu3 of the upper region 409c of the fin 406c.

Accordingly, in one embodiment, the vertical heights of the upper regions 409a, 409b2, and 409b3 are substantially the same (e.g., within 2 nm, or 1 nm, or 5 angstroms of each other), and are substantially equal to Hu1. Similarly, the vertical heights of the lower regions 407a, 407b2, and 407b3 are substantially the same (e.g., within 2 nm, or 1 nm, or 5 angstroms of each other).

In contrast, the vertical height Hu2 of the upper region 409b1 of the fin 406b1 is shorter than the vertical height Hu1 of the upper region 409b3 by at least 2 nm, or by at least 4 nm, or by at least 6 nm, or by at least 8 nm, or by at least 10 nm. In an example, a difference between the vertical heights Hu1 and Hu2 is in the range of 2 to 30 nm (or in any subrange thereof, such as between 2-4, 2-8, 2-15, 2-25, 4-8, 4-15, 4-30, 10-20, 10-30, or 20-30 nm) for example. Thus, for example, assume that a bottom surface of the upper region 409b1 of the fin 406b1 is within a first horizontal plane, a bottom surface of the upper region 409b3 of the fin 406b3 is within a second horizontal plane, and a vertical distance between the first and second horizontal planes is in the range of 2 to 30 nm, or in any subrange thereof.

Similarly, the vertical height Hu3 of the upper region 409c of the fin 406c is shorter than the vertical height Hu1 of the upper region 409b3 by at least 2 nm, or by at least 4 nm, or by at least 6 nm, or by at least 8 nm, or by at least 10 nm. In an example, a difference between the vertical heights Hu1 and Hu3 is in the range of 2 to 30 nm (or in any subrange thereof, such as between 2-4, 2-8, 2-15, 2-25, 4-8, 4-15, 4-30, 10-20, 10-30, or 20-30 nm) for example. Thus, for example, assume that a bottom surface of the upper region 409c of the fin 406c is within a first horizontal plane, a bottom surface of the upper region 409b3 of the fin 406c is within a second horizontal plane, and a vertical distance between the first and second horizontal planes is in the range of 2 to 30 nm, or in any subrange thereof.

In an example, the height Hu2 may be tuned independent of the height Hu3. For example, the heights Hu2 and Hu3 may be same or different, based on the requirements of the transistors respectively comprising the fins 406b1 and 406c.

As illustrated, the gate structure 102b is on a top surface, and only a portion of a side surface of the fin 406b2. For example, the gate structure 102b is a side surface of the upper region 409b2 of the fin 406b2, and is not on a side surface of the lower region 407b2 of the fin 406b2. As illustrated, a bottommost surface of the gate structure 102b is above a bottommost surface of the fin 406b2 (or the fin 406b3).

In contrast, the gate structure 102b is on a top surface, and on an entire portion of a side surface of the trimmed fin 406b1. That is, the gate structure 102b is on an entire side surface along a length of the fin 406b1 (e.g., as this fin doesn't have a lower region). As illustrated, a bottommost surface of the gate structure 102b is below a bottommost surface of the fin 406b1.

In one embodiment, a top surface of the fins 406 (i.e., a top surface of the upper regions 409a, 409b1, 409b2, 409b3, and 409c of the fins 406) are substantially coplanar. For example, assume that a first top surface of a first fin is at a first horizontal plane, and a second top surface of a second fin is at a second horizontal plane. In an example, the first and second horizontal planes overlap, or is separated by a vertical distance of at most 5 angstroms, or at most 1 nm, or at most 2 nm.

In the IC 400 of FIG. 4A, the number of fins included in a device may be fine-tuned to provide a fractional number of fins (e.g., 1.5 fins). For example, if Hu2 is about half of Hu1, then the device comprising the gate 102b and the fins 406b1, 406b2, 406b3 will have about 2.5 fins. In another example, if Hu2 is about 70% of Hu1, then the device comprising the gate 102b and the fins 406b1, 406b2, 406b3 will have about 2.7 fins. Thus, the number of fins within a device can be fine-tuned, to fine-tune drive current and/or one or more other characteristics of the device.

For example, it may be advantageous to have a relatively low drive current transistor device within an SRAM or logic circuit, and so, one or more of the devices within the SRAM or logic circuit can have 1 fin, or less than 1 fin (such as 0.7 fin, as is the fin 406c in FIG. 4A), while a higher drive current device within an input/output (I/O) circuit may have 1.5 fins or 2.5 fins in the device, such as the device comprising fins 406b1, 406b2, and 406b3. Thus, a strength (e.g., drive current) of a transistor device can be precisely controlled, by tuning the height of active (or upper) regions of individual fins of the transistor.

In some embodiments, the fin widths Fw (dimension in the horizontal or Y-axis direction, see example fin width of the fin 406a in FIG. 4A) may be in the range of 2-400 nm (or in any subrange thereof, such as between 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In an example, average widths of various fins are substantially equal (e.g., within 2 nm, or 1 nm of each other).

Similar to the IC 100 of FIG. 1A, in the IC 400 of FIG. 4A, each gate structure 103 comprises sidewall spacers (see, for example, FIG. 1B). In the IC 400, the gate structures 103 (such as the gate structure 103b) comprises a gate stack including gate dielectric 104 and gate electrode 102, as also discussed with respect to FIG. 1A. The gate structure 103 is above and on side surfaces of upper regions of the fins 406b1, 406b2, and 406b3.

In the IC 400, in one embodiment, the gate structures 103a, 103b, 103c are formed at a same horizontal level. For example, bottommost surfaces of the gate structures 103a, 103b, and/or 103b are substantially co-planar to each other (e.g., separated by a vertical distance of at most 2 nm, or 1 nm). Similarly, topmost surfaces of the gate structures 103a, 103b, and/or 103b are substantially co-planar to each other (e.g., separated by a vertical distance of at most 2 nm, or 1 nm).

In the example of FIG. 4A, the IC 400 comprises, below each fin 406, a corresponding layer of dielectric material 415. For example, recesses are formed by removing the lower regions and optionally trimming the upper regions of individual fins (e.g., discussed herein later with respect to FIGS. 6B-6G), which are filed with the dielectric material 415. In the example of FIG. 4A, the dielectric material 415 is compositionally different from the ILD 116, although in another example the dielectric material 415 may be compositionally same as the ILD 116 (see FIG. 4B). However, in an example, irrespective of whether the dielectric material 415 and the ILD 116 are compositionally the same or different, there would be an interface (such as a seam or a grain boundary) between a junction or boundary of the dielectric material 415 and the ILD 116, as the dielectric material 415 are deposited at a process (see FIG. 6G) that is different from a process for forming the ILD 116 (see FIG. 6A).

As illustrated, due to the recessed upper region 409b1, the dielectric material 415b1 extends within the gate structure 103b. For example, an upper portion of the dielectric material 415b1 is within the gate structure 103b. Thus, the gate structure (e.g., the gate dielectric 104b and the gate electrode 102b) are on side surfaces of the top portion of the dielectric material 415b1. Similarly, due to the recessed upper region 409c, the dielectric material 415c extends within the gate structure 103c.

Figure 4B:
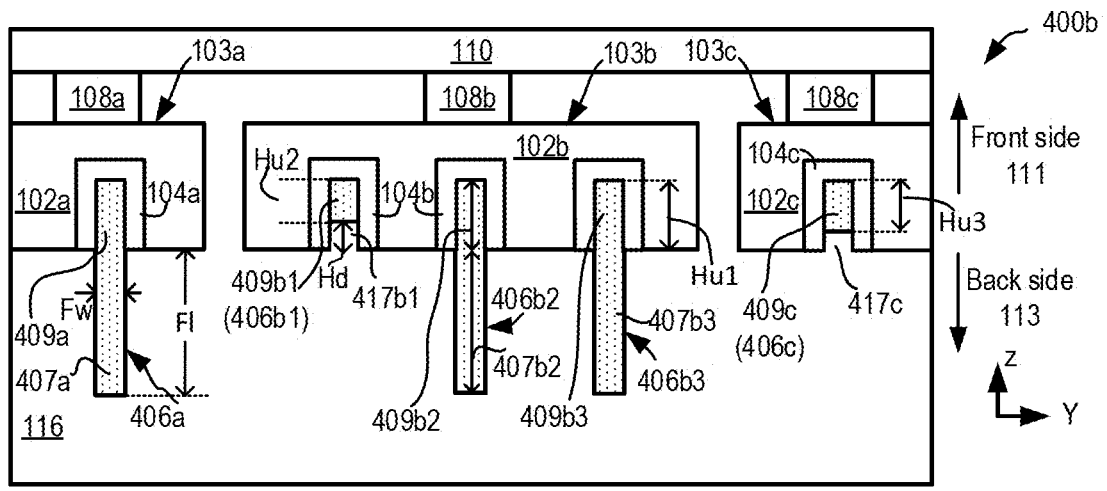
FIG. 4B illustrates a cross-sectional view of an IC comprising a plurality of fins, with each fin comprising a corresponding upper region, with corresponding gate structure on at least top and side surfaces of the upper region, and with each of one or more of the fins comprising a corresponding lower region below the upper region, wherein a first vertical height of a first upper region of a first fin is different from a second vertical height of a second upper region of a second fin by at least 2 nm, and wherein an ILD below the gate structures at least in part extends within at least one gate structure, in accordance with an embodiment of the present disclosure.

FIG. 4B illustrates a cross-sectional view of an IC 400b comprising a plurality of fins 406, with each fin 406 comprising a corresponding upper region 409, with corresponding gate structure 103 on at least top and side surfaces of the upper region 409, and with each of one or more of the fins 406 comprising a corresponding lower region 407 below the upper region 409, wherein a first vertical height Hu2 of a first upper region 409b1 of a first fin 406b1 is different from a second vertical height Hu1 of a second upper region 409b3 of a second fin 406b3 by at least 2 nm, and wherein an ILD 116 below the gate structures at least in part extends within at least one gate structure 102b, in accordance with an embodiment of the present disclosure.

The IC 400b of FIG. 4B is at least in part similar to the IC 400 of FIG. 4A. However, unlike FIG. 4A in which the dielectric material 415 is below individual fins 406, in FIG. 4B the ILD 116 is below the fins 406. Thus, in FIG. 4B, the ILD 116 replaces the dielectric materials 415 of FIG. 4A.

As illustrated, due to the recessed upper region 409b1, the ILD 116 extends within the gate structure 103b. For example, an upper portion 417b1 of the ILD 116 is within the gate structure 103b. Thus, the gate structure (e.g., the gate dielectric 104b and the gate electrode 102b) are on side surfaces of the portion 417b1 of the ILD 116. In an example, a vertical height of the portion 417b1, which extends within the gate structure 103b, is Hd (see FIG. 4B), where height Hd is at least 2 nm, or at least 4 nm, or at least 6 nm, or at least 10 nm, or at least 15 nm, or at least 20 nm, for example. Similarly, due to the recessed upper region 409c, a portion 417c of the ILD 116 extends within the gate structure 103c.

Figure 5:
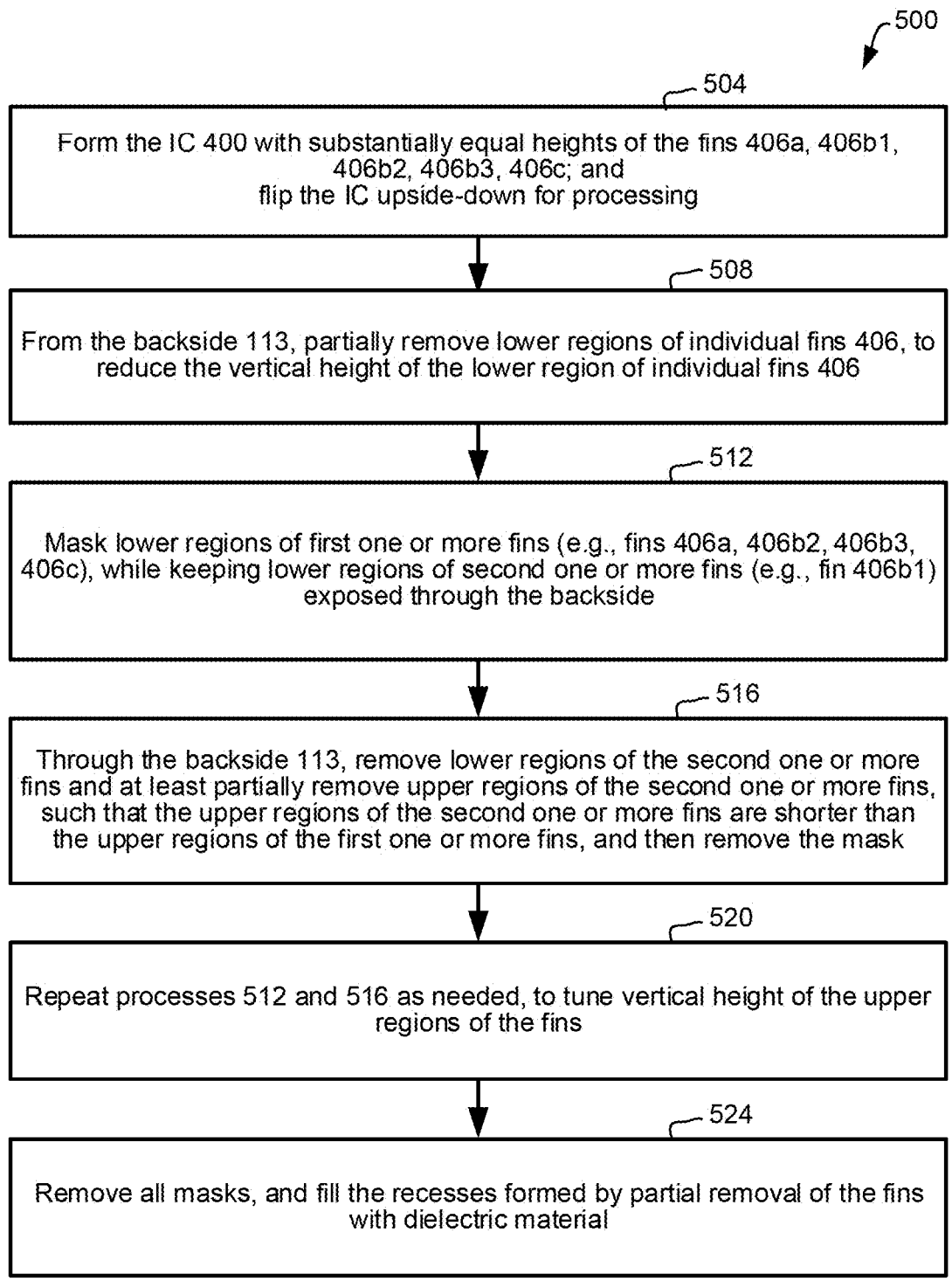
FIG. 5 illustrates a flowchart depicting a method of forming an IC (such as the IC of FIG. 4A) comprising a plurality of fins, with each fin comprising a corresponding upper region, with corresponding gate structure on at least top and side surfaces of the upper region, and with each of one or more of the fins comprising a corresponding lower region below the upper region, wherein a first vertical height of a first upper region of a first fin is different from a second vertical height of a second upper region of a second fin by at least 2 nm, in accordance with an embodiment of the present disclosure.

FIG. 5 illustrates a flowchart depicting a method 500 of forming an IC (such as the IC 400 of FIG. 4A) comprising a plurality of fins 406, with each fin 406 comprising a corresponding upper region 409, with corresponding gate structure 103 on at least top and side surfaces of the upper region 409, and with each of one or more of the fins 406 comprising a corresponding lower region 407 below the upper region 409, wherein a first vertical height Hu2 of a first upper region 409b1 of a first fin 406b1 is different from a second vertical height Hu1 of a second upper region 409b3 of a second fin 406b3 by at least 2 nm, in accordance with an embodiment of the present disclosure. FIGS. 6A, 6B, 6C, 6D, 6E, 6F, and 6G illustrate various cross-sectional views of an IC (such as the IC 400 of FIG. 4A) in various stages of processing, in accordance with an embodiment of the present disclosure. FIGS. 5 and 6A-6F will be discussed in unison. The cross-sectional views of FIGS. 6A-6F are similar to that of FIG. 4A.

Figure 6A:
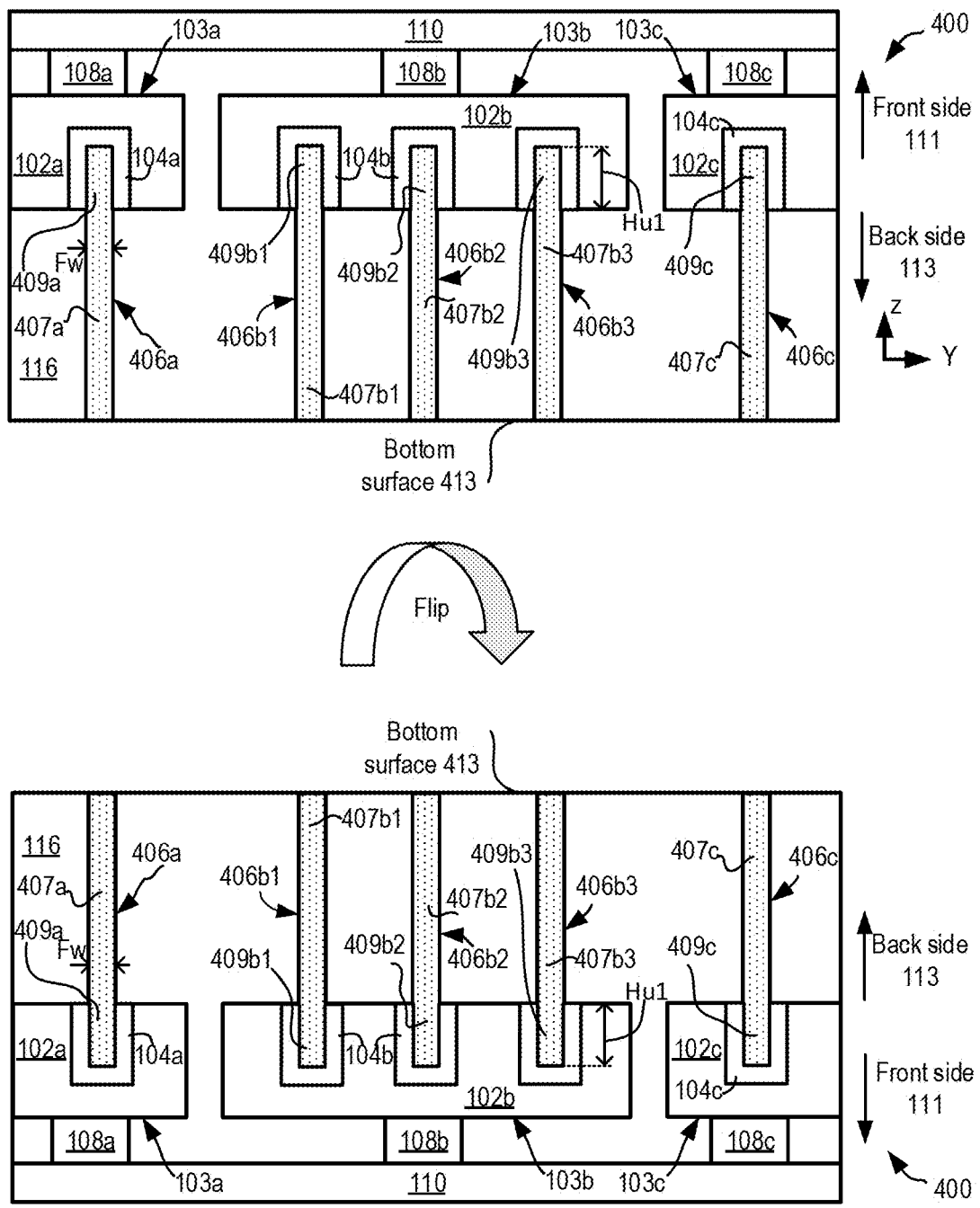
FIGS. 6A, 6B, 6C, 6D, 6E, 6F, and 6G illustrate various cross-sectional views of an IC (such as the IC of FIG. 4A) in various stages of processing, in accordance with an embodiment of the present disclosure.

Referring to FIG. 5, the method 500 includes, at 504, forming the IC 400 with substantially equal heights of the fins 406a, 406b1, 406b2, 406b3, 406c, as illustrated in top section of FIG. 6A. As illustrated, a bottom surface of the lower regions 407 of individual fins 406 are exposed through a bottom surface 413 of the backside 113. The formation of the IC at process 504 is performed using any appropriate process to form FinFETs having substantially equal fin height, as will be apparent in view of this disclosure.

Subsequently, also at 504, the IC 400 is flipped for further processing, e.g., as also discussed with respect to process 204 of the method 200 of FIG. 2A, and as also illustrated in the bottom section of FIG. 6A.

Figure 6B:
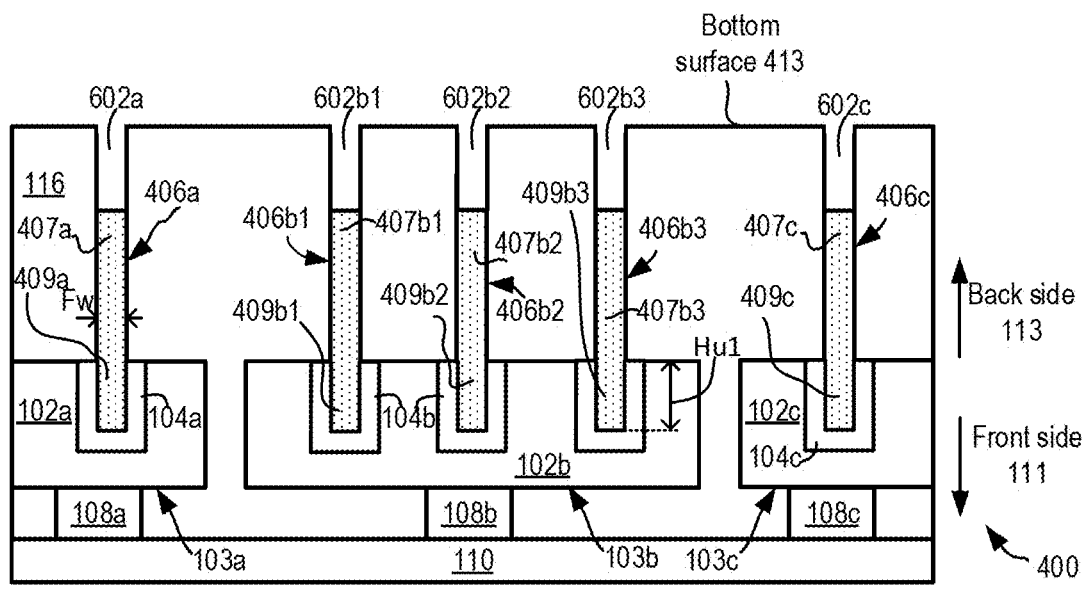

Referring again to FIG. 5, the method 500 then proceeds from 504 to 508, where from the backside 113 (e.g., through the bottom surface 413 of the backside 113), lower regions of individual fins 406 are partially removed, to reduce the vertical height of the lower regions of individual fins 406, as illustrated in FIG. 6B (and as also discussed with respect to process 208 of the method 200 of FIG. 2A), thereby forming recesses 602.

Figure 6C:
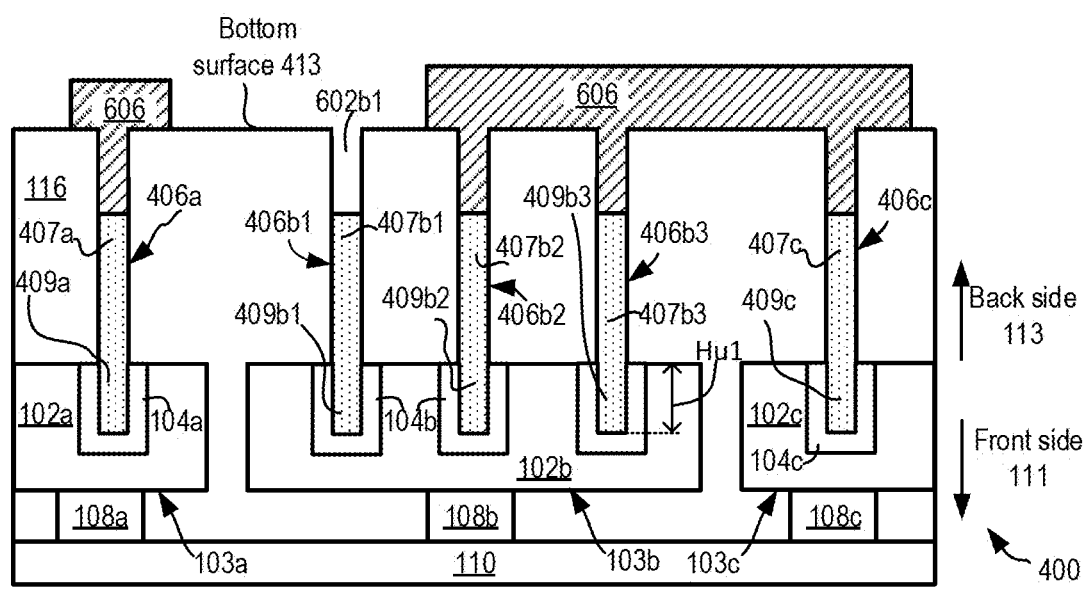

Referring again to FIG. 5, the method 500 then proceeds from 508 to 512, where lower regions of first one or more fins (e.g., fins 406a, 406b2, 406b3, 406c) are masked (e.g., using mask 606) through the bottom surface 413 of the backside 113, while keeping lower regions of second one or more fins (e.g., fin 406b1) exposed through the bottom surface of the backside 113, as illustrated in FIG. 6C and as also discussed with respect to process 212 of method 200 of FIG. 2.

Figure 6D:
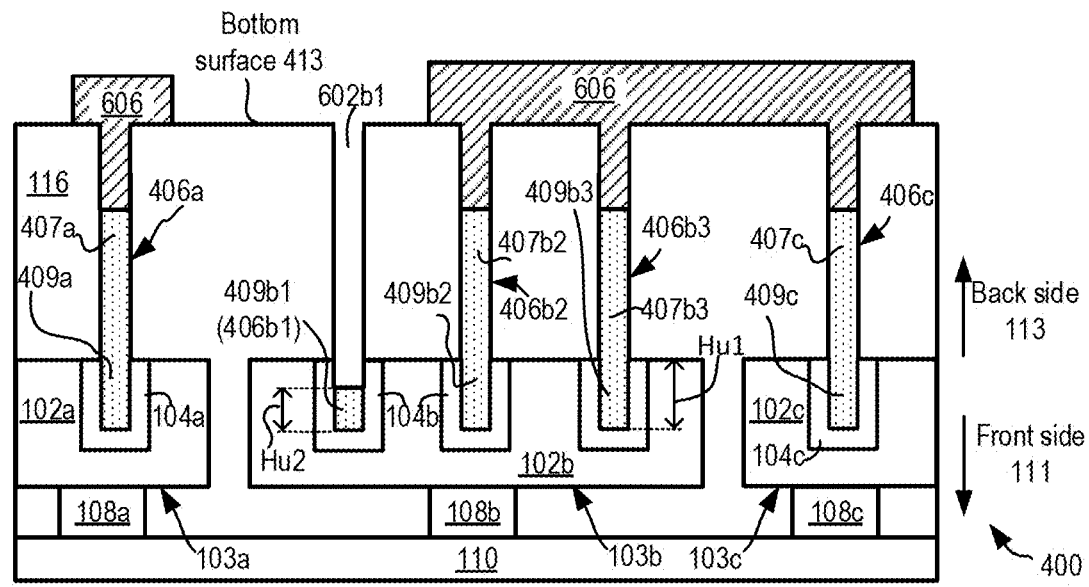

Referring again to FIG. 5, the method 500 then proceeds from 512 to 516, where through the backside 113, lower regions of the second one or more fins (e.g., fin 406b1) are removed, and upper regions of the second one or more fins are at least partially remove, such that the upper regions of the second one or more fins are shorter than the upper regions of the first one or more fins. For example, FIG. 6D illustrates that the lower region 407b1 of the fin 406b1 is removed, and the upper region 409b1 of the fin 406b1 is partially removed, such that the upper region 409b1 of the fin 406b1 has a height of Hu2 that is shorter than the height of the upper regions 409a, 409b2, 409b3, and 409c. Subsequently, also at 516, the mask is then removed. Any appropriate etch process is employed for the removal of sections of the fin, such as an isotropic etch process.

Figure 6E:
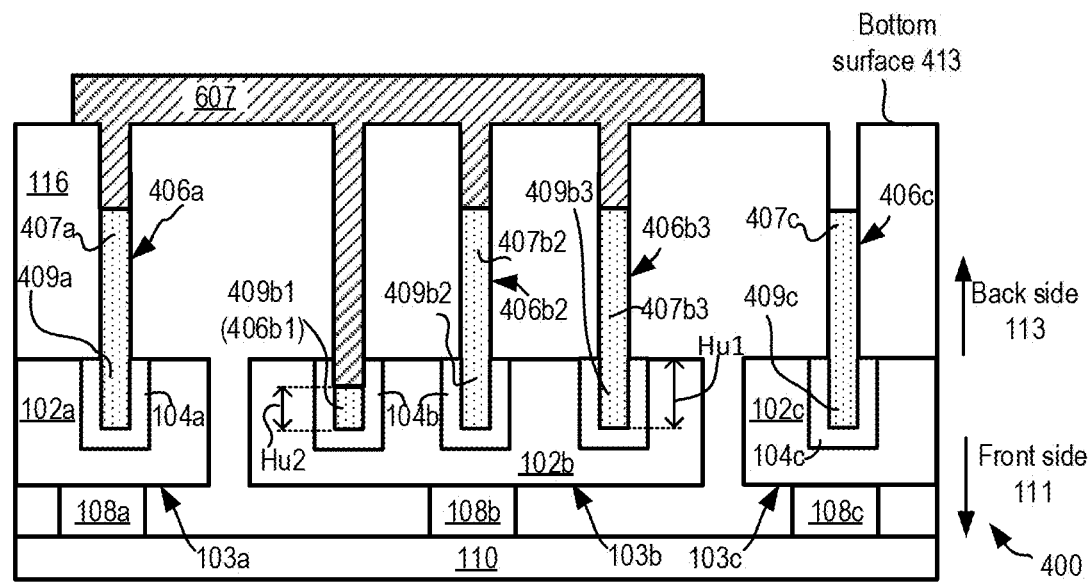
Figure 6F:
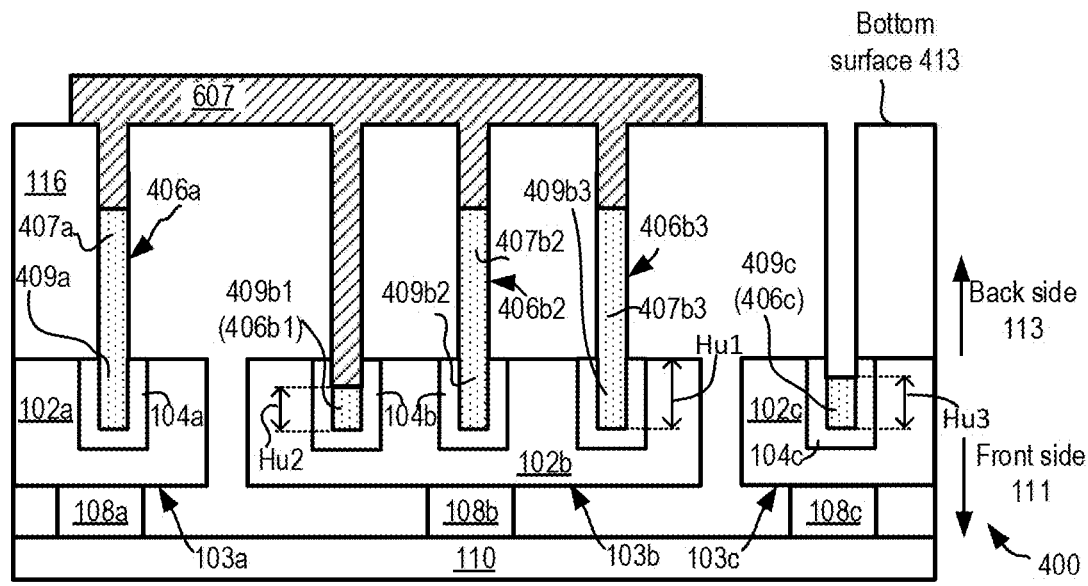

Referring again to FIG. 5, the method 500 then proceeds from 516 to 520, where the processes 512 and 516 are repeated as needed, to tune vertical heights of the upper regions of various fins. For example, as illustrated in FIG. 6E, fins 406a, 406b1, 406b2, and 406b3 are subsequently masked using a mask 607 deposited on the bottom surface 413, while leaving the lower region 407c of the fin 406c exposed through the bottom surface 413. Subsequently, the exposed lower region 407c and a section of the upper region 409c of the fin 406c is etched through the bottom surface 313, to reduce the height of the upper region 409c of the fin 406c to Hu3, as illustrated in FIG. 6F.

Figure 6G:
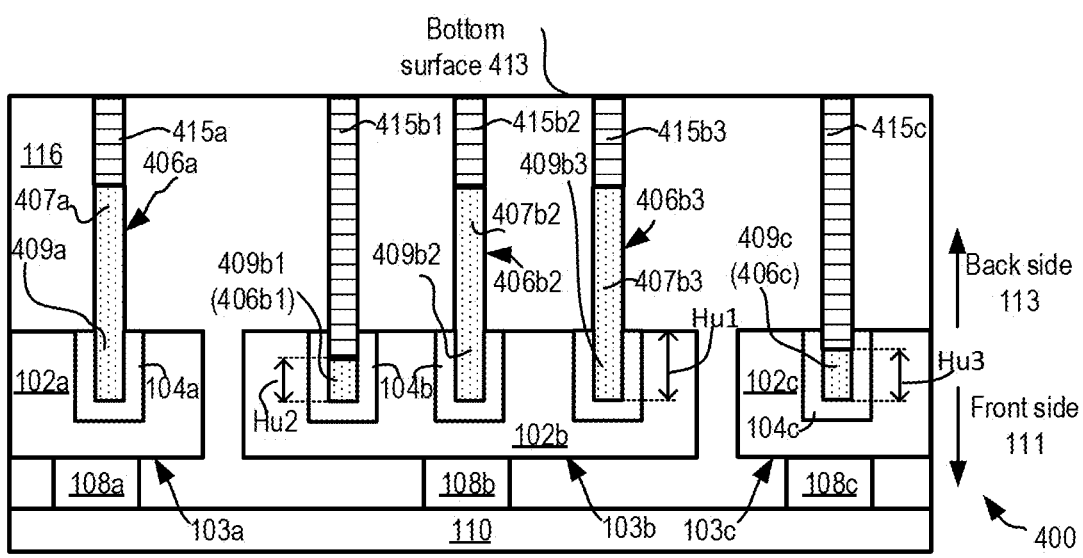

Referring again to FIG. 5, the method 500 then proceeds from 520 to 524, where all masks are removed, and the recesses formed by partial removal of the fins are filed with dielectric material 415, as illustrated in FIG. 6G. In an example, the dielectric material 415 is overfilled, and then planarized using chemical mechanical polishing (CMP), mechanical polishing, or another planarization technique. In an example, the dielectric material 415 used to fill the recesses may be same as the ILD 116, as illustrated in FIG. 4B. In another example and as illustrated in FIGS. 6G and 4A, the recesses are filed with dielectric material 415 that is different from the ILD 116. The IC 400 of FIG. 6G is same as (although flipped or upside down) as the IC 400 of FIG. 4A.

Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

Figure 7A:
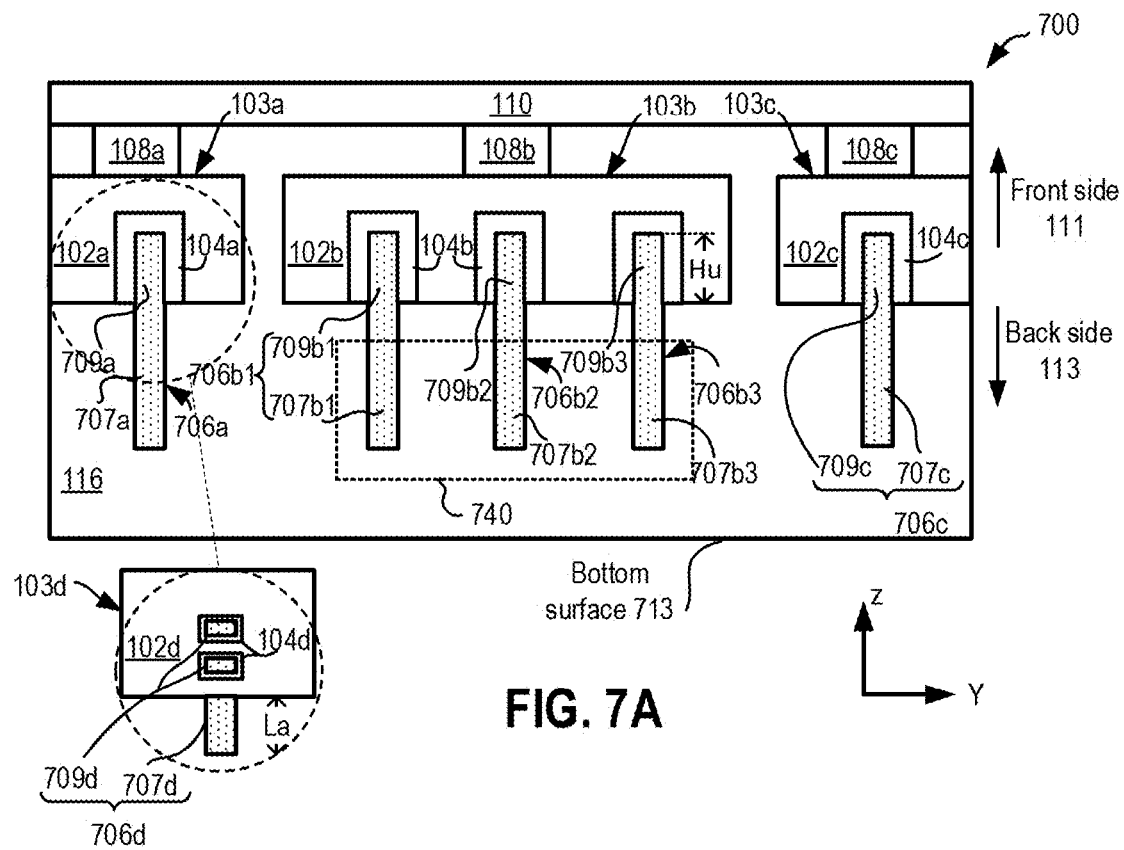
FIG. 7A illustrates a cross-sectional view of an IC comprising a plurality of fins, with each fin comprising (i) a corresponding upper region and (ii) a corresponding lower region below the upper region, with a corresponding gate structure on at least top and side surfaces of the upper region, and wherein impurities are implanted at least in part in the lower regions on one or more fins through a bottom surface of a backside of the IC, in accordance with an embodiment of the present disclosure.

FIG. 7A illustrates a cross-sectional view of an IC 700 comprising a plurality of fins 706, with each fin 706 comprising (i) a corresponding upper region 709 and (ii) a corresponding lower region 707 below the upper region 709, with a corresponding gate structure 103 on at least top and side surfaces of the upper region 709, and wherein impurities are implanted at least in part in the lower regions on one or more fins through a bottom surface 713 of a backside 113 of the IC 700, in accordance with an embodiment of the present disclosure.

Similar components in the ICs 100 and 700 of FIGS. 1A and 7A, respectively, are labelled using the same label. For example, similar to the IC 100 of FIG. 1A, the IC 700 of FIG. 7A comprises gate structures 103a, 103b, 103c, each gate structure 103 comprising gate electrode 102 and gate dielectric 104, and a corresponding gate contact 108. Furthermore, upper region 709 of a fin 706 is laterally between a corresponding source region and a corresponding drain region, e.g., as discussed with respect to FIG. 1B. Discussion about various components of the IC 100 of FIGS. 1A and 1B, unless otherwise mentioned or is contradictory in nature, is also applicable to the IC 700 of FIG. 7A.

In one embodiment, impurities are implanted in lower regions of one or more fins, e.g., to tune the threshold voltage Vt of a transistor comprising the fins. As will be discussed in further detail in turn, the impurities are implanted through the bottom surface 713 of the backside 113. Merely as an example, illustrated in FIG. 7A is an approximate of a boundary region 740 where the impurities are implanted. As will be apparent, the impurities will not be strictly restricted within the region 740 and some impurities will be outside the region 740. However, the dotted lines of the region 740 indicates an approximate boundary, within which the concentration or impurity profile of the impurities will be the highest. For example, the impurities may be spread in accordance with a probability distribution (such as a Gaussian probability distribution, or another appropriate probability distribution), e.g., based on a current, a voltage, or an energy used during an ion implantation process to implant the impurities, and the impurity profile within the region 720 may be more than the impurity profile within regions adjacent to but outside the region 720.

For example, a concentration of the impurities within the lower regions 707b1, 707b2, and/or 707b3 of the fins 706b1, 706b2, and/or 706b3 is higher than the concentration of the impurities within the corresponding upper regions 709b1, 709b2, and/or 70793 by at least 10%, or 20%, or 30%, or 40%, or 50%, or 60%, or 70%, or 80%. For example, impurities within the upper regions 709b1, 709b2, and/or 70793 may be at least 0% to 80% of the impurities within the lower regions 707b1, 707b2, and/or 707b3 of the fins 706b1, 706b2, and/or 706b3.

By introducing the impurities within the lower regions 707 of one or more fins, the threshold voltage Vt of the corresponding transistor may be tuned. In another example, the impurities provide electrical isolation within the lower regions 707 of the fins, resulting in lower leakage current through the lower regions 707. The impurities may also be introduced to tune one or more other characteristics of the fins or the associated transistor devices.

The impurities can arguably be implanted through the frontside 111 of the IC 100 as well—however, such frontside implantation of the impurities will result in the impurities traversing through and/or being implanted within the corresponding gate structure 103 and/or the upper regions 709 of the fins, which may degrade the performance of the transistors. Accordingly, in an example, the impurities are introduced through the bottom surface 713 of the backside 113 of the IC 100. Hence, the impurities need not traverse through the gate structure 103 and/or the upper regions 709 of the fins, and may mainly be introduced within the lower regions 707 of the fins. Some impurities may travel up to and be introduced within the gate structure 103 and/or the upper regions 709, but concentration of the impurities within gate structure 103 and/or the upper regions 709 may be low, e.g., at least 10%, or 20%, or 30%, or 40%, or 50%, or 60%, or 70%, or 80% lower than the concentration of the impurities within the lower regions 707. An actual concentration of the impurities is based on a target application for which the transistors are to be used and/or a target threshold voltage Vt.

As will be discussed herein in turn in further detail, in an example, the impurities are implanted using an ion implantation process through the bottom surface 713 of the backside 113. In an example, the impurities are implanted by treating the bottom surface 713 of the backside 113 using plasma treatment. The impurities introduced within the lower regions 707b1, 707b2, and 707b3 may include any appropriate type of impurities that may be used to tune the threshold voltage of the transistors, such as any appropriate n-type dopants or p-type dopants.

Note that the impurities may be implanted in sub-fin regions of nanowires (or nanoribbons, or other channel regions of a gate-all-around configuration). For example, as illustrated in the dashed circle of FIG. 7A, a gate-all-around configuration is shown, in which gate dielectric 104d wraps around nanoribbons of the upper region 709d of fin 706d, and gate electrode 104d wraps around the nanoribbons as well and otherwise fills the gate trench. As can be further seen, lower region 707d extends below upper region 709d, for a distance La. In an example and as discussed with respect to fins 707b1, 707b2, and 707b3, impurities may also be implanted in at least a part of the lower region 707d of the fin 706d as well.

Figure 7B:
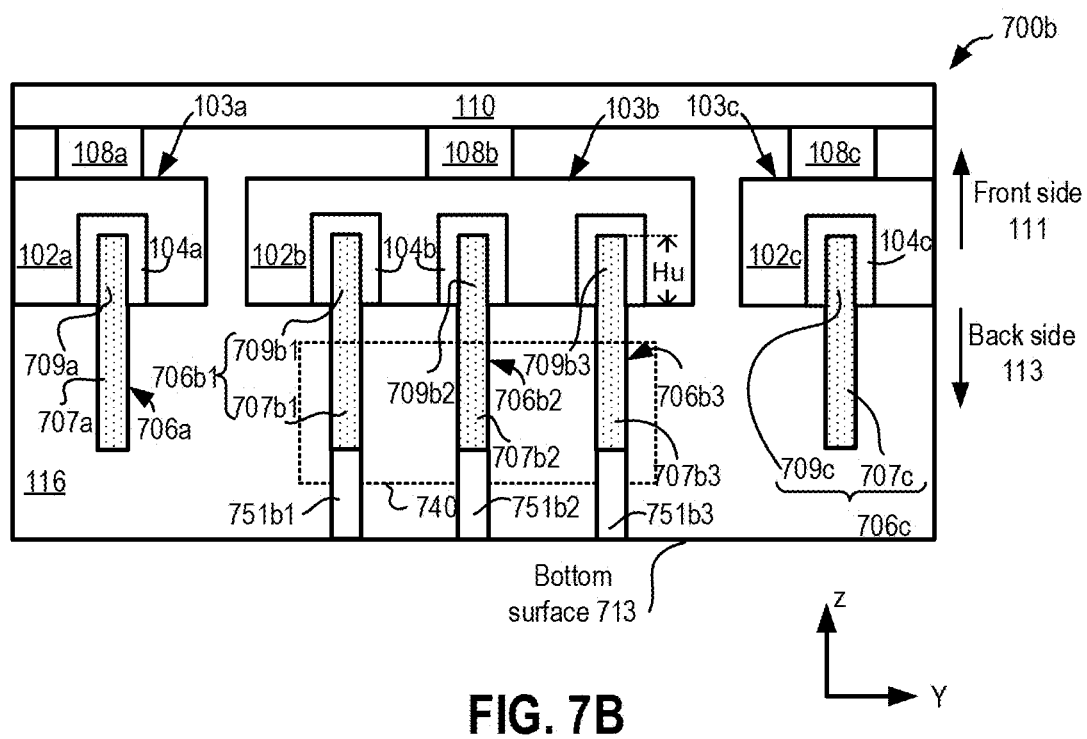
FIG. 7B illustrates a cross-sectional view of an IC comprising a plurality of fins, with each fin comprising (i) a corresponding upper region and (ii) a corresponding lower region below the upper region, with a corresponding gate structure on at least top and side surfaces of the upper region, and wherein impurities are implanted at least in part in the lower regions on one or more fins through a bottom surface of a backside of the IC, and wherein a layer of dielectric material below at least one of the one or more fins is substantially free of the impurities, in accordance with an embodiment of the present disclosure.

FIG. 7B illustrates a cross-sectional view of an IC 700b comprising a plurality of fins 706, with each fin 706 comprising (i) a corresponding upper region 709 and (ii) a corresponding lower region 707 below the upper region 709, with a corresponding gate structure 103 on at least top and side surfaces of the upper region 709, and wherein impurities are implanted at least in part in the lower regions on one or more fins through a bottom surface 713 of a backside 113 of the IC 700, and wherein a layer of dielectric material below at least one of the one or more fins is substantially free of the impurities, in accordance with an embodiment of the present disclosure.

The IC 700b of FIG. 7B is at least in part similar to the IC 700 of FIG. 7A. However, in the IC 700b of FIG. 7B, illustrated is a layer 751b1 of dielectric material below the lower region 707b1 of the fin 706b1, a layer 751b2 of dielectric material below the lower region 707b2 of the fin 706b1, and a layer 751b3 of dielectric material below the lower region 707b3 of the fin 706b3. The layers 751b1, 751b2, and 751b3 extend within the ILD 116, and may comprise same or different dielectric material compared to the ILD 116.

In one embodiment and as discussed herein in turn (see FIGS. 8, 9D, and 9F), during introducing the impurities within the lower regions 707 of the fins 706, the layers 751b1, 751b2, and 751b3 are not present in the IC 700b. Subsequent to the introduction of the impurities, the layers 751b1, 751b2, and 751b3 are deposited. Accordingly, in an example, the layers 751b1, 751b2, and 751b3 are substantially free of the impurities.

Figure 8:
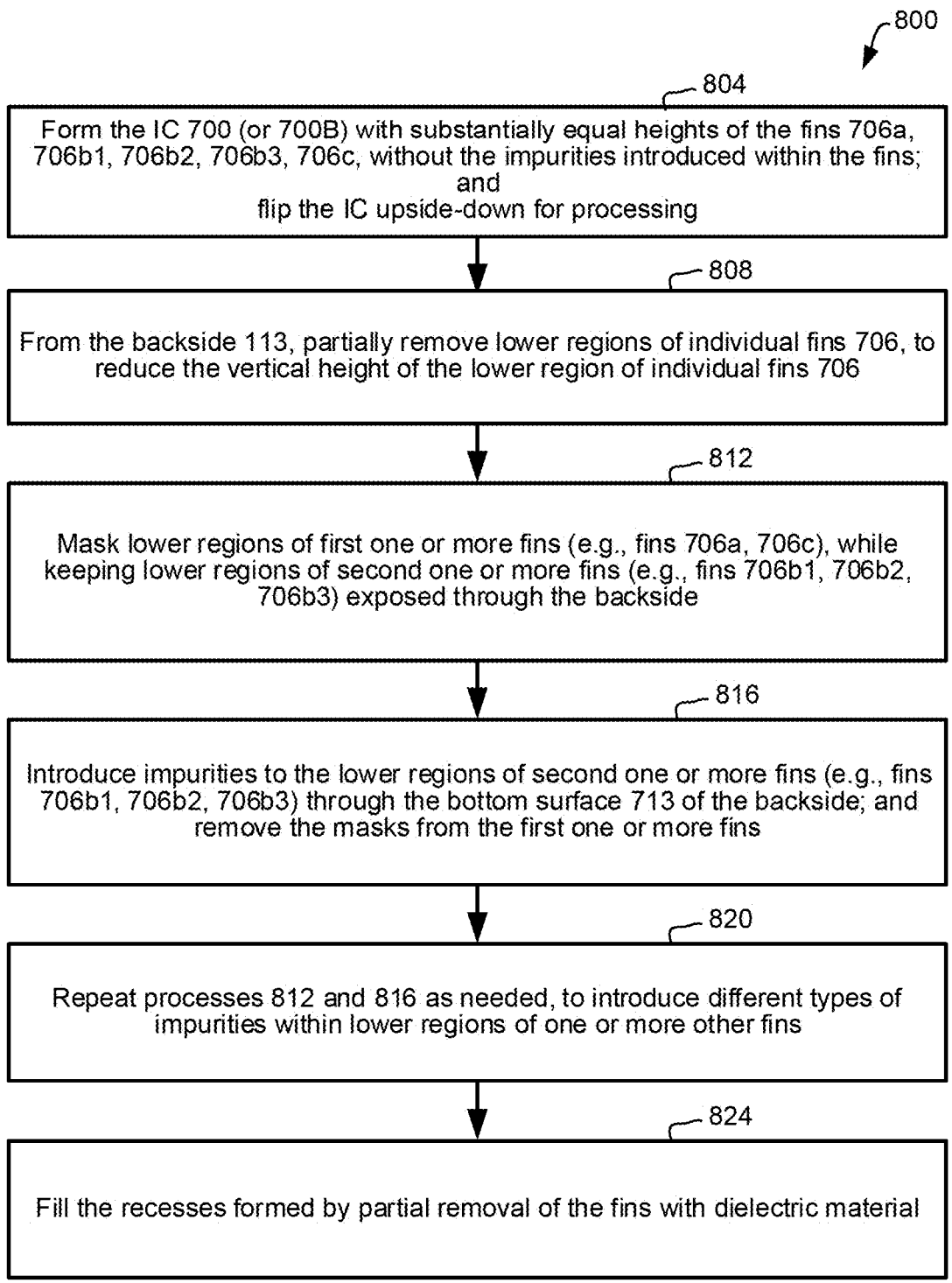
FIG. 8 illustrates a flowchart depicting a method of forming an IC (such as the IC of FIGS. 7A and/or 7B) comprising a plurality of fins, with each fin comprising (i) a corresponding upper region and (ii) a corresponding lower region below the upper region, with a corresponding gate structure on at least top and side surfaces of the upper region, and wherein impurities are implanted at least in part in the lower regions on one or more fins through a bottom surface of a backside of the IC, in accordance with an embodiment of the present disclosure.

FIG. 8 illustrates a flowchart depicting a method 800 of forming an IC (such as the IC 700 or 700b of FIGS. 7A and 7B) comprising a plurality of fins 706, with each fin 706 comprising (i) a corresponding upper region 709 and (ii) a corresponding lower region 707 below the upper region 709, with a corresponding gate structure 103 on at least top and side surfaces of the upper region 709, and wherein impurities are implanted at least in part in the lower regions on one or more fins through a bottom surface 713 of a backside 113 of the IC 700, in accordance with an embodiment of the present disclosure. FIGS. 9A, 9B, 9C, 9D, 9E, 9F, and 9G illustrate various cross-sectional views of an IC (such as the IC 700 or 700B of FIG. 7A or 7B) in various stages of processing, in accordance with an embodiment of the present disclosure. FIGS. 8 and 9A-9G will be discussed in unison. The cross-sectional views of FIGS. 9A-9G are similar to that of FIG. 7A.

Figure 9A:
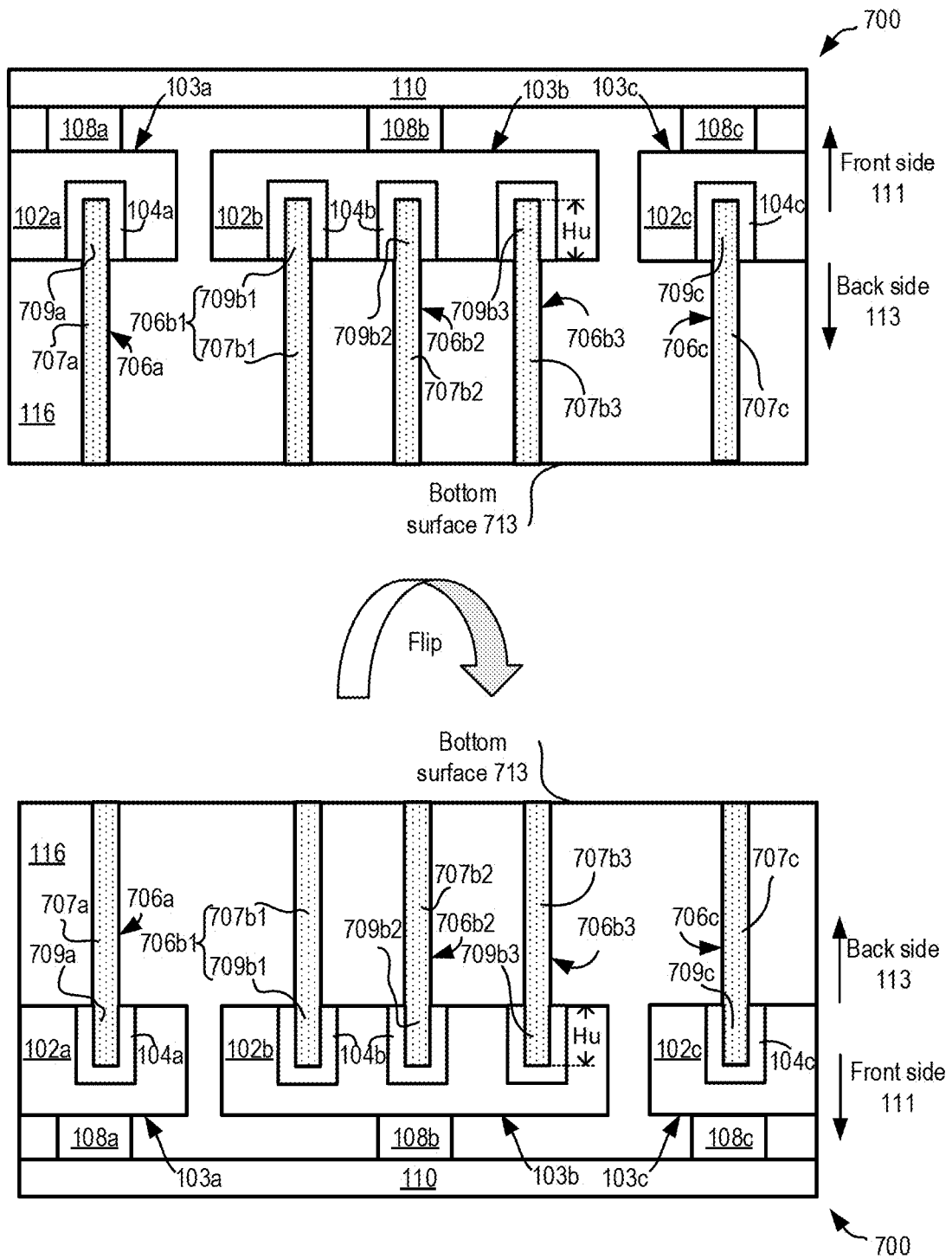
FIGS. 9A, 9B, 9C, 9D, 9E, 9F, and 9G illustrate various cross-sectional views of an IC (such as the IC of FIGS. 7A and/or 7B) in various stages of processing, in accordance with an embodiment of the present disclosure.

Referring to FIG. 8, the method 800 includes, at 804, forming the IC 700 (or 700B) with substantially equal heights of the fins 706a, 706b1, 706b2, 706b3, 706c, without the impurities introduced within the fins, as illustrated in top section of FIG. 9A. As illustrated, a bottom surface of the lower regions 707 of individual fins 706 are exposed through a bottom surface 713 of the backside 113. The formation of the IC at process 804 is performed using any appropriate process to form FinFETs having substantially equal fin height, as will be apparent in view of this disclosure.

Subsequently, also at 804, the IC is flipped for further processing, e.g., as also discussed with respect to process 204 of the method 200 of FIG. 2A, and as also illustrated in the bottom section of FIG. 9A.

Figure 9B:
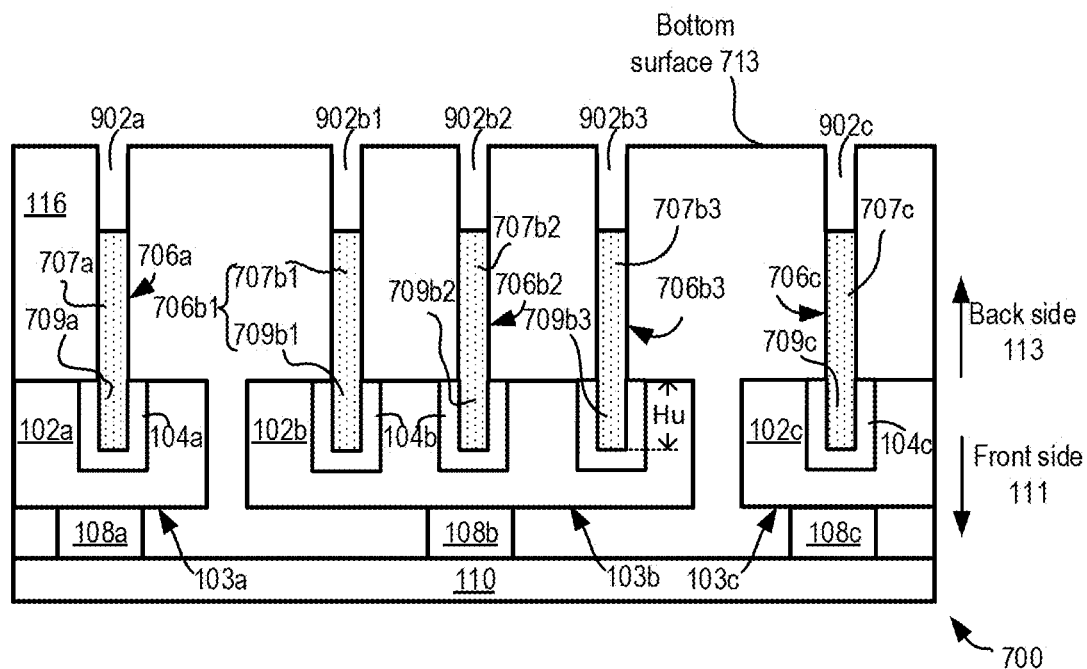

Referring again to FIG. 8, the method 800 then proceeds from 804 to 808, where from the backside 113 (e.g., through the bottom surface 713 of the backside 113), lower regions of individual fins 706 are partially removed, to reduce the vertical height of the lower regions of individual fins 706, thereby forming recesses 902, as illustrated in FIG. 9B (and as also discussed with respect to process 208 of the method 200 of FIG. 2A).

Figure 9C:
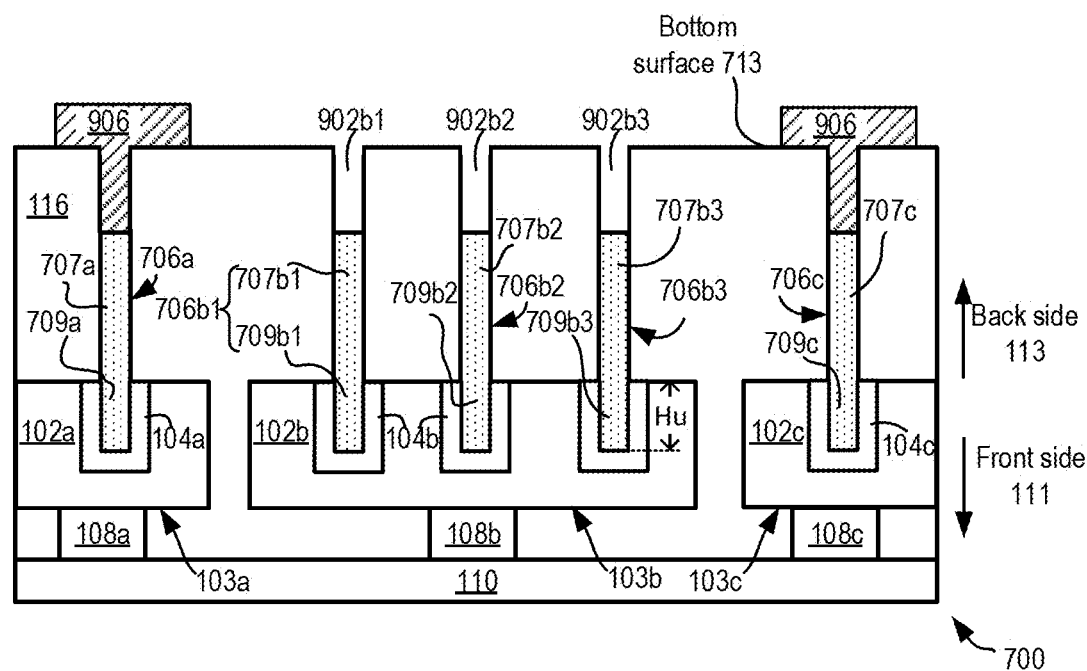

Referring again to FIG. 8, the method 800 then proceeds from 808 to 812, where lower regions of first one or more fins (e.g., fins 406a, 406c) are masked (e.g., using mask 906) through the bottom surface 713 of the backside 113, while keeping lower regions of second one or more fins (e.g., fins 406b1, 406b2, 406b3) exposed through the bottom surface of the backside 113, as illustrated in FIG. 9C and as also discussed with respect to process 212 of method 200 of FIG. 2.

Figure 9D:
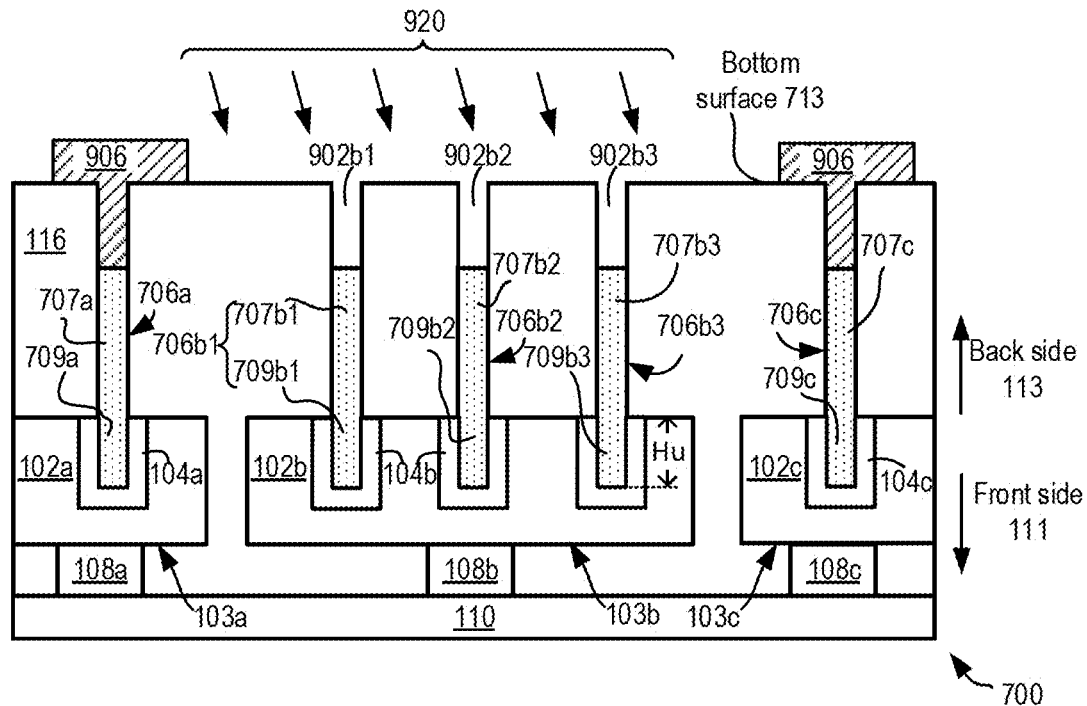

Referring again to FIG. 8, the method 800 then proceeds from 812 to 816, where through the bottom surface 713 of the backside 113, impurities are introduced in the lower regions 707b1, 707b2, and 707b3 of the fins 706b1, 706b2, and 706b3, respectively, symbolically illustrated using arrows 920 in FIG. 9D. As the fins 706a and 706c are protected by the masks 906, and impurities are not introduced in these fins.

In an example, an ion implantation process is employed for introducing the impurities. In an embodiment, the ion implantation process employs n-type dopants or p-type dopants. In an embodiment, the ion implantation has a normal incidence, i.e., the ion beam is perpendicular to the bottom surface 713. In an embodiment, the ion implantation has an angled or tilted incidence relative to the bottom surface 713. Indeed, a variety of different angles may be used to place dopant atoms in a desired location. In an example, plasma treatment of the bottom surface 713 may be employed, to introduce the impurities within the lower regions 707b1, 707b2, 707b3 through the recesses 902b1, 902b2, 902b3, respectively.

Figure 9E:
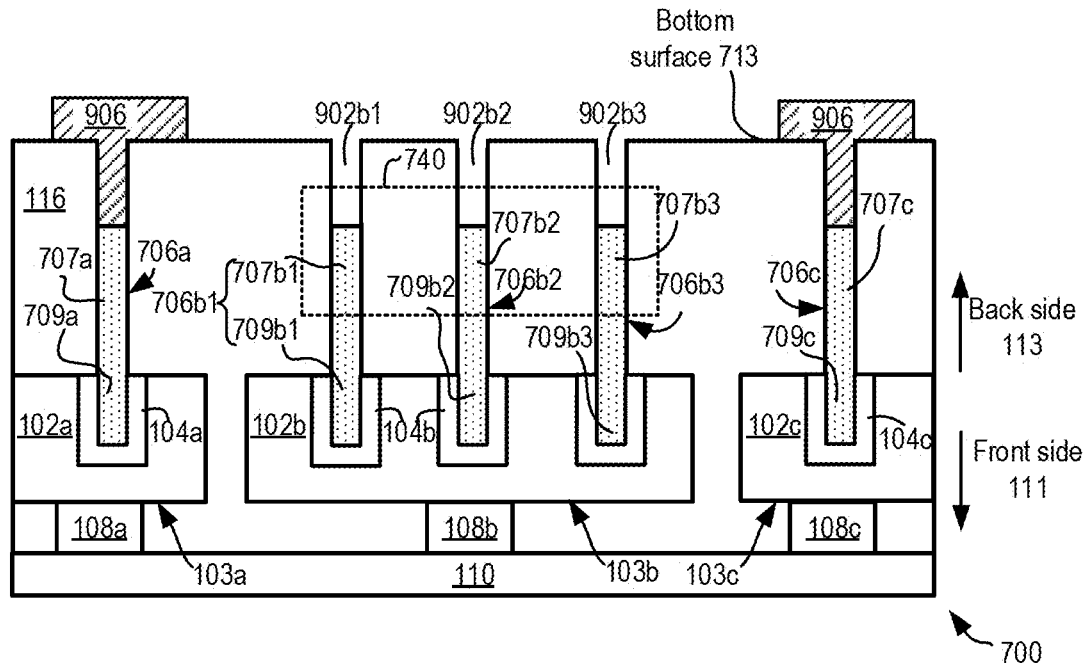
Figure 9F:
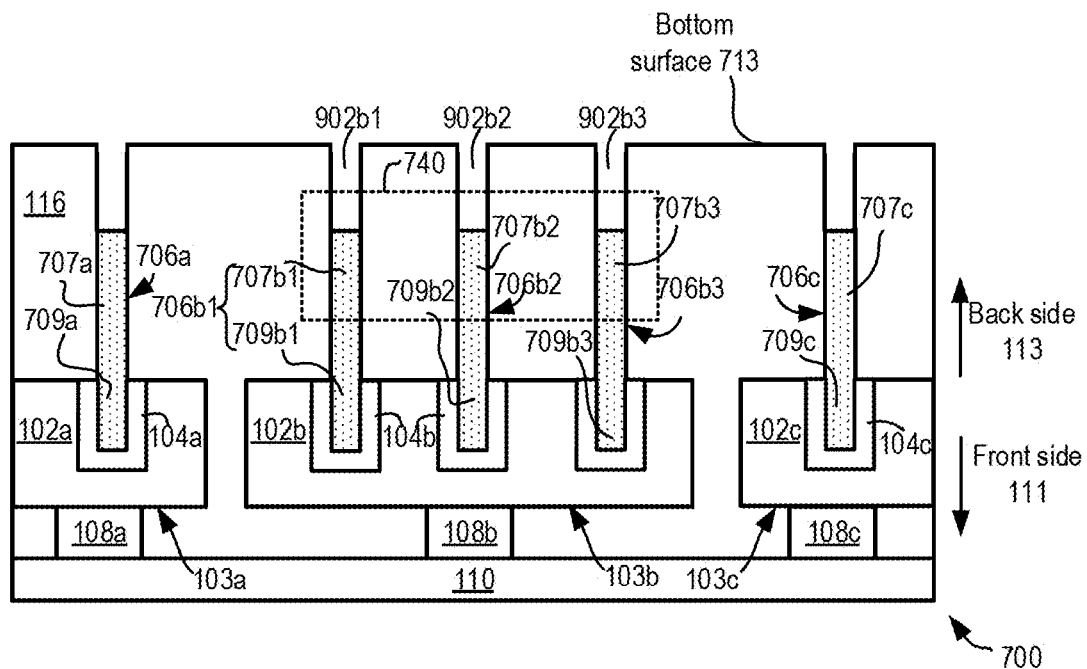

FIG. 9E illustrates an approximate boundary of a region 740 where the impurities are introduced. As discussed, the impurities will not be strictly restricted within the region 740 and some impurities will be outside the region 740. However, the dotted lines of the region 740 indicates an approximate boundary, within which the concentration or impurity profile of the impurities is the highest. Also, at process 816 of the method 800, the masks 906 from the first one or more fins 706a and 706c are removed, as illustrated in FIG. 9F.

Referring again to FIG. 8, the method 800 then proceeds from 816 to 820, where the processes 812 and 816 are repeated as needed, to introduce different types of impurities within lower regions of one or more other fins. Merely as an example, processes 812 and 816 may be used to introduce p-type impurity in the lower regions 707b1, 707b2, and 707b3 of the fins 706b1, 706b2, and 706b3, respectively. During the process 820, n-type impurity may be introduced, for example, in lower regions of one or more adjacent or neighboring fins.

Figure 9G:
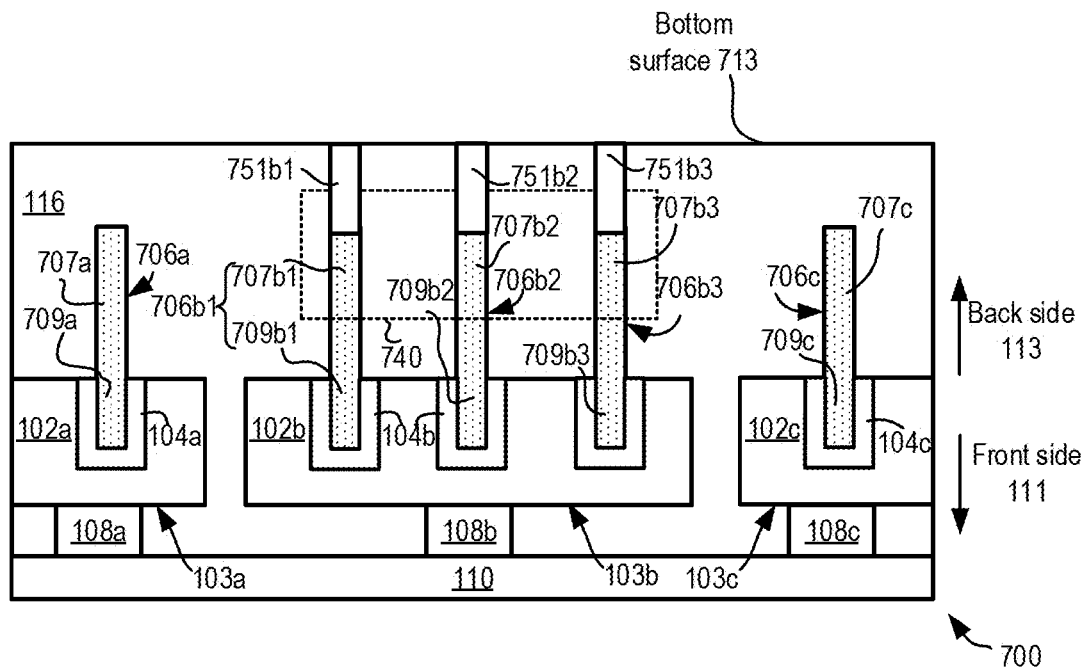

Referring again to FIG. 8, the method 800 then proceeds from 820 to 824, where the recesses 902 formed by partial removal of the fins are filed with dielectric material, to form the layers 751b1, 751b2, 751b3, as illustrated in FIG. 9G. As previously discussed herein, the layers 751b1, 751b2, 751b3 are formed subsequent to the introduction of the impurities, and hence, the layers 751b1, 751b2, 751b3 are substantially free of the impurities, in an example. In an example, the layers 751b1, 751b2, 751b3 are formed subsequent to a formation of the ILD 116, there may be interfaces (e.g., seam or grain boundary) along boundaries of the layers 751b1, 751b2, 751b3 and the ILD 116.

Note that the processes in method 800 are shown in a particular order for ease of description. However, one or more of the processes may be performed in a different order or may not be performed at all (and thus be optional), in accordance with some embodiments. Numerous variations on method 800 and the techniques described herein will be apparent in light of this disclosure.

Figure 10A:
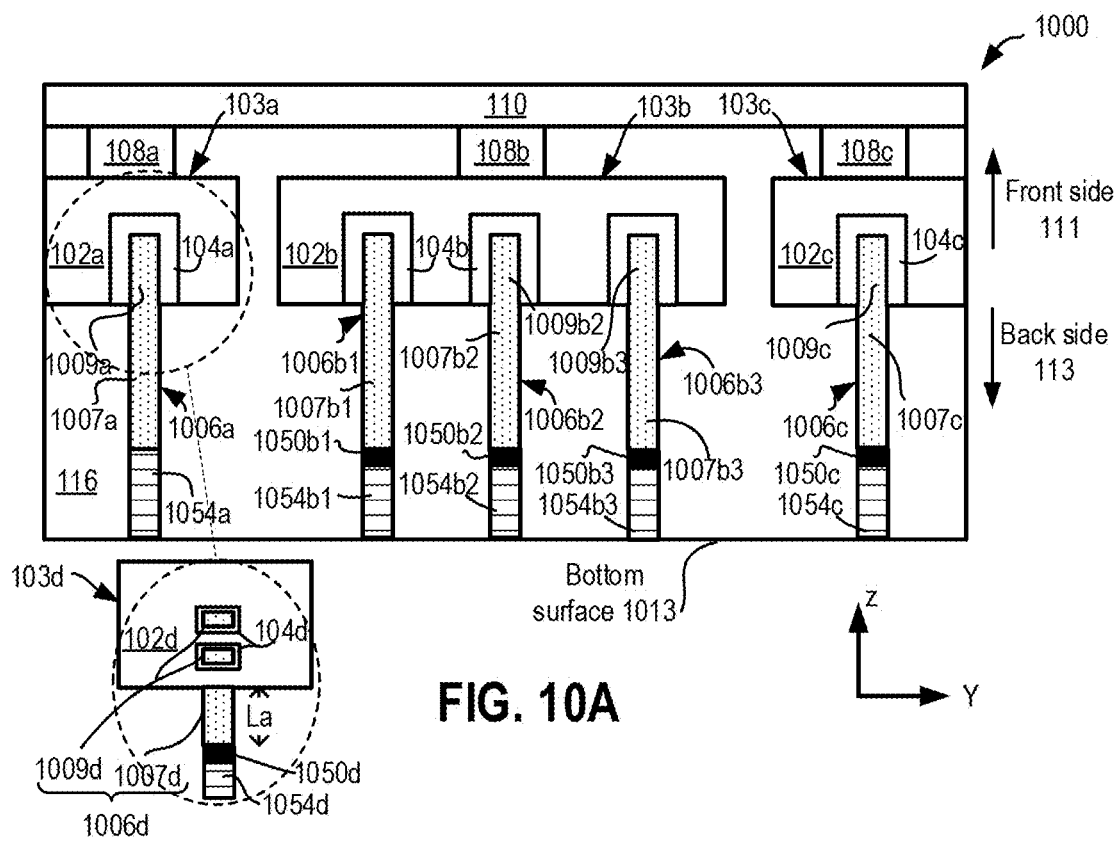
FIG. 10A illustrates a cross-sectional view of an IC comprising a plurality of fins, with each fin comprising (i) a corresponding upper region and (ii) a corresponding lower region below the upper region, with a corresponding gate structure on at least top and side surfaces of the upper region, wherein a first dielectric material is below first one or more fins, wherein a second dielectric material is (i) below second one or more fins and (ii) also below the first dielectric material, and wherein the first dielectric material is structurally and/or compositionally different from the second dielectric material, in accordance with an embodiment of the present disclosure.

FIG. 10A illustrates a cross-sectional view of an IC 1000 comprising a plurality of fins 1006, with each fin 1006 comprising (i) a corresponding upper region 1009 and (ii) a corresponding lower region 1007 below the upper region 1009, with a corresponding gate structure 103 on at least top and side surfaces of the upper region 1009, wherein a first dielectric material is below first one or more fins (such as fins 106b1, 106b2, 106b3, 106c), wherein a second dielectric material is (i) below second one or more fins (such as fin 106a) and (ii) also below the first dielectric material, and wherein the first dielectric material is structurally and/or compositionally different from the second dielectric material, in accordance with an embodiment of the present disclosure.

Similar components in the ICs 100 and 1000 of FIGS. 1A and 10A, respectively, are labelled using the same label. For example, similar to the IC 100 of FIG. 1A, the IC 1000 of FIG. 10A comprises gate structures 103a, 103b, 103c, each gate structure 103 comprising gate electrode 102 and gate dielectric 104, and a corresponding gate contact 108. Furthermore, an upper region 1009 of a fin 1006 is laterally between a corresponding source region and a corresponding drain region, e.g., as discussed with respect to FIG. 1B. Discussion about various components of the IC 100 of FIGS. 1A and 1B, unless otherwise mentioned or is contradictory in nature, is also applicable to the IC 1000 of FIG. 10A.

As illustrated in FIG. 10A, for each of the fins 1006b1, 1006b2, 1006b3, and 1006c, a layer 1050 is below and on a bottom surface of a corresponding lower region 1007 of the fin. For example, a layer 1050b1 is below and on a bottom surface of the lower region 1007b1 of the fin 1006b1, a layer 1050b2 is below and on a bottom surface of the lower region 1007b2 of the fin 1006b2, a layer 1050b3 is below and on a bottom surface of the lower region 1007b3 of the fin 1006b3, and a layer 1050c is below and on a bottom surface of the lower region 1007c of the fin 1006c. Note that the layer 1050 is absent below and on a bottom surface of the lower region 1007a of the fin 1006a. In an example, the layers 1050b1, 1050b2, 1050b3, and 1050c comprise a compositionally and structurally similar dielectric material, as will be discussed herein in turn.

A layer 1054a is below and on a bottom surface of the lower region 1007a of the fin 1006a. Also, in the example of FIG. 10A, a layer 1054b1 is below the layer 1050b1, a layer 1054b2 is below the layer 1050b2, a layer 1054b3 is below the layer 1050b3, and a layer 1054c is below the layer 1050c. In an example, the layers 1054a, 1054b1, 1054b2, 1054b3, and 1054c comprise a compositionally and structurally similar dielectric material.

In one embodiment, the dielectric material of the layers 1050b1, 1050b2, 1050b3, and 1050c (generally referred to herein as layers 1050) are compositionally different from the dielectric material of the layers 1054a, 1054b1, 1054b2, 1054b3, and 1054c (generally referred to herein as layers 1054). For example, each of layers 1050 and 1054 may comprise an oxide, a nitride, a carbide, an oxycarbide, an oxynitride, an oxycarbonitride, or another appropriate dielectric material. In an example, the layers 1050 are compositionally different from the layers 1054. Merely as an example, the layers 1050 may comprise aluminum oxide, and the layers 1054 comprise silicon dioxide or silicon nitride, although the layers 1050 and 1054 may comprise other combinations of compositionally different dielectric materials.

In one embodiment, instead of or in addition to being compositionally different, the dielectric material of the layers 1050 are structurally different from the dielectric material of the layers 1054. For example, the layers 1050 may be deposited using a first type of deposition process, and the layers 1054 may be deposited using a second type of deposition process, where the first and second types are two different types of deposition process. Merely as an example, one of the layers 1050 or 1054 may be formed using one of chemical vapor deposition (CVD), atomic layer deposition (ALD), physical vapor deposition (PVD), and the other of the layers 1050 or 1054 may be formed using another of CVD, ALD, PVD, merely as an example. Due to the different deposition process used, a structure or quality of the dielectric material of the layers 1050 may be different from another structure or quality of the dielectric material of the layers 1050.

Thus, as discussed, the dielectric material of the layers 1050 are compositionally and/or structurally different from the dielectric material of the layers 1054. Due to the compositional and/or structural difference between the layers 1050 and 1054, an interface between a layer 1050 and a bottom surface of a corresponding fin would have different properties compared to another interface between a layer 1050 and another bottom surface of a corresponding fin. In an example, this difference in the fin-dielectric material interface can be used to tune one or more characteristics of the fin and a transistor device comprising the fin. For example, the fin-dielectric material interface is controlled, e.g., to tune a threshold voltage, a leakage current, and/or a speed of the transistor device. As an example, the threshold voltage Vt of a transistor can be tuned up to 100 mV, by modulating the dielectric material below the corresponding fin.

For example, assume that the layers 1050 comprise aluminum oxide and the layers 1054 comprise silicon dioxide. Accordingly, a PMOS transistor with aluminum oxide layer 1050 below and on bottom surface of the corresponding fin(s) is relatively faster, and an NMOS transistor with aluminum oxide layer 1050 below the corresponding fin(s) is relatively slower. A PMOS transistor or an NMOS transistor with silicon dioxide layer 1054 below and on bottom surface of the corresponding fin(s) has a relatively medium speed.

In the example of FIG. 10A, each of the layers 1050 is relatively short (e.g., with vertical or Z direction height being relatively small, compared to a vertical or Z direction height of the layer 1054). For example, the height of each layer 1050 may be in the range of 2-300 nm (or in any subrange thereof, such as between 2-10, 2-20, 2-50, 2-100, 2-200, 4-20, 4-50, 4-100, 4-200, 10-100, 10-200, 10-400, 50-100, or 200-300 nm), for example.

Note that the discussion associated with the interface between a sub-fin region and a dielectric material underneath may also be applied to a gate-all-around configuration as well. For example, as illustrated in the dashed circle of FIG. 10A, a gate-all-around configuration is shown, in which gate dielectric 104d wraps around nanoribbons of the upper region 1009d of fin 1006d, and gate electrode 104d wraps around the nanoribbons as well and otherwise fills the gate trench. As can be further seen, lower region 1007d extends below upper region 1009d, for a distance La. In an example and as discussed with respect to fins 1007b1, 1007b2, and 1007b3, the layer 1050d is below the lower region 1007d, and the layer 1054d is below the layer 1050d. In an alternate example and as discussed with respect to fin 1007a, the layer 1054d is below the lower region 1007d.

Figure 10B:
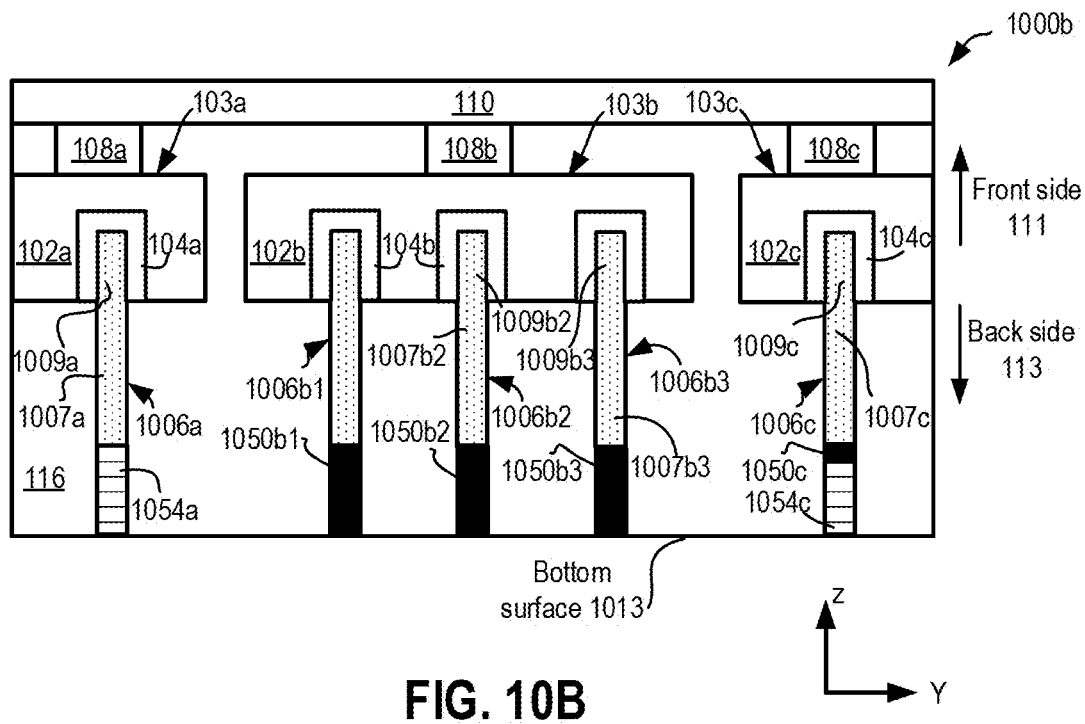
FIG. 10B illustrates a cross-sectional view of an IC comprising a plurality of fins, with each fin comprising (i) a corresponding upper region and (ii) a corresponding lower region below the upper region, with a corresponding gate structure on at least top and side surfaces of the upper region, wherein a first dielectric material is below first one or more fins, wherein a second dielectric material is (i) below second one or more fins and (ii) not below the first dielectric material, and wherein the first dielectric material is structurally and/or compositionally different from the second dielectric material, in accordance with an embodiment of the present disclosure.

In an example and as illustrated in FIG. 10B, the layer 1050 may extend all the way to the bottom surface 1013, without the layer 1054 being below the layer 1050. FIG. 10B illustrates a cross-sectional view of an IC 1000b comprising a plurality of fins 1006, with each fin 1006 comprising (i) a corresponding upper region 1009 and (ii) a corresponding lower region 1007 below the upper region 1009, with a corresponding gate structure 103 on at least top and side surfaces of the upper region 1009, wherein a first dielectric material is below first one or more fins (such as fins 106b1, 106b2, 106b3, 106c), wherein a second dielectric material is (i) below second one or more fins (such as fin 106a) and (ii) not below the first dielectric material, and wherein the first dielectric material is structurally and/or compositionally different from the second dielectric material, in accordance with an embodiment of the present disclosure.

Thus, the IC 1000b of FIG. 10B is at least in part similar to the IC 1000 of FIG. 10A. However, unlike the IC 1000 of FIG. 10A, in the IC 1000b of FIG. 10B, each of the layers 1050b1, 1050b2, 1050b3, and 1050c extend further, such that the layer 1054 is not below the layer 1050.

Figure 11:
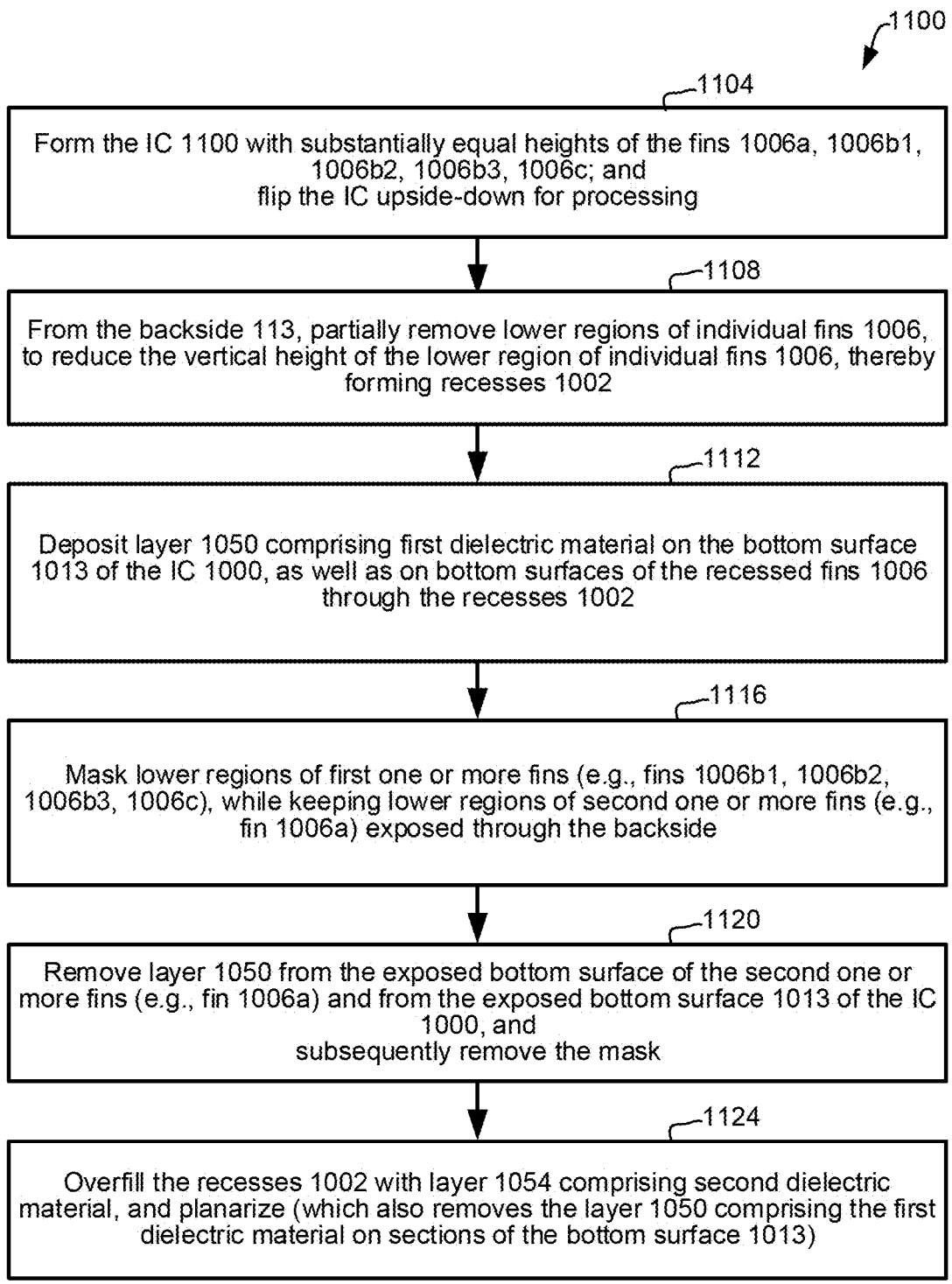
FIG. 11 illustrates a flowchart depicting a method of forming an IC (such as the IC FIG. 10A) comprising a plurality of fins, with each fin comprising (i) a corresponding upper region and (ii) a corresponding lower region below the upper region, with a corresponding gate structure on at least top and side surfaces of the upper region, wherein a first dielectric material is below first one or more fins, wherein a second dielectric material is (i) below second one or more fins and (ii) also below the first dielectric material, and wherein the first dielectric material is structurally and/or compositionally different from the second dielectric material, in accordance with an embodiment of the present disclosure.

FIG. 11 illustrates a flowchart depicting a method 1100 of forming an IC (such as the IC 1000 FIG. 10A) comprising a plurality of fins 1106, with each fin comprising (i) a corresponding upper region 1009 and (ii) a corresponding lower region 1007 below the upper region 1009, with a corresponding gate structure 103 on at least top and side surfaces of the upper region 1009, wherein a first dielectric material is below first one or more fins (such as fins 106b1, 106b2, 106b3, 106c), wherein a second dielectric material is (i) below second one or more fins (such as fin 106a) and (ii) also below the first dielectric material, and wherein the first dielectric material is structurally and/or compositionally different from the second dielectric material, in accordance with an embodiment of the present disclosure. FIGS. 12A, 12B, 12C, 12D, 12E, 12F, 12G, and 12H illustrate various cross-sectional views of an IC (such as the IC 1000 of FIG. 10A) in various stages of processing, in accordance with an embodiment of the present disclosure. FIGS. 11 and 12A-12H will be discussed in unison. The cross-sectional views of FIGS. 12A-12H are similar to that of FIG. 10A.

Figure 12A:
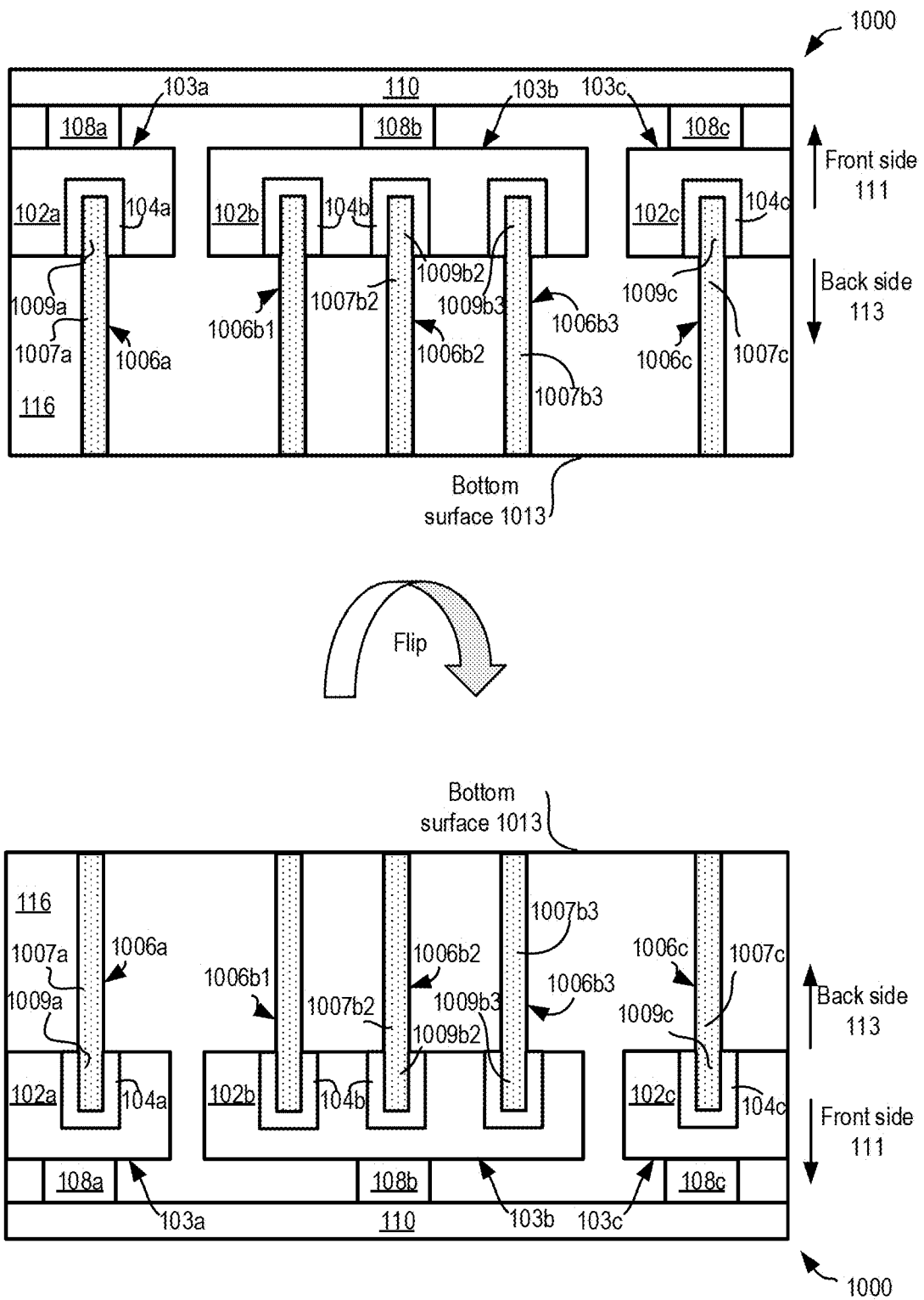
FIGS. 12A, 12B, 12C, 12D, 12E, 12F, 12G, and 12H illustrate various cross-sectional views of an IC (such as the IC of FIG. 10A) in various stages of processing, in accordance with an embodiment of the present disclosure.

Referring to FIG. 11, the method 1100 includes, at 1104, forming the IC 1000 with substantially equal heights of the fins 1006a, 1006b1, 1006b2, 1006b3, 1006c, as illustrated in top section of FIG. 12A. As illustrated, a bottom surface of the lower regions 1007 of individual fins 1006 are exposed through a bottom surface 1013 of the backside 113. The formation of the IC at process 1104 is performed using any appropriate process to form FinFETs having substantially equal fin height, as will be apparent in view of this disclosure.

Subsequently, also at 1104, the IC is flipped for further processing, e.g., as also discussed with respect to process 204 of the method 200 of FIG. 2A, and as also illustrated in the bottom section of FIG. 12A.

Figure 12B:
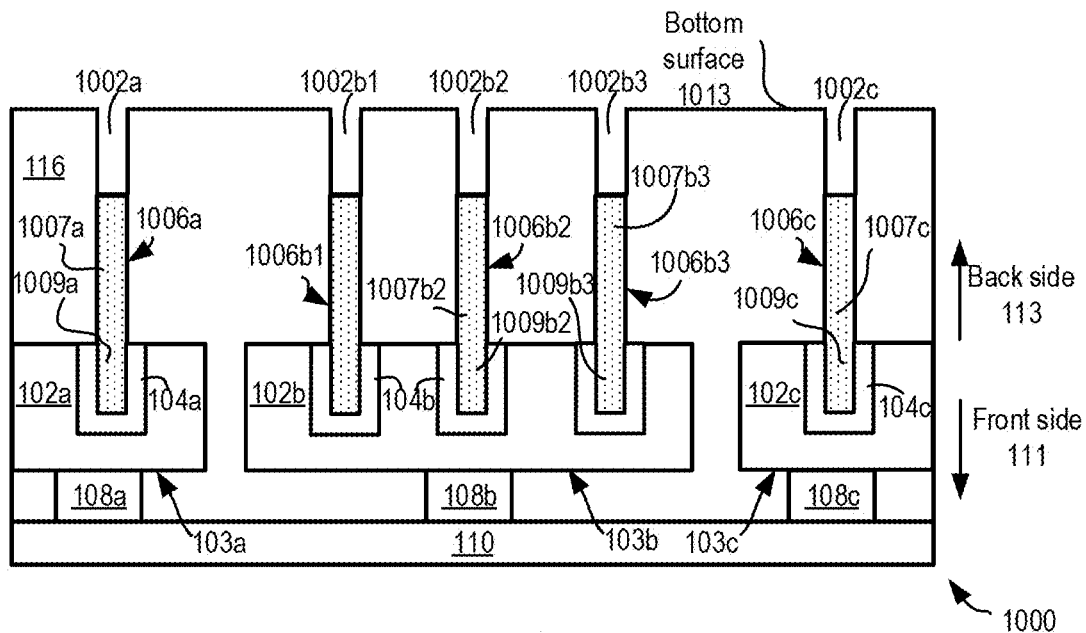

Referring again to FIG. 11, the method 1100 then proceeds from 1104 to 1108, where from the backside 113 (e.g., through the bottom surface 1013 of the backside 113), lower regions of individual fins 1006 are partially removed, to reduce the vertical height of the lower regions of individual fins 1006, thereby forming recesses 1002, as illustrated in FIG. 12B and as also discussed with respect to process 208 of the method 200 of FIG. 2A.

Figure 12C:
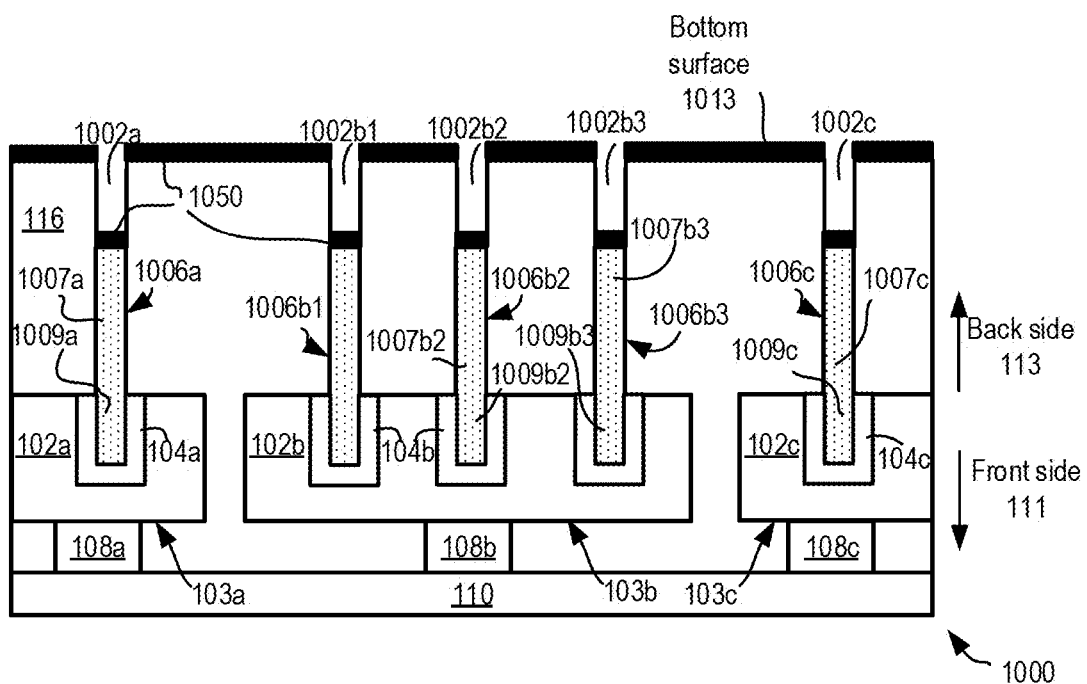

Referring again to FIG. 11, the method 1100 then proceeds from 1108 to 1112, where layer 1050 comprising first dielectric material is deposited (e.g., conformally deposited) on the bottom surface 1013 of the IC 1000, as well as on bottom surfaces of the recessed fins 1006 through the recesses 1002, as illustrated in FIG. 12C. Thus, the layer 1050 is on bottom surfaces of the lower regions 1007 of each fin 1006, as illustrated in FIG. 12C. In an example, the layer 1050 may be deposited using one of CVD, ALD, PVD, or another appropriate deposition technique.

Figure 12D:
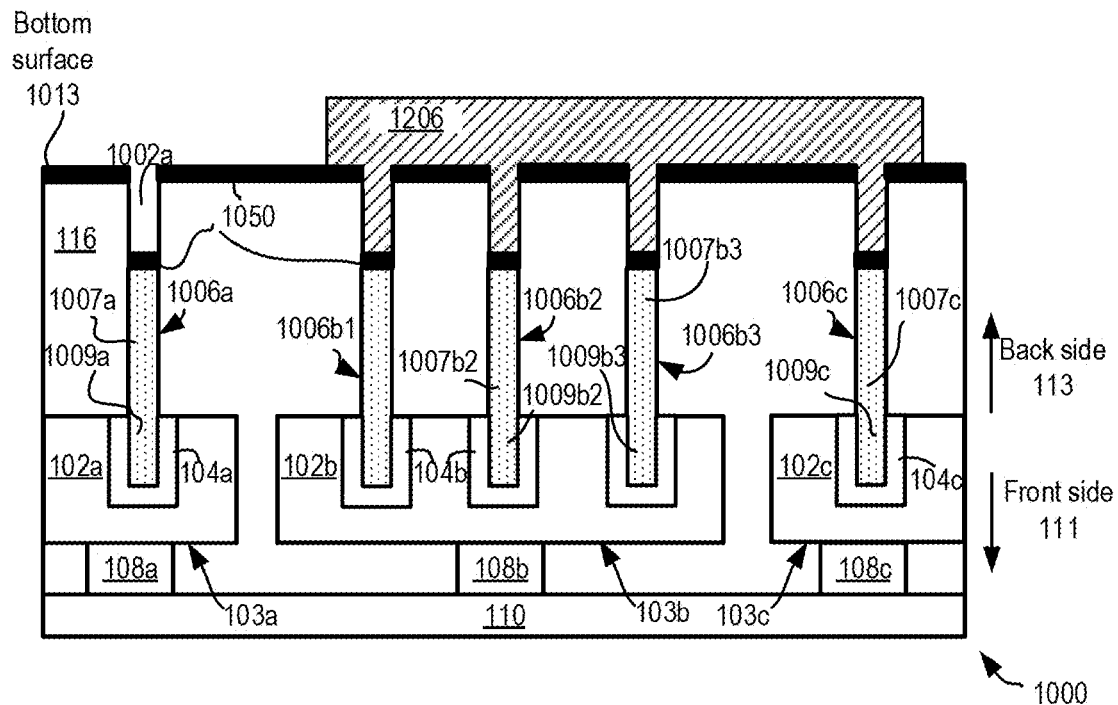

Referring again to FIG. 11, the method 1100 then proceeds from 1112 to 1116, where lower regions of first one or more fins (e.g., fins 1006b1, 1006b2, 1006b3, 1006c) are masked using a mask 1206, while keeping lower regions of second one or more fins (e.g., fin 1006a) exposed through the backside 113, as illustrated in FIG. 12D and as also discussed with respect to process 212 of the method 200 of FIG. 2.

Figure 12E:
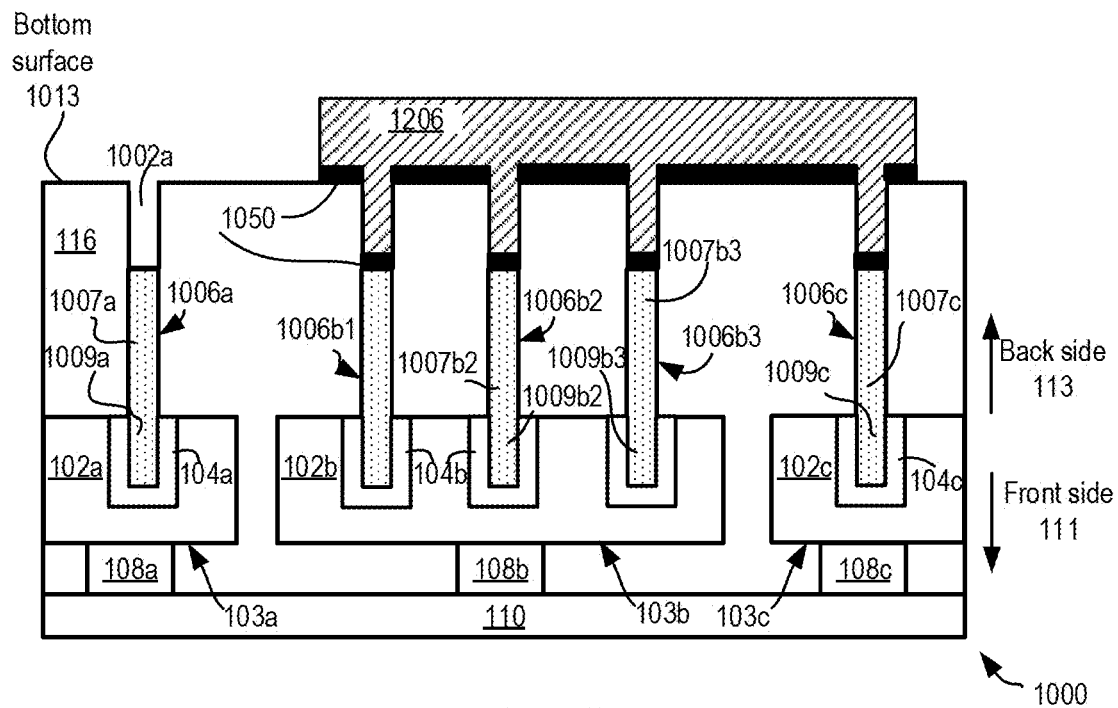
Figure 12F:
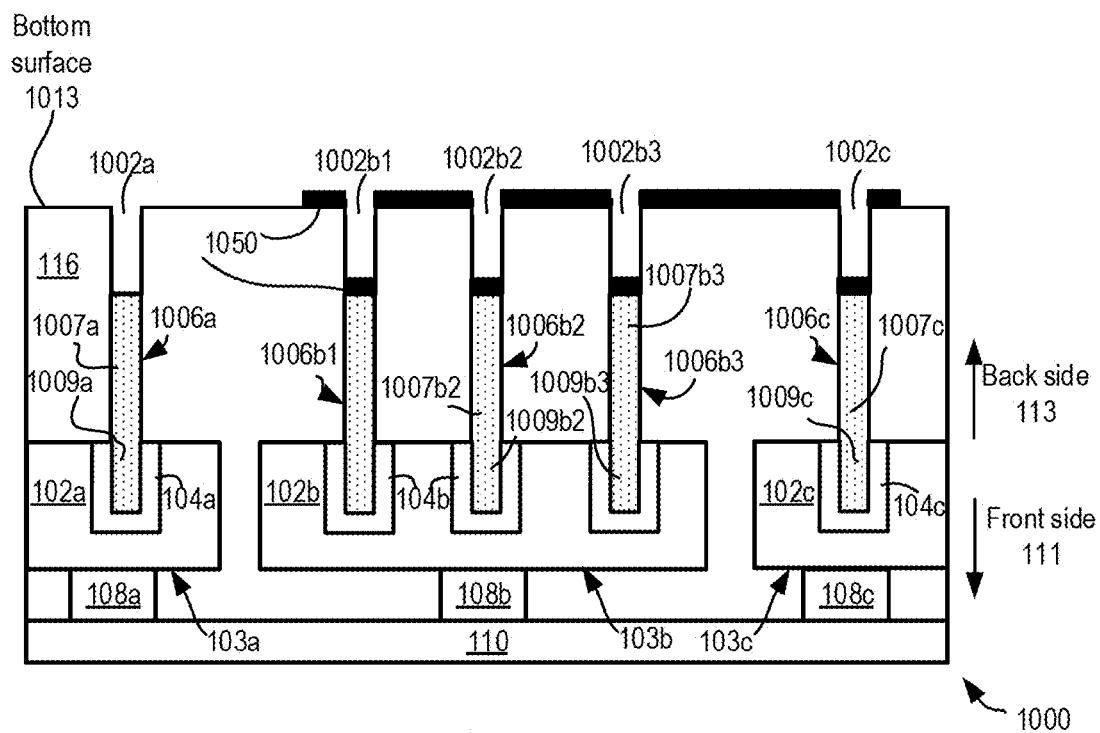

Referring again to FIG. 11, the method 1100 then proceeds from 1116 to 1120, where the layer 1050 is removed from the exposed bottom surface of the second one or more fins (e.g., fin 1006a) and from the exposed bottom surface 1013 of the IC 1000, as illustrated in FIG. 12E. An appropriate etching technique may be used, such as an isotropic etching technique. The mask 1206 protects the layer 1050 on the bottom surface of the first one or more fins (e.g., fin 1006b1, 1006b2, 1006b3, 1006c) from being removed. Also, at process 1120, the mask 1206 is subsequently removed, as illustrated in FIG. 12F, e.g., using an appropriate etching technique that selectively removes the mask 1206, without substantially etching the ILD 116 or the layer 1050.

Figure 12G:
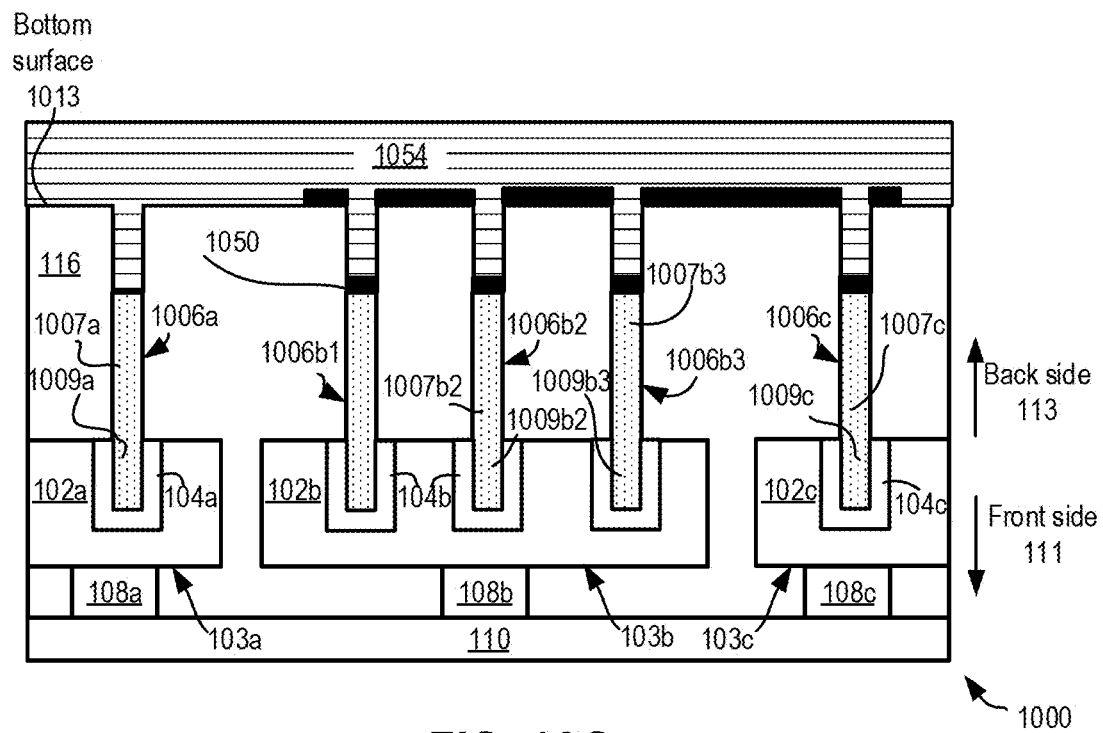

Referring again to FIG. 11, the method 1100 then proceeds from 1120 to 1124, where the recesses 1002 are overfilled with the layer 1054 comprising the second dielectric material, as illustrated in FIG. 12G. For example, the layer 1054 comprising the second dielectric material is deposited using one of CVD, ALD, PVD, or another appropriate deposition technique. As previously discussed herein, the first dielectric material of the layer 1050 is compositionally and/or structurally different from the second dielectric material of the layer 1054.

Figure 12H:
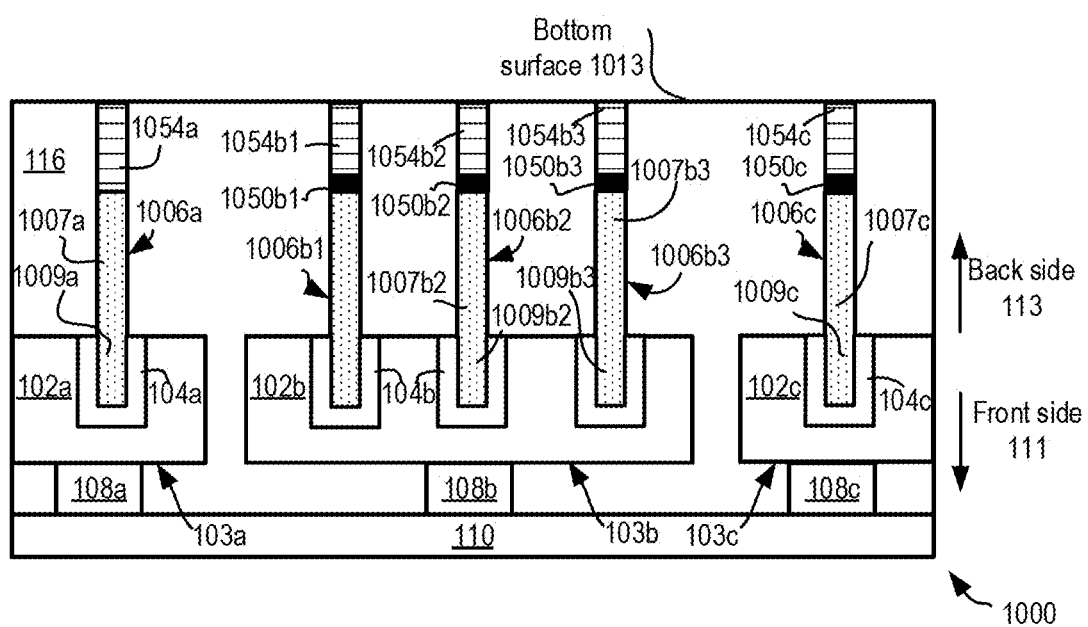

Furthermore, also at 1124, the layer 1054 is planarized using CMP or another appropriate planarization technique, which also removes the layer 1050 comprising the first dielectric material on sections of the bottom surface 1013, as illustrated in FIG. 12H. The IC 1000 of FIG. 12H is same as the IC 1000 of FIG. 10A, although the IC 1000 is flipped in FIG. 12H.

Note that the processes in method 1100 are shown in a particular order for ease of description. However, one or more of the processes may be performed in a different order or may not be performed at all (and thus be optional), in accordance with some embodiments. Numerous variations on method 1100 and the techniques described herein will be apparent in light of this disclosure.

Figure 13:
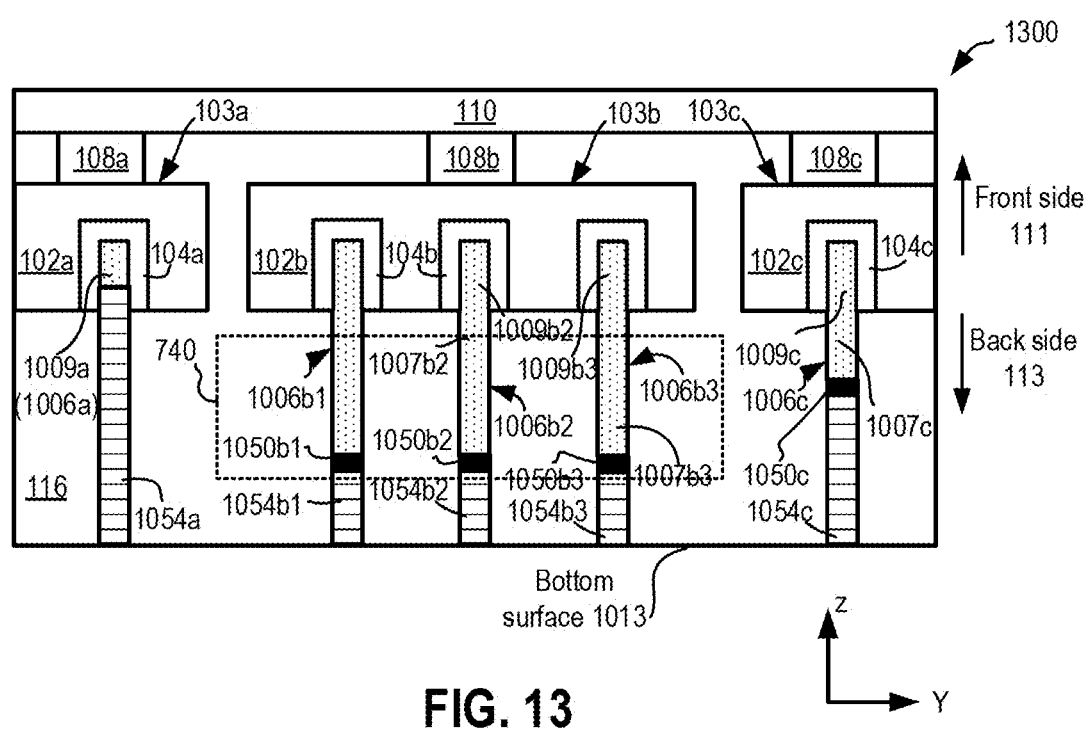
FIG. 13 illustrates an IC that combines various transistor characteristic tuning processes discussed herein in this disclosure, in accordance with some embodiments of the present disclosure.

FIG. 13 illustrates an IC 1300 that combines various transistor characteristic tuning processes discussed herein in this disclosure, in accordance with some embodiments of the present disclosure. For example, in the IC 1300 of FIG. 13, lower regions of one or more fins (e.g., fin 1006c) are trimmed or partially removed, e.g., as discussed with respect to FIGS. 1A-3G herein previously. Also, in the IC 1300 of FIG. 13, upper regions of one or more fins (e.g., fin 1006a) are trimmed or partially removed, e.g., as discussed with respect to FIGS. 4A-6G herein previously. Also, in the IC 1300 of FIG. 13, impurities are introduced primarily in the region depicted by the dotted region 704, e.g., as discussed with respect to FIGS. 7A-9G herein previously. Also, in the IC 1300 of FIG. 13, different fins have different layers of dielectric materials (e.g., layers 1050 or 1054) on respectively bottom surfaces, e.g., as discussed with respect to FIGS. 10A-12H herein previously. The structure of the IC 1300 will be apparent, based on the discussion herein with respect to FIGS. 1A-12H.

Example System

Figure 14:
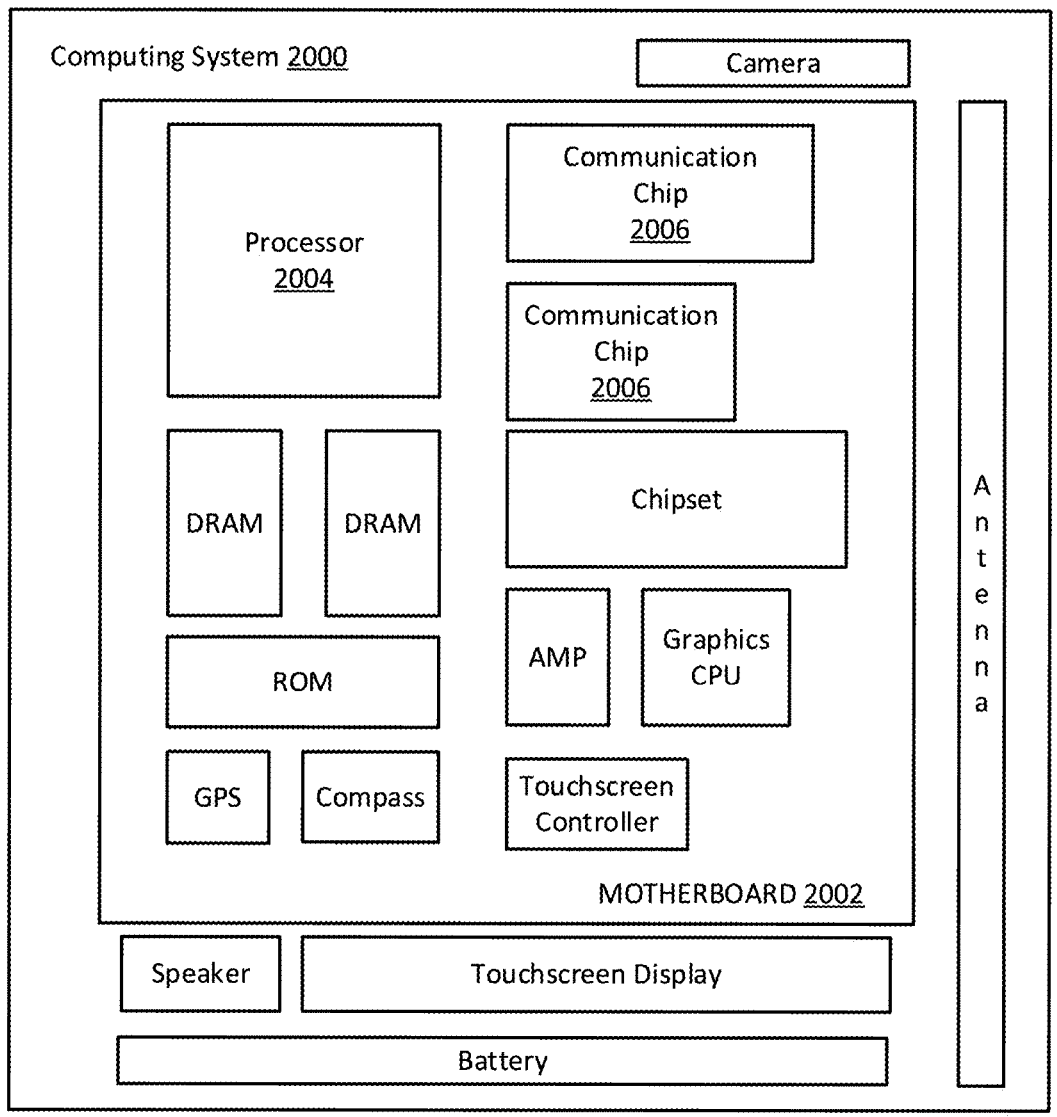
FIG. 14 illustrates a computing system implemented with integrated circuit structures formed using the techniques disclosed herein, in accordance with some embodiments of the present disclosure.

FIG. 14 illustrates a computing system 2000 implemented with integrated circuit structures formed using the techniques disclosed herein, in accordance with some embodiments of the present disclosure. As can be seen, the computing system 2000 houses a motherboard 2002. The motherboard 2002 may include a number of components, including, but not limited to, a processor 2004 and at least one communication chip 2006, each of which can be physically and electrically coupled to the motherboard 2002, or otherwise integrated therein. As will be appreciated, the motherboard 2002 may be, for example, any printed circuit board, whether a main board, a daughterboard mounted on a main board, or the only board of system 2000, etc.

Depending on its applications, computing system 2000 may include one or more other components that may or may not be physically and electrically coupled to the motherboard 2002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 2000 may include one or more integrated circuit structures or devices formed using the disclosed techniques in accordance with an example embodiment. In some embodiments, multiple functions can be integrated into one or more chips (e.g., for instance, note that the communication chip 2006 can be part of or otherwise integrated into the processor 2004).

The communication chip 2006 enables wireless communications for the transfer of data to and from the computing system 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 2000 may include a plurality of communication chips 2006. For instance, a first communication chip 2006 may be dedicated to shorter range wireless communications such as Wi-Fi and Bluetooth and a second communication chip 2006 may be dedicated to longer range wireless communications such as GPS, EDGE, GPRS, CDMA, WiMAX, LTE, Ev-DO, and others.

The processor 2004 of the computing system 2000 includes an integrated circuit die packaged within the processor 2004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 2006 also may include an integrated circuit die packaged within the communication chip 2006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 2004 (e.g., where functionality of any chips 2006 is integrated into processor 2004, rather than having separate communication chips). Further note that processor 2004 may be a chip set having such wireless capability. In short, any number of processor 2004 and/or communication chips 2006 can be used. Likewise, any one chip or chip set can have multiple functions integrated therein.

In various implementations, the computing system 2000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following example pertain to further embodiments, from which numerous permutations and configurations will be apparent.

Example 1. An integrated circuit comprising: a first source region, a first drain region, a first fin comprising semiconductor material and having (i) a first upper region laterally between the first source region and the first drain region and (ii) a first lower region below the first upper region, and a first gate structure on at least top and side surfaces of the first upper region; and a second source region, a second drain region, a second fin comprising semiconductor material and having (i) a second upper region laterally between the second source region and the second drain region and (ii) a second lower region below the second upper region, and a second gate structure on at least top and side surfaces of the second upper region, wherein a first vertical height of the first lower region is different from a second vertical height of the second lower region by at least 2 nanometers (nm).

Example 2. The integrated circuit of example 1, wherein the first vertical height of the first lower region is different from the second vertical height of the second lower region by at least 4 nm.

Example 3. The integrated circuit of any one of examples 1-2, further comprising: a third source region and a third drain region; and a third fin comprising semiconductor material and having (i) a third upper region laterally between the third source region and the third drain region and (ii) a third lower region below the third upper region, wherein the first gate structure is on at least top and side surfaces of the third upper region, and wherein the first vertical height of the first lower region is within 1 nm of a third vertical height of the third lower region.

Example 4. The integrated circuit of any one of examples 1-2, further comprising: a third source region, a third drain region, a third fin comprising semiconductor material and having (i) a third upper region laterally between the third source region and the third drain region and (ii) a third lower region below the third upper region, and a third gate structure on at least top and side surfaces of the third upper region, wherein a third vertical height of the third lower region is different from each of the first and second vertical heights by at least 2 nm.

Example 5. The integrated circuit of any one of examples 1-4, further comprising dielectric material, wherein each of the first and second lower regions extends within the dielectric material.

Example 6. The integrated circuit of any one of examples 1-5, wherein a vertical height of the first upper region is within 1 nm of a vertical height of the second upper region.

Example 7. The integrated circuit of any one of examples 1-6, wherein a bottommost surface of the first gate structure is co-planar with a bottommost surface of the second gate structure.

Example 8. The integrated circuit of any one of examples 1-7, wherein a topmost surface of the first gate structure is substantially co-planar with a topmost surface of the second gate structure.

Example 9. The integrated circuit of any one of examples 1-8, wherein a top surface of the first upper region of the first fin is substantially co-planar with a top surface of the second upper region of the second fin.

Example 10. The integrated circuit of any one of examples 1-9, wherein a junction between the first upper region and the first lower region is substantially coplanar with a junction between the second upper region and the second lower region.

Example 11. The integrated circuit of any one of examples 1-10, wherein a first bottom surface of the first lower region is within a first horizontal plane, a second bottom surface of the second lower region is within a second horizontal plane, and a vertical distance between the first and second horizontal planes is at least 2 nm.

Example 12. The integrated circuit of any one of examples 1-11, wherein a vertical height of the first fin is different from a vertical height of the second fin by at least 2 nm.

Example 13. The integrated circuit of any one of examples 1-12, wherein an average horizontal width of the first fin is within 1 nm of an average horizontal width of the second fin.

Example 14. The integrated circuit of any one of examples 1-13, wherein the first upper region is an active region of the first fin that selectively transmits current between the first source region and the first drain region, and wherein the first lower region is a sub-fin region of the first fin.

Example 15. The integrated circuit of any one of examples 1-14, wherein the first upper region forms a channel region of the first fin, and wherein the first lower region is a sub-fin region of the first fin.

Example 15a. The integrated circuit of any one of examples 1-15, wherein the first upper region comprises a first nanoribbon, and the first gate structure wraps around the first upper region, and wherein the second upper region comprises a second nanoribbon, and the second gate structure wraps around the second upper region.

Example 16. An integrated circuit comprising: a first fin, and a first gate structure on at least top and side surfaces of a first upper region of the first fin; and a second fin adjacent to the first fin, and a second gate structure on at least top and side surfaces of a second upper region of the second fin, wherein top surfaces of the first and second fins are substantially coplanar, and wherein a vertical height of the first fin is different from a vertical height of the second fin by at least 2 nanometers (nm).

Example 17. The integrated circuit of example 16, wherein a vertical height of the first upper region of the first fin is within 1 nm of a vertical height of the second upper region of the second fin.

Example 18. The integrated circuit of any one of examples 16-17, wherein: a first lower region of the first fin is below the first upper region of the first fin; a second lower region of the second fin is below the second upper region of the second fin; and a vertical height of the first lower region of the first fin is different from a vertical height of the second lower region of the second fin by at least 2 nm.

Example 19. The integrated circuit of any one of examples 16-18, wherein a bottom surface of the first fin is within a first horizontal plane, a bottom surface of the second fin is within a second horizontal plane, and a vertical distance between the first and second horizontal planes is at least 2 nm.

Example 20. The integrated circuit of any one of examples 16-19, wherein: the first fin has (i) the first upper region, and (ii) a first lower region below the first upper region, wherein the first gate structure is not on side surfaces of the first lower region; and the second fin has the second upper region, and lacks any corresponding lower region below the second upper region, such that the second gate structure is on an entire side surface along a length of the second fin.

Example 21. The integrated circuit of example 20, wherein a vertical height of the first upper region is more than a vertical height of the second upper region by at least 2 nm.

Example 22. The integrated circuit of any one of examples 20-21, further comprising: a layer comprising dielectric material below the second upper region, wherein the second gate structure is on side surfaces of the layer comprising dielectric material.

Example 23. The integrated circuit of any one of examples 20-22, wherein the first gate structure and the second gate structure share a gate electrode that is above both the first and second fins.

Example 24. The integrated circuit of any one of examples 16-23, wherein a bottommost surface of the second gate structure is below a bottommost surface of the second fin.

Example 25. The integrated circuit of any one of examples 16-24, wherein: the first fin has (i) the first upper region, and (ii) a first sub-fin region below the first upper region, wherein the first gate structure is not on side surfaces of the first sub-fin region; and the second fin lacks any sub-fin region.

Example 26. The integrated circuit of any one of examples 16-25, wherein the vertical height of the first fin is different from the vertical height of the second fin by at least 4 nm.

Example 27. The integrated circuit of any one of examples 16-26, wherein the second fin is adjacent to the first fin, with no intervening fins between the first and second fins.

Example 28. The integrated circuit of any one of examples 16-27, wherein the first gate structure and the second gate structure share a gate electrode that is above both the first and second fins, and the first and second fins are part of a same transistor device.

Example 28a. The integrated circuit of any one of examples 16-28, wherein the first upper region of the first fin comprises a nanoribbon, with the first gate structure wrapping around the nanoribbon, and wherein the vertical height of the first fin comprises a combination of a vertical height of the nanoribbon and a vertical height of a sub-fin area below the nanoribbon.

Example 28b. The integrated circuit of any one of examples 16-28, wherein: the first upper region of the first fin comprises a first nanoribbon, with the first gate structure wrapping around the first nanoribbon, and the vertical height of the first fin comprises a combination of a vertical height of the first nanoribbon and a vertical height of a first sub-fin area below the first nanoribbon; and the second upper region of the second fin comprises a second nanoribbon, with the second gate structure wrapping around the second nanoribbon, and the vertical height of the second fin comprises a combination of a vertical height of the second nanoribbon and a vertical height of a second sub-fin area below the second nanoribbon.

Example 29. An integrated circuit comprising: a first fin field-effect transistor (FinFET) having a first fin, and a first gate stack on a top surface and at least a portion of side surfaces of the first fin; and a second FinFET having a second fin, and a second gate stack on a top surface and at least a portion of side surfaces of the second fin, wherein top surfaces of the first and second fins are coplanar, and wherein at least a section of a bottom surface of the first fin is within a first horizontal plane, at least a section of a bottom surface of the second fin is within a second horizontal plane, and a vertical distance between the first and second horizontal planes is at least 2 nm.

Example 30. The integrated circuit of example 29, wherein each of the first and second gate stacks comprise: a corresponding gate electrode; and gate dielectric material between the corresponding electrode and the corresponding fin, wherein a bottommost surface of the first gate stack is co-planar with a bottommost surface of the second gate stack.

Example 31. The integrated circuit of any one of examples 29-30, wherein a vertical height of the first fin is different from a vertical height of the second fin by at least 2 nm.

Example 32. The integrated circuit of any one of examples 29-31, wherein: the first gate stack is on an upper portion of a side surface of the first fin, and is not on a lower portion of the side surface of the first fin; and the second gate stack is on an entire side surface along a length of the second fin.

Example 33. The integrated circuit of any one of examples 29-32, wherein: the first gate stack is on an upper portion of a side surface of the first fin, and is not on a lower portion of the side surface of the first fin; and the first FinFET further has a third fin, with the second gate stack on a top surface and on an entire side surface along a length of the third fin.

Example 34. The integrated circuit of example 33, wherein the lower portion of the side surface of the first fin is a sub-fin region of the first fin, and wherein the third fin lacks a sub-fin region.

Example 35. The integrated circuit of any one of examples 33-34, further comprising: a layer of dielectric material below the third fin, wherein the second gate stack is on at least a portion of a side surface of the layer of dielectric material.

Example 36. The integrated circuit of any one of examples 33-35, wherein the first fin has a vertical height that is at least 2 nm greater than a vertical height of the third fin.

Example 37. The integrated circuit of any one of examples 29-36, wherein: the first fin has a first channel region, and a sub-fin region below the second channel region; and the second fin has a second channel region, and no sub-fin region below the second channel region.

Example 38. The integrated circuit of example 37, wherein the first channel region has a vertical height that is at least 2 nm greater than a vertical height of the second channel region.

Example 39. An integrated circuit comprising: a source region; a drain region; a fin comprising semiconductor material and having (i) an upper region laterally between the source region and the drain region and (ii) a lower region below the upper region; a gate structure on at least top and side surfaces of the upper region; and impurities within the fin, wherein an average concentration of the impurities within the lower region of the fin is at least 10% higher than an average concentration of the impurities within the upper region of the fin.

Example 40. The integrated circuit of example 39, further comprising: dielectric material below the gate structure, wherein the lower region of the fin extends within the dielectric material, wherein a first section of the dielectric material is directly below the lower region of the fin, and a second section of the dielectric material is laterally adjacent to the first section of the dielectric material, and wherein the impurities are also within the second section of the dielectric material, and the first section of the dielectric material is substantially free of the impurities.

Example 41. The integrated circuit of example 40, wherein an average horizontal width of the lower region of the fin is substantially equal to an average horizontal width of the first section of the dielectric material.

Example 42. The integrated circuit of any one of examples 39-41, wherein the average concentration of the impurities within the lower region of the fin is at least 40% higher than the average concentration of the impurities within the upper region of the fin.

Example 43. The integrated circuit of any one of examples 39-42, wherein the impurities are within the gate structure, wherein an average concentration of the impurities within the lower region of the fin is at least 10% higher than an average concentration of the impurities within the gate structure.

Example 44. A method of forming an integrated circuit, comprising: forming a fin comprising (i) an upper region and (ii) a lower region below the upper region, a source region and a drain region on two sides of the upper region of the fin, and a gate stack on at least top and side surfaces of the upper region of the fin, wherein the lower region of the fin extends through a layer comprising dielectric material; removing a bottommost section of the lower region of the fin through a bottom surface of the integrated circuit, without removing a topmost section of the lower region of the fin; and implanting impurities within the fin, through the bottom surface of the integrated circuit.

Example 45. The method of example 44, wherein removing the bottommost section of the lower region of the fin results in formation of a recess within the layer comprising the dielectric material, the recess below the topmost portion of the lower region of the fin.

Example 46. The method of example 45, wherein the layer is a first layer, the dielectric material is first dielectric material, and the method further comprises: subsequent to implanting impurities within the fin, depositing within the recess a second layer comprising second dielectric material.

Example 47. The method of example 46, wherein the second layer comprising the second dielectric material is substantially free of the impurities.

Example 48. The method of any one of examples 46-47, each of the first dielectric material and the second dielectric material comprises one or more of silicon, oxygen, nitrogen, or carbon.

Example 49. The method of any one of examples 46-48, wherein an interface is formed between a boundary of the first layer and the second layer.

Example 50. The method of example 49, wherein the interface is a seam or grain boundary.

Example 51. The method of any one of examples 46-50, wherein an average horizontal width of the lower region of the fin is substantially equal to an average horizontal width of the second layer.

Example 52. The method of any one of examples 49-51, wherein an average concentration of the impurities within the lower region of the fin is at least 10% higher than an average concentration of the impurities within the upper region of the fin.

Example 53. The method of any one of examples 49-52, wherein an average concentration of the impurities within the lower region of the fin is at least 20% higher than an average concentration of the impurities within the upper region of the fin.

Example 54. The method of any one of examples 49-53, wherein an average concentration of the impurities within the lower region of the fin is at least 20% higher than an average concentration of the impurities within the gate stack.

Example 55. An integrated circuit comprising: a first source region, a first drain region, a first fin, wherein at least a part of the first fin is laterally between the first source region and the first drain region; a second source region, a second drain region, a second fin, wherein at least a part of the second fin is laterally between the second source region and the second drain region, the second fin adjacent to the first fin; and a first dielectric material below and on a bottom surface of the first fin, and a second dielectric material below and on a bottom surface of the second fin, the second dielectric material one or both of compositionally and structurally different from the first material.

Example 56. The integrated circuit of example 55, wherein the second dielectric material is also below the first dielectric material.

Example 57. The integrated circuit of any one of examples 55-56, wherein a horizontal width of the first dielectric material below and on the bottom surface of the first fin is substantially equal to a horizontal width of the bottom surface of the first fin.

Example 58. The integrated circuit of any one of examples 55-57, wherein a horizontal width of the second dielectric material below and on the bottom surface of the second fin is substantially equal to a horizontal width of the bottom surface of the second fin.

Example 59. An integrated circuit comprising: a first ribbon fin field-effect transistor (ribbonFET) transistor having a first nanoribbon, and a first gate stack wrapped around the first nanoribbon; a second ribbonFET having a second nanoribbon, and a second gate stack wrapped around the second nanoribbon, wherein at least a section of a bottom surface of a sub-fin below the first nanoribbon is within a first horizontal plane, at least a section of a bottom surface of a sub-fin below the second nanoribbon is within a second horizontal plane, and a vertical distance between the first and second horizontal planes is at least 2 nm.

Example 60. The integrated circuit of example 59, wherein top surfaces of the first and second nanoribbons are coplanar.

Example 61. An integrated circuit comprising: a first source region, a first drain region, and a first nanoribbon laterally between the first source region and the first drain region; a second source region, a second drain region, a second nanoribbon laterally between the second source region and the second drain region, the second nanoribbon laterally adjacent to the first nanoribbon; a first dielectric material below and on a bottom surface of a sub-fin below the first nanoribbon; and a second dielectric material below and on a bottom surface of a sub-fin below the second nanoribbon, wherein the second dielectric material is one or both of compositionally and structurally different from the first material.

Example 62. The integrated circuit of example 61, wherein the second dielectric material is also below the first dielectric material.

Example 63. An integrated circuit comprising: a ribbon fin field-effect transistor (ribbonFET) transistor having a source region, a drain region, a nanoribbon laterally between the source region and the drain region, and a gate stack wrapped around the nanoribbon; and impurities within the nanoribbon and a sub-fin below the nanoribbon, wherein an average concentration of the impurities within the sub-fin is at least 10% higher than an average concentration of the impurities within the nanoribbon.

Example 64. The integrated circuit of example 63, further comprising: dielectric material below the gate stack, wherein the sub-fin extends within the dielectric material, wherein a first section of the dielectric material is directly below the sun-fin, and a second section of the dielectric material is laterally adjacent to the first section of the dielectric material, and wherein the impurities are also within the second section of the dielectric material, and the first section of the dielectric material is substantially free of the impurities.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
a first source region, a first drain region, a first fin comprising semiconductor material and having (i) a first upper region laterally between the first source region and the first drain region and (ii) a first lower region below the first upper region, and a first gate structure on at least top and side surfaces of the first upper region; and
a second source region, a second drain region, a second fin comprising semiconductor material and having (i) a second upper region laterally between the second source region and the second drain region and (ii) a second lower region below the second upper region, and a second gate structure on at least top and side surfaces of the second upper region,
wherein a first vertical height of the first lower region is different from a second vertical height of the second lower region by at least 2 nanometers (nm), and
one or more dielectric materials beneath the first gate structure and the second gate structure, wherein the one or more dielectric materials contact sidewalls and bottom surfaces of each of the first lower region and the second lower region.

2. The integrated circuit of claim 1, wherein the first vertical height of the first lower region is different from the second vertical height of the second lower region by at least 4 nm.

3. The integrated circuit of claim 1, further comprising:
a third source region and a third drain region; and
a third fin comprising semiconductor material and having (i) a third upper region laterally between the third source region and the third drain region and (ii) a third lower region below the third upper region,
wherein the first gate structure is on at least top and side surfaces of the third upper region, and
wherein the first vertical height of the first lower region is within 1 nm of a third vertical height of the third lower region.

4. The integrated circuit of claim 1, further comprising:
a third source region, a third drain region, a third fin comprising semiconductor material and having (i) a third upper region laterally between the third source region and the third drain region and (ii) a third lower region below the third upper region, and a third gate structure on at least top and side surfaces of the third upper region,
wherein a third vertical height of the third lower region is different from each of the first and second vertical heights by at least 2 nm.

5. The integrated circuit of claim 1, wherein each of the first and second lower regions extends completely within the one or more dielectric materials.

6. The integrated circuit of claim 1, wherein a vertical height of the first upper region is within 1 nm of a vertical height of the second upper region.

7. The integrated circuit of claim 1, wherein a top surface of the first upper region of the first fin is substantially co-planar with a top surface of the second upper region of the second fin.

8. The integrated circuit of claim 1, wherein a junction between the first upper region and the first lower region is substantially coplanar with a junction between the second upper region and the second lower region.

9. The integrated circuit of claim 1, wherein a first bottom surface of the first lower region is within a first horizontal plane, a second bottom surface of the second lower region is within a second horizontal plane, and a vertical distance between the first and second horizontal planes is at least 2 nm.

10. The integrated circuit of claim 1, wherein the first upper region comprises a first nanoribbon, and the first gate structure wraps around the first upper region, and wherein the second upper region comprises a second nanoribbon, and the second gate structure wraps around the second upper region.

11. An integrated circuit comprising:
a first fin, and a first gate structure on at least top and side surfaces of a first upper region of the first fin; and
a second fin adjacent to the first fin, and a second gate structure on at least top and side surfaces of a second upper region of the second fin,
wherein top surfaces of the first and second fins are substantially coplanar, and
wherein a vertical height of the first fin is different from a vertical height of the second fin by at least 2 nanometers (nm), and
one or more dielectric materials beneath the first gate structure and the second gate structure, wherein the one or more dielectric materials contact sidewalls and a bottom surface of at least one of a first lower region of the first fin or a second lower region of the second fin.

12. The integrated circuit of claim 11, wherein a vertical height of the first upper region of the first fin is within 1 nm of a vertical height of the second upper region of the second fin.

13. The integrated circuit of claim 11, wherein:
a vertical height of the first lower region of the first fin is different from a vertical height of the second lower region of the second fin by at least 2 nm.

14. The integrated circuit of claim 11, wherein a bottom surface of the first fin is within a first horizontal plane, a bottom surface of the second fin is within a second horizontal plane, and a vertical distance between the first and second horizontal planes is at least 2 nm.

15. The integrated circuit of claim 11, wherein:
the first gate structure is not on side surfaces of the first lower region; and
the second fin has the second upper region, and lacks any corresponding lower region below the second upper region, such that the second gate structure is on an entire side surface along a length of the second fin.

16. The integrated circuit of claim 15, wherein a vertical height of the first upper region is more than a vertical height of the second upper region by at least 2 nm.

17. The integrated circuit of claim 15,
wherein the second gate structure is on side surfaces of the one or more dielectric materials.

18. The integrated circuit of claim 15, wherein the first gate structure and the second gate structure share a gate electrode that is above both the first and second fins.

19. The integrated circuit of claim 11, wherein a bottommost surface of the second gate structure is below a bottommost surface of the second fin.

20. The integrated circuit of claim 11, wherein:
the first gate structure is not on side surfaces of the first lower region; and
the second fin lacks any lower region.

21. An integrated circuit comprising:
a first fin field-effect transistor (FinFET) having a first fin, and a first gate stack on a top surface and at least a portion of side surfaces of the first fin;
a second FinFET having a second fin, and a second gate stack on a top surface and at least a portion of side surfaces of the second fin; and
one or more dielectric layers beneath the first gate stack and the second gate stack,
wherein top surfaces of the first and second fins are coplanar,
wherein at least a section of a bottom surface of the first fin is within a first horizontal plane, at least a section of a bottom surface of the second fin is within a second horizontal plane, and a vertical distance between the first and second horizontal planes is at least 2 nm, and
wherein the one or more dielectric layers contact at least a portion of side surfaces of the first fin and contact the bottom surface of the first fin.

22. The integrated circuit of claim 21, wherein:
the first gate stack is on an upper portion of a side surface of the first fin, and is not on a lower portion of the side surface of the first fin; and
the second gate stack is on an entire side surface along a length of the second fin.

23. The integrated circuit of claim 21, wherein:
the first gate stack is on an upper portion of a side surface of the first fin, and is not on a lower portion of the side surface of the first fin; and
the integrated circuit further has a third fin, with the second gate stack on a top surface and on an entire side surface along a length of the third fin.

24. The integrated circuit of claim 21, wherein:
the first fin has a first channel region, and a sub-fin region below the first channel region; and
the second fin has a second channel region, and no sub-fin region below the second channel region.

25. The integrated circuit of claim 24, wherein the first channel region has a vertical height that is at least 2 nm greater than a vertical height of the second channel region.

* * * * *